United States Patent
Alanazi et al.

(10) Patent No.: US 11,326,423 B2
(45) Date of Patent: *May 10, 2022

(54) AUTOMATED PRODUCTION OPTIMIZATION TECHNIQUE FOR SMART WELL COMPLETIONS USING REAL-TIME NODAL ANALYSIS INCLUDING RECOMMENDING CHANGES TO DOWNHOLE SETTINGS

(71) Applicant: Saudi Arabian Oil Company, Dhahran (SA)

(72) Inventors: Amer Alanazi, Dammam (SA); Abdulaziz Al-Qasim, Dammam (SA); Ahmed Y. Bukhamseen, Dammam (SA)

(73) Assignee: Saudi Arabian Oil Company, Dhahran (SA)

( * ) Notice: Subject to any disclaimer, the term of this patent is extended or adjusted under 35 U.S.C. 154(b) by 287 days.

This patent is subject to a terminal disclaimer.

(21) Appl. No.: 16/414,535

(22) Filed: May 16, 2019

(65) Prior Publication Data
US 2020/0362670 A1     Nov. 19, 2020

(51) Int. Cl.
*E21B 43/12*     (2006.01)
*G06F 30/20*     (2020.01)
(Continued)

(52) U.S. Cl.
CPC .............. *E21B 43/12* (2013.01); *E21B 34/16* (2013.01); *E21B 41/0035* (2013.01);
(Continued)

(58) Field of Classification Search
CPC ...... E21B 43/12; E21B 41/0035; E21B 47/06; E21B 34/16; E21B 41/0092
(Continued)

(56) References Cited

U.S. PATENT DOCUMENTS 6,012,015 A * 1/2000 Tubel ................. E21B 41/0035
702/6
6,789,628 B2 * 9/2004 Hess .................. E21B 41/0035
166/386

(Continued)

FOREIGN PATENT DOCUMENTS

WO     2014160626     10/2014
WO     WO 2015153680  10/2015
(Continued)

OTHER PUBLICATIONS

Cetkovic et al., ("A Methodology for Multilateral Wells Optimization—Field Case Study", SPE, 2016, pp. 1-18) (Year: 2016).*
(Continued)

*Primary Examiner* — Iftekhar A Khan
(74) *Attorney, Agent, or Firm* — Fish & Richardson P.C.

(57) ABSTRACT

Systems and methods include a method for optimizing smart well completions using real-time nodal analysis including recommending changes to downhole settings. Real-time well rates and flowing bottom-hole pressure data at various choke settings for multiple flow conditions are collected for each lateral of a multilateral well. Recommended optimizing changes to downhole inflow control valve (ICV) settings for surface and subsurface ICVs are determined based on the real-time well rates and the flowing bottom-hole pressure data. The optimizing changes are designed to optimize production in the multilateral well. The recommended optimizing changes to the downhole ICV settings for the surface and subsurface ICVs in the laterals are provided for presentation to a user in a user interface of a multilateral well optimizing system. A user selection of one or more of the recommended optimizing changes is received. The recommended optimizing changes selected by the user are implemented.

20 Claims, 27 Drawing Sheets

(51) Int. Cl.
*E21B 34/16* (2006.01)
*E21B 41/00* (2006.01)
*E21B 47/06* (2012.01)
*E21B 47/10* (2012.01)

(52) U.S. Cl.
CPC .......... *E21B 41/0092* (2013.01); *E21B 47/06* (2013.01); *E21B 47/10* (2013.01); *G06F 30/20* (2020.01)

(58) Field of Classification Search
USPC .......................................................... 703/10
See application file for complete search history.

(56) References Cited

U.S. PATENT DOCUMENTS

| | | | |
|---|---|---|---|
| 8,290,632 B2* | 10/2012 | Briers | E21B 43/14 700/282 |
| 8,463,585 B2* | 6/2013 | Sun | E21B 43/00 703/10 |
| 8,788,209 B2* | 7/2014 | Foot | E21B 43/00 702/12 |
| 8,914,268 B2* | 12/2014 | Dale | E21B 43/00 703/10 |
| D741,882 S | 10/2015 | Shmilov et al. | |
| D749,623 S | 2/2016 | Gray et al. | |
| D750,129 S | 2/2016 | Kwon | |
| 9,323,252 B2* | 4/2016 | Slupphaug | G05D 7/0635 |
| D755,196 S | 5/2016 | Meyers et al. | |
| D756,373 S | 5/2016 | Raskin et al. | |
| D757,028 S | 5/2016 | Goldenberg et al. | |
| D759,063 S | 6/2016 | Chen | |
| 9,394,769 B2 | 7/2016 | Nenniger | |
| D763,277 S | 8/2016 | Ahmed et al. | |
| D764,501 S | 8/2016 | Dias et al. | |
| D767,624 S | 9/2016 | Lee et al. | |
| D768,152 S | 10/2016 | Gutierrez et al. | |
| D770,476 S | 11/2016 | Jitkoff et al. | |
| D771,116 S | 11/2016 | Dellinger et al. | |
| D776,683 S | 1/2017 | Gobinski et al. | |
| D777,177 S | 1/2017 | Chen et al. | |
| D779,514 S | 2/2017 | Baris et al. | |
| D785,022 S | 4/2017 | Vasquez et al. | |
| D782,526 S | 5/2017 | Rind et al. | |
| D786,280 S | 5/2017 | Ma | |
| D786,896 S | 5/2017 | Kim et al. | |
| D788,123 S | 5/2017 | Shan et al. | |
| D788,128 S | 5/2017 | Wada | |
| D788,792 S | 6/2017 | Alessandri et al. | |
| 9,745,833 B2 | 8/2017 | Carvajal et al. | |
| D798,886 S | 10/2017 | Prophete et al. | |
| D800,742 S | 10/2017 | Rhodes | |
| D800,744 S | 10/2017 | Jitkoff et al. | |
| D803,235 S | 11/2017 | Markson et al. | |
| D805,525 S | 12/2017 | Dascola et al. | |
| D806,108 S | 12/2017 | Day et al. | |
| D807,900 S | 1/2018 | Raji et al. | |
| D808,981 S | 1/2018 | Hazam et al. | |
| 9,864,353 B2* | 1/2018 | Tonkin | G05B 15/02 |
| D822,678 S | 7/2018 | Wu et al. | |
| D823,326 S | 7/2018 | Garcia et al. | |
| D823,860 S | 7/2018 | Wiffen et al. | |
| D830,382 S | 10/2018 | Marohn | |
| D833,459 S | 11/2018 | Blechschmidt et al. | |
| D841,017 S | 2/2019 | Bathla | |
| D849,014 S | 5/2019 | Senders | |
| D853,412 S | 7/2019 | Hofner et al. | |
| D854,030 S | 7/2019 | Dascola et al. | |
| D888,739 S | 6/2020 | Christiana et al. | |
| D905,734 S | 12/2020 | Christiana et al. | |
| D906,358 S | 12/2020 | Christiana et al. | |
| 10,982,516 B2* | 4/2021 | Arukhe | E21B 47/008 |
| 2005/0121190 A1* | 6/2005 | Oberkircher | E21B 41/0035 166/250.1 |
| 2007/0168056 A1* | 7/2007 | Shayegi | G05B 13/048 700/48 |
| 2008/0236839 A1* | 10/2008 | Oddie | E21B 43/385 166/373 |
| 2008/0262737 A1* | 10/2008 | Thigpen | E21B 43/14 702/9 |
| 2009/0308601 A1* | 12/2009 | Poe, Jr. | E21B 47/06 166/250.01 |
| 2010/0005411 A1 | 1/2010 | Duncket et al. | |
| 2010/0217575 A1* | 8/2010 | Briers | E21B 43/12 703/10 |
| 2011/0042083 A1* | 2/2011 | Sierra | E21B 43/305 166/271 |
| 2011/0301851 A1* | 12/2011 | Briers | E21B 43/16 702/12 |
| 2012/0095603 A1* | 4/2012 | Rashid | E21B 43/122 700/282 |
| 2012/0194558 A1 | 8/2012 | Dykes et al. | |
| 2014/0039793 A1 | 2/2014 | Querales | |
| 2014/0358511 A1* | 12/2014 | Waage | G01V 11/00 703/10 |
| 2016/0054713 A1* | 2/2016 | Foss | E21B 43/00 700/282 |
| 2016/0061003 A1* | 3/2016 | Gottumukkala | G05B 13/041 166/250.07 |
| 2016/0273315 A1* | 9/2016 | Carvajal | E21B 43/12 |
| 2016/0312552 A1* | 10/2016 | Early | E21B 41/00 |
| 2016/0328497 A1* | 11/2016 | Hamza | E21B 41/0035 |
| 2016/0369590 A1* | 12/2016 | Tonkin | E21B 43/12 |
| 2017/0081950 A1* | 3/2017 | Filatyev | E21B 43/2406 |
| 2017/0177761 A1* | 6/2017 | Early | E21B 47/00 |
| 2018/0030816 A1* | 2/2018 | DeValve | G05D 7/0658 |
| 2018/0066515 A1* | 3/2018 | Balan | E21B 34/06 |
| 2018/0119533 A1* | 5/2018 | Alhuthali | E21B 43/305 |
| 2018/0285515 A1* | 10/2018 | Isichei | E21B 43/12 |
| 2018/0347326 A1* | 12/2018 | Shammari | E21B 41/0035 |
| 2020/0242497 A1* | 7/2020 | Shahkarami | G06N 20/00 |
| 2020/0362674 A1* | 11/2020 | Alanazi | G01V 99/005 |
| 2020/0362697 A1* | 11/2020 | Alanazi | E21B 41/0035 |
| 2021/0102446 A1* | 4/2021 | Alghazali | E21B 43/14 |
| 2021/0148196 A1 | 5/2021 | Bukhamseen et al. | |
| 2021/0277747 A1* | 9/2021 | Al Naimi | E21B 34/16 |

FOREIGN PATENT DOCUMENTS

| | | |
|---|---|---|
| WO | 2016205158 | 12/2016 |
| WO | WO 2016195846 | 12/2016 |
| WO | WO 2020232218 | 11/2020 |

OTHER PUBLICATIONS

Ranjith et al. (Production Optimization Through Utilization of Smart Wells in Intelligent Fields, 2017, SPE, pp. 1-29) (Year: 2017).*

Zeid M. Al-Ghareeb (Monitoring and Control of Smart Wells, 2009, Stanford University, pp. 1-71) (Year: 2009).*

PCT International Search Report and Written Opinion in International Appln. No. PCT/US2020/060864, dated Mar. 3, 2021, 19 pages.

PCT International Search Report and Written Opinion in International Appln. No. PCT/US2020/032833, dated Aug. 11, 2020, 16 pages.

Al-Anazi et al., "Innovative Production Optimization Technique for Smart Well Completions Using Real-Time Nodal Analysis Applications," SPE-189198-MS, presented at the SPE Symposium: Production Enhancement and Cost Optimisation held in Kuala Lumpur, Malaysia, Nov. 7-8, 2017, 14 pages.

Abukhamsin et al., "Inflow profiling and production optimization in smart wells using distributed acoustic and temperature measurements," A dissertation submitted to the Department of Energy Resources Engineering the Committee on Graduate Studies of Stanford University, Jun. 2017, 190 pages.

Bukhamsin et al., "Optimization of multilateral well design and location in a real field using a continuous genetic algorithm," SPE

(56) References Cited

OTHER PUBLICATIONS 136944, presented at the SPE/DGS Annual Saudi Arabia Section Technical Symposium and Exhibition, Apr. 4-7, 2010, 16 pages.
Cetkovic et al., "A methodology for multilateral wells optimization—field case study," SPE 183004, presented at the Abu Dhabi International Petroleum Exhibition & Conference, Abu Dhabi, UAR, Nov. 7-10, 2016, 18 pages.
PCT International Search Report and Written Opinion in International Appln. No. PCT/US2020/032831, dated Aug. 11, 2020, 16 pages.
PCT International Search Report and Written Opinion in International Appln. No. PCT/US2020/032835, dated Aug. 11, 2020, 16 pages.
Brouwer et al., "Recovery Increase through Water Flooding with Smart Well Technology," SPE 68979 presented at the SPE European Formation Damage Conference, The Neatherlands, May 21-22, 2001, 10 pages.
Edabi and Davies, "Techniques for Optimum Placement of Interval Control Valve(s) in an Intelligent Well," SPE 100191 presented at the SPE Europec/EAGE Annual Conference and Exhibition, Austria, Jun. 12-15, 2006, 11 pages.
Elmsallati and Davies, "Automatic Optimization of Infinite Variable Control Valves," IPTC-10319, presented at the International Petroleum Technology Conference, Qatar, Nov. 21-23, 2005, 7 pages.
Farshi, "Improving Genetic Algorithms for Optimum Well Placement," Master's Report, Department of Energy Resources Engineering, Stanford University, California, Jun. 2008, 94 pages.
Ghosh and King, "Optimization of Smart Well Completion Design in the Presence of Uncertainty," SPE 166008, presented at the SPE Reservoir Characterization and simulation Conference and Exhibition held in Abu Dhabi, Sep. 16-18, 2013, 17 pages.
Glandt, "Reservoir Aspects of Smart Wells," SPE 81107 presented at the SPE Latin America and Caribbean Petroleum Engineering Conference, Trinidad, Apr. 27-30, 2003, 11 pages.
Haupt and Haupt, "Practical Genetic Algorithms," 2nd Edition, John Wiley & Sons, New York, 2004, 261 pages.
Holland, "Genetic algorithms," Scientific American, pp. 66-79, Jul. 1992, 14 pages.
Jalali et al., "Intelligent Completion System—The Reservoir Rationale," SPE 50587, presented at the SPE European Petroleum Conference, The Netherlands, Oct. 20-22, 1998, 6 pages.
Lorenz et al., "Uniform Inflow Completion System Extended Economic Field Life: A Field Case Study and Technology Overview," SPE 101895, presented at the SPE Annual Technical Conference and Exhibition, Texas, Sep. 24-27, 2006, 9 pages.
Mitchell, "An Introduction to Genetic Algorithms," Chapter 1-4, Chapter 6, Appendix A-B, MIT Press, 1996, 162 pages.
Naus et al., "Optimization of Commingled Production using Infinitely Variable Inflow Control Valves," SPE 90959, presented at the SPE Annual Technical Conference and Exhibition, Texas, Sep. 26-29, 2004, 12 pages.
Radcliff, "Formal Analysis and Random Respectful Recombination," proceedings of 4th International Conference and Genetic Algorithms, San Mateo, CA, 1991, 9 pages.
Rudolph, "Convergence Analysis of Canonic Genetic Algorithms," IEEE Transactions on Neuroal Networks, special issue on Evolutionary Computational vol. No. 1, Jan. 1994, 6 pages.
Sinha et al., "Flow Equilibration Toward Horizontal Well Using Downhole Valves," SPE 68635 presented at the SPE Asia Pacific Oil and Gas Conference and Exhibition, Indonesia, Apr. 17-19, 2001, 6 pages.
Yeten and Jalali, "Effectiveness of Intelligent Completions in a Multiwell Development," 2001 SPE Middle East Oil Show, Bahrain, Mar. 17-20, 2017 pages.
GCC Examination Report in GCC Appln. No. GC 2020-39756, dated Aug. 23, 2021, 5 pages.
Sampaio et al., "Optimization of proactive control valves of producer and injector intelligent wells under economic uncertainty," presented at the SPE Europec/EAGE Annual Conference, Copenhagen, Denmark, Jun. 2012, 13 pages.
GCC Examination Report in GCC Appln. No. GC 2020-40905, dated Oct. 18, 2021, 4 pages.

\* cited by examiner

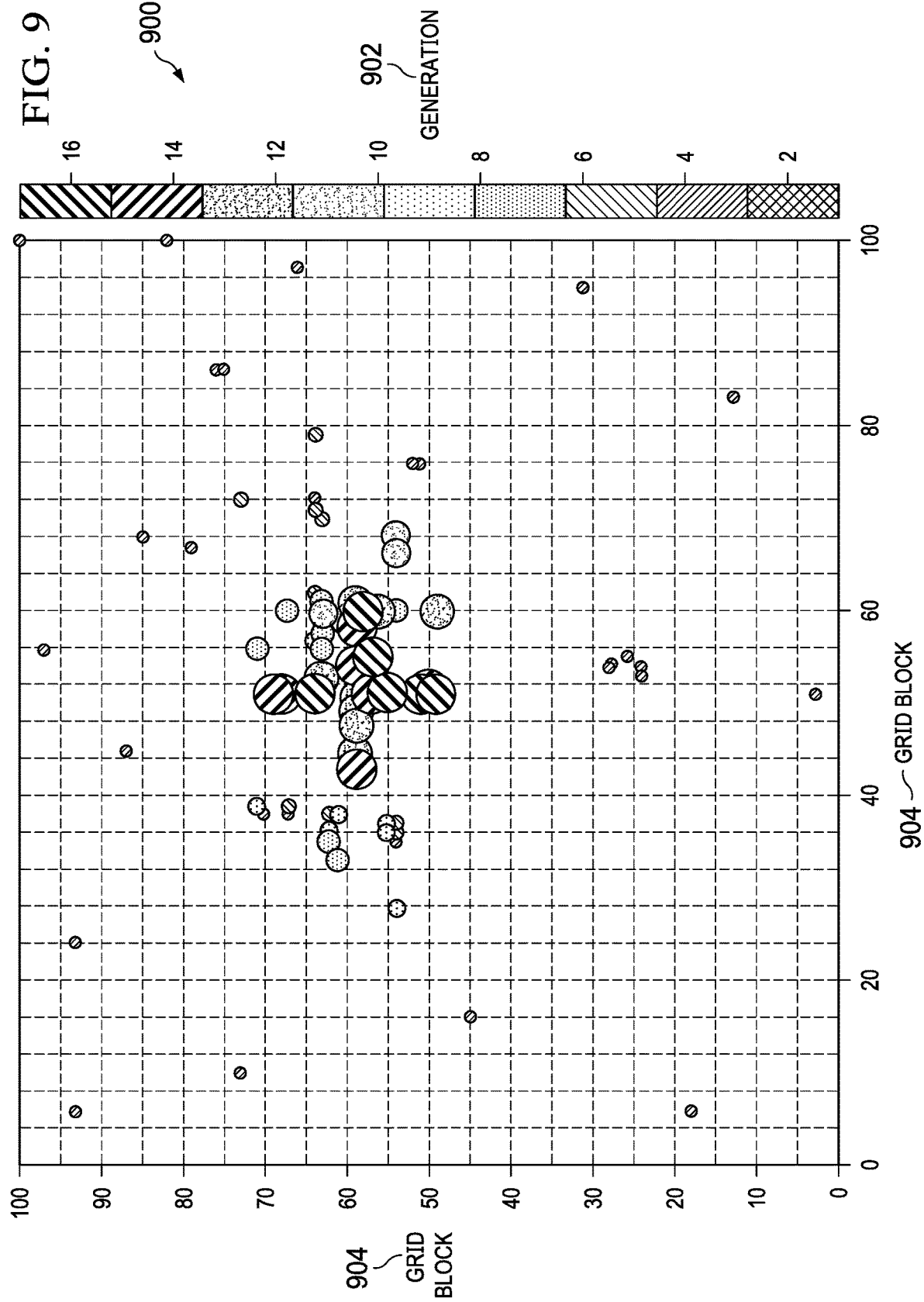

AUTOMATED PRODUCTION OPTIMIZATION TECHNIQUE FOR SMART WELL COMPLETIONS USING REAL-TIME NODAL ANALYSIS INCLUDING RECOMMENDING CHANGES TO DOWNHOLE SETTINGS

BACKGROUND

The present disclosure applies to optimization techniques for smart well completions. Many wells are instrumented with downhole sensors and valves enabling real-time monitoring and control of multilateral completions. However, engineers seldom utilize the downhole valves to adjust the production from a particular zone in a timely manner. Even if adjustments are made, the process is cumbersome and is based on trial and error.

SUMMARY

The present disclosure describes techniques which can be used for optimizing smart well completions. For example, optimizing smart well completions can refer to achieving well performance values that indicate or result in a performance greater than a predefined threshold. In some implementations, methods include a computer-implemented method for optimizing smart well completions using real-time nodal analysis including recommending changes to downhole settings. Real-time well rates and flowing bottom-hole pressure data at various choke settings for multiple flow conditions for each lateral of a multilateral well are collected from the multilateral well by a multilateral well optimizing system. Recommended optimizing changes to downhole inflow control valve (ICV) settings for surface ICVs and subsurface ICVs in one or more laterals of the multilateral well are determined by the multilateral well optimizing system based at least on the real-time well rates and the flowing bottom-hole pressure data. The optimizing changes are designed to optimize production in the multilateral well. The recommended optimizing changes to the downhole ICV settings for the surface ICVs and the subsurface ICVs in the one or more laterals of the multilateral well are provided by the multilateral well optimizing system for presentation to the user in a user interface of the multilateral well optimizing system. A user selection of one or more of the recommended optimizing changes is received by the multilateral well optimizing system. The one or more of the recommended optimizing changes selected by the user are implemented by the multilateral well optimizing system.

The previously described implementation is implementable using a computer-implemented method; a non-transitory, computer-readable medium storing computer-readable instructions to perform the computer-implemented method; and a computer-implemented system including a computer memory interoperably coupled with a hardware processor configured to perform the computer-implemented method/the instructions stored on the non-transitory, computer-readable medium.

The subject matter described in this specification can be implemented in particular implementations so as to realize one or more of the following advantages. First, techniques described in the present disclosure can be used for smart/intelligent well completions to maximize multilateral well productivity, restrict unwanted water and gas production, and improve sweep efficiency. Second, adoption of the techniques by production engineers can allow for better management of the multilateral wells to fulfill both short-term and long-term objectives, including optimizing well production and improving recovery. Third, use of the techniques can optimize field testing requirements and improve testing procedures following a proposed workflow, which can reduce operating expenditures (OPEX) when compared to conventional optimization procedures. Fourth, accurate estimations of productivity index (PI) for an overall well and for individual laterals can help to optimize inflow control device (ICV) settings and manage the overall flow of a well. Fifth, the techniques can be used to validate that selected settings are optimal. Sixth, an integration of artificial intelligence techniques into the optimization process can provide an effective solution for the increased optimization requirements of smart wells. Seventh, the automated workflow included in the techniques can predict optimum ICV settings of smart well completions (SWCs) in real-time and maximize performance of multilateral wells through combining lateral production data and improved estimation of downhole parameters.

The details of one or more implementations of the subject matter of this specification are set forth in the Detailed Description, the accompanying drawings, and the claims. Other features, aspects, and advantages of the subject matter will become apparent from the Detailed Description, the claims, and the accompanying drawings.

DESCRIPTION OF DRAWINGS

FIG. 9 is a graph of an example of a plot showing an evolution path of a GA over generations, according to some implementations of the present disclosure.

Like reference numbers and designations in the various drawings indicate like elements.

DETAILED DESCRIPTION

Figure 1:
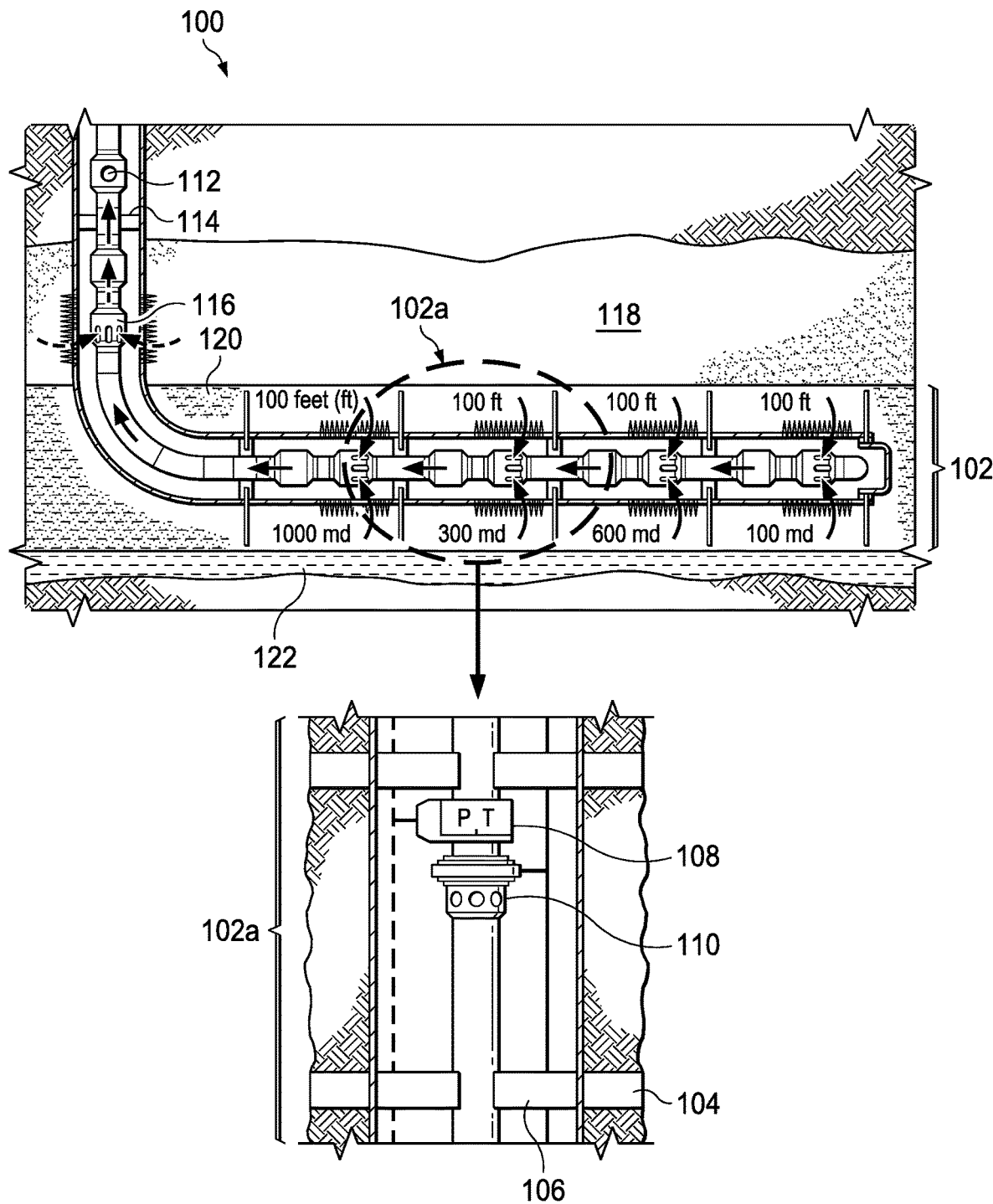
FIG. 1 is a diagram of an example of a multi-zonal smart well completion, according to some implementations of the present disclosure.

The following detailed description describes optimization techniques for smart well completions (SWCs). For example, optimizing smart well completions can refer to achieving well performance values that indicate or result in a performance above a predefined threshold. Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

In some implementations, optimization algorithms can be used that can assist reservoir and production engineers in determining an optimum production scenario for complex wells. The optimization algorithms can recommend changes to downhole valve settings, which allow for optimized production. The recommended changes can be based on data from current production conditions of the well, including information from downhole sensors and valves, which enable real-time monitoring and control of multilateral completions. For example, the term "real-time" can correspond to events that occur within a specified period of time, such as within one minute, within one second, or within milliseconds. Real-time information can be used to adjust the production from one or more particular zones in a timely manner.

Production optimization techniques can use real-time data and nodal models for multilateral wells. These multilateral wells are typically equipped with surface and subsurface downhole valves that can provide real-time pressure and temperature data along with a surface flow meter to measure multi-phase flow. Moreover, the wells contain inflow control devices (ICVs) with various choke settings to restrict flow based on the orifice size of each valve position. The production optimization techniques can use field data collected during optimization and well control parameter (for example, ICV settings) regression using a commercial steady-state model. The production optimization techniques can estimate flowing parameters of individual laterals, determine the optimum pressure drop across each downhole valve, and estimate productivity of each lateral during a commingled production at various choke valves settings.

The optimum flow scenario can be determined, for example, using a genetic optimization algorithm which can intelligently manipulate ICV valve settings in the calibrated model to provide the maximum oil production, the minimum water production, or both. The model can take into account the changes in reservoir pressure data, which is either collected from the well itself or from offset wells. Changes in reservoir pressure can be indicative of changes in the injection performance and other surroundings, including reservoir activities such as drainage dynamics. The model can require entering individual reservoir pressure for each lateral. Other additional data can be deemed critical for calibration, such as the well production rates (including oil and water rates) and wellhead pressure, which affects the PI. Having active adjacent wells (injectors or producers) can have an effect on the PI of each lateral, and this effect can be measured from changes in reservoir pressure, drainage area of each lateral, wellhead pressure, and the well's production rates. Such changes can be incorporated in a periodic manner for proper calibration and modeling.

The production optimization techniques described in the present disclosure were successfully field-tested in real time and validated using generated models that were used to predict well performance under various conditions. The production optimization techniques started by collecting well rates and flowing bottom-hole pressure data at various choke settings for two flow conditions: commingled and individual lateral testing. The acquired data was used to calibrate the model. After calibration, an optimization algorithm (in this case, a genetic algorithm (GA)) was used to generate different production scenarios and optimize the performance of each lateral.

In some implementations, models that are used can include a steady state model built as a network connecting different laterals producing from the same reservoir to a single point connected to a vertical lift performance (VLP) curve that represents the well. On each lateral, the flow and pressure drop through the reservoir can be determined in the horizontal section. The annular flow between the casing and the tubing can also be determined. The concept of nodal analysis can be used that includes a combination of the pressure drop across each lateral to the production system for an individual well to estimate production rates and optimize the components of the production system.

An increase in global utilization of the SWCs can affect (for example, increase) the field optimization requirements of downhole ICVs. Conventional approaches and procedures can require up to three weeks of field testing and do not include a methodical approach to make ICV changes. Furthermore, conventional approaches and procedures do not accurately estimate the productivity index (PI) of laterals, which limits the understanding of flow contributions from each lateral, including flowing bottom hole pressure (FBHP), oil rate, and water cut.

In order to overcome associated challenges and achieve optimum values for SWCs, production optimization techniques can use real-time modeling based on nodal analysis for multilateral wells. The multilateral wells can be equipped with surface and subsurface downhole valves with various choke settings and downhole permanent pressure gauges. During regular field optimization procedures, the multilateral well can be produced one lateral at a time. Surface and downhole pressures and production metrics can be recorded for these tests. Production optimization techniques can use the data to calibrate a commercial steady-state model. The model can then be used to estimate the flowing parameters of individual laterals, determine the optimum pressure drop across each downhole valve, and to estimate the productivity of each lateral during the commingled production at various choke valves settings. Each lateral's PI can be determined in real time, for example, as defined by Equation (1):

$$q_n = J_n(\overline{P}_n - P_{wf_n}) \qquad (1)$$

where $q_n$ is a production rate from lateral n, $J_n$ is a productivity index for lateral n, $\overline{P}_n$ is an average reservoir pressure for lateral n, and $P_{wf_n}$ is a wellbore flowing pressure for lateral n.

The model can either calculate the PI based on one of many conventional techniques using reservoir description parameters, or the model can correlate the value based on well test results. The techniques described in the present disclosure can account for the interplay between laterals by altering the PI values for each lateral by the same ratio. This way, the variance in strength between laterals can still be captured. Further, the model can be fine-tuned based on the actual well and lateral test results in order to make more accurate well performance calculations in the future.

The PIs for the laterals can be applied to the model to generate a commingled PI, for example, as defined by Equation (2):

$$PI = \frac{Q}{P_{res} - P_{wf}} \qquad (2)$$

where Q is the lateral rate, $P_{res}$ is the reservoir pressure, and $P_{wf}$ is the well flowing bottomhole pressure. The commingled PI can represent the overall well PI after setting each lateral at a certain ICV setting. Each lateral PI can then be estimated using that set-up. However, the commingled PI will not be represented to the single lateral if operated alone.

FIG. 1 is a diagram of an example of a multi-zonal smart well completion 100, according to some implementations of the present disclosure. Each zone 102 (for example, a zone 102a) can be isolated with packers 104 and 106 and equipped with downhole pressure gauges 108 and a valve 110. Each zone 102 can further contain a lateral well. The packers 104 and 106 can include, for example, external swell packers, which are run with a screen, and internal swell packers, which run with completion. Downhole pressure gauges 108 can include, for example, a downhole pressure gauge with i-wire. To achieve optimal economic values of the multi-zonal smart well completion 100, the surface and subsurface choke valves settings can be frequently optimized using various techniques. Applying the right optimization techniques can ensure a successful and efficient optimization.

The multi-zonal smart well completion 100 includes a safety valve 112, a production packer 114, and an ICV 116 that, as shown in FIG. 1, is located in a gas layer 118. The multi-zonal smart well completion 100 also includes an oil layer 120 (containing the zones 102) and a water layer 122. Other arrangements of layers are possible.

In some implementations, optimization algorithms (for example, for multilateral wells) can use artificial intelligence techniques such as a genetic algorithm (GA). Genetic algorithms include stochastic and heuristic search techniques based on the theory of natural selection and evolution to achieve a "survival of the fittest" solution. The use of such algorithms can lead to suggesting ICV settings in multilateral wells, which can then be used as input for a nodal model. In return, the result of the nodal model can be fed back into the algorithm to evaluate each solution presented by the algorithm.

In some implementations, the model may recommend only one set of settings for the ICVs in a multilateral well. Optimization algorithms (for example, genetic algorithms) can be implemented as stochastic methods to assure repeatability. The algorithms can be run multiple times, with the number of iterations used being sufficient for the size of the problem. For example, the number of iterations used can be based on rules of thumb correlating the number of iterations with a number of variables (for example, ICVs). The optimized solution can reflect the current state of the calibrated model and can be implemented immediately to begin realizing production gains. After a production interval has occurred in which well/reservoir conditions are expected (or likely) to change, the calibration and optimization of the model can be repeated to reflect these changes. In some implementations, automated processes can be used to apply the recommendations to the field, for example, as part of a closed-loop automated optimization. Models can be well-dependent, with each well having its own model modeling laterals and well completion.

Figure 2:
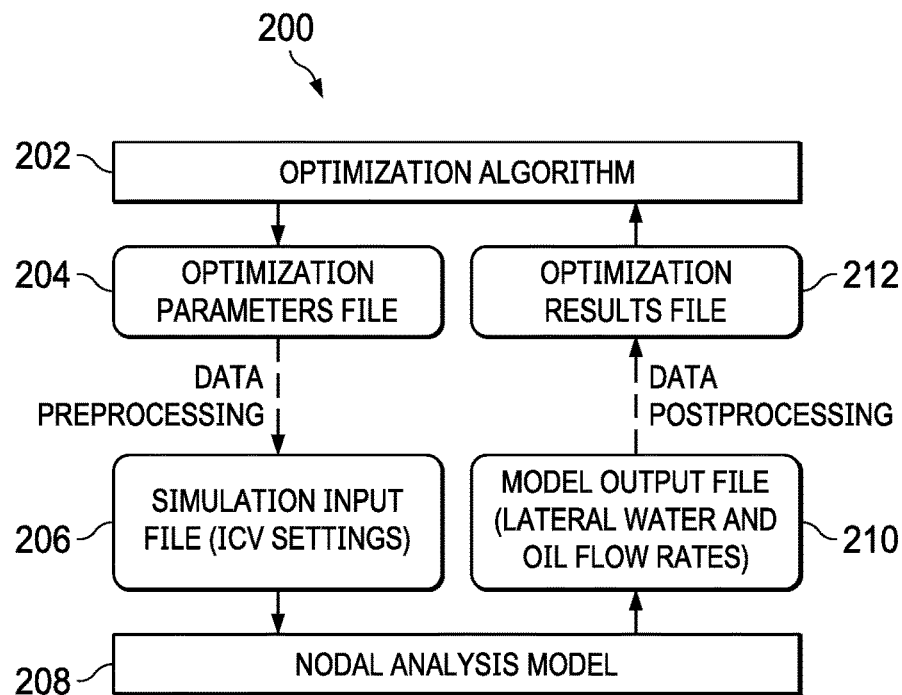
FIG. 2 is a flow diagram of an example of an optimization algorithm process, according to some implementations of the present disclosure.

FIG. 2 is a flow diagram of an example of an optimization algorithm process 200, according to some implementations of the present disclosure. The optimization algorithm process 200 can use model results to generate new ICV settings to be tested by the model. The circular flow of elements 202-212 of the optimization algorithm process 200 shows an interaction between the model and the algorithm.

The optimization algorithm process 200 includes an optimization algorithm 202, which provides an optimization parameters file 204. During data preprocessing, for example, the optimization parameters file 204 can serve as input for creating a simulation input file 206 (for example, including ICV settings). The simulation input file 206 can serve as an input to a nodal analysis model 208. The nodal analysis module 208 can produce a model output file 210. During data preprocessing, for example, model output file 210 can serve as input for creating an optimization results file 212. To complete the loop of the circular flow of elements 202-212, the optimization results file 212 can serve as an input to the optimization algorithm 202.

Figure 3:
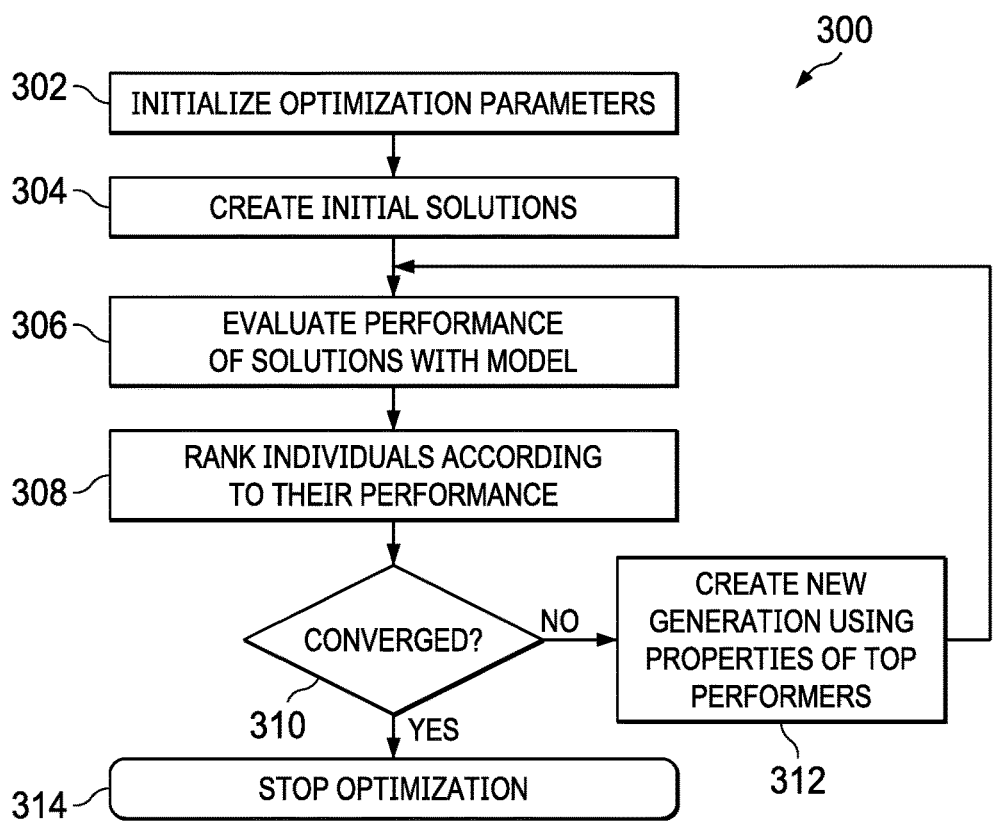
FIG. 3 is a flow diagram of an example of a genetic algorithm optimization procedure for determining optimum valve settings as given by the well model, according to some implementations of the present disclosure.

FIG. 3 is a flow diagram of an example of a genetic algorithm optimization procedure 300 for determining optimum valve settings as given by the well model, according to some implementations of the present disclosure. In some implementations, the genetic algorithm optimization procedure 300 can be implemented as an overall optimization loop, which includes the following steps.

At 302, the control parameters are defined and their feasible limits are identified. For example, limits for possible wellhead pressure values are set between a flow-line pressure (minimum) and a reservoir minus hydrostatic pressure (maximum). Values outside of this range will result in no flow from the well. Therefore, it is more efficient to eliminate out-of-range values from consideration before starting the optimization to save computational time.

At 304, a diverse pool of possible initial solutions is created. The diverse pool of possible initial solutions can include solutions that abide by parameter limits and cover the solution space. Engineers, for example, can use their previous experience in constructing the initial solutions, or the initial solutions can be created based on parameter limits.

At 306, performance of the solutions is evaluated using the model. For example, an objective function is defined that is a function of at least a net present value and a total oil production. The objective function is evaluated for each of the solutions. The evaluation process can provide a reflection of a given solution's quality.

At 308, current solutions are ranked according to the value of the objective function. For example, a given solution can be ranked higher according to an estimated greater net present value and total oil production.

At 310, a check for convergence is performed. In some implementations, the genetic algorithm optimization procedure 300 can be stopped at 314 if no further change to the objective function occurs for a threshold number of (for example, three) consecutive iterations.

At 312, a new generation is created using properties of the top performers. For example, genetic algorithm reproduction operators can be applied to the current solutions. Steps 306 to 312 are repeated, for example, until convergence is reached on the objective function. The best-performing solution that exists after convergence can be designated as the optimum solution.

Figure 4A:
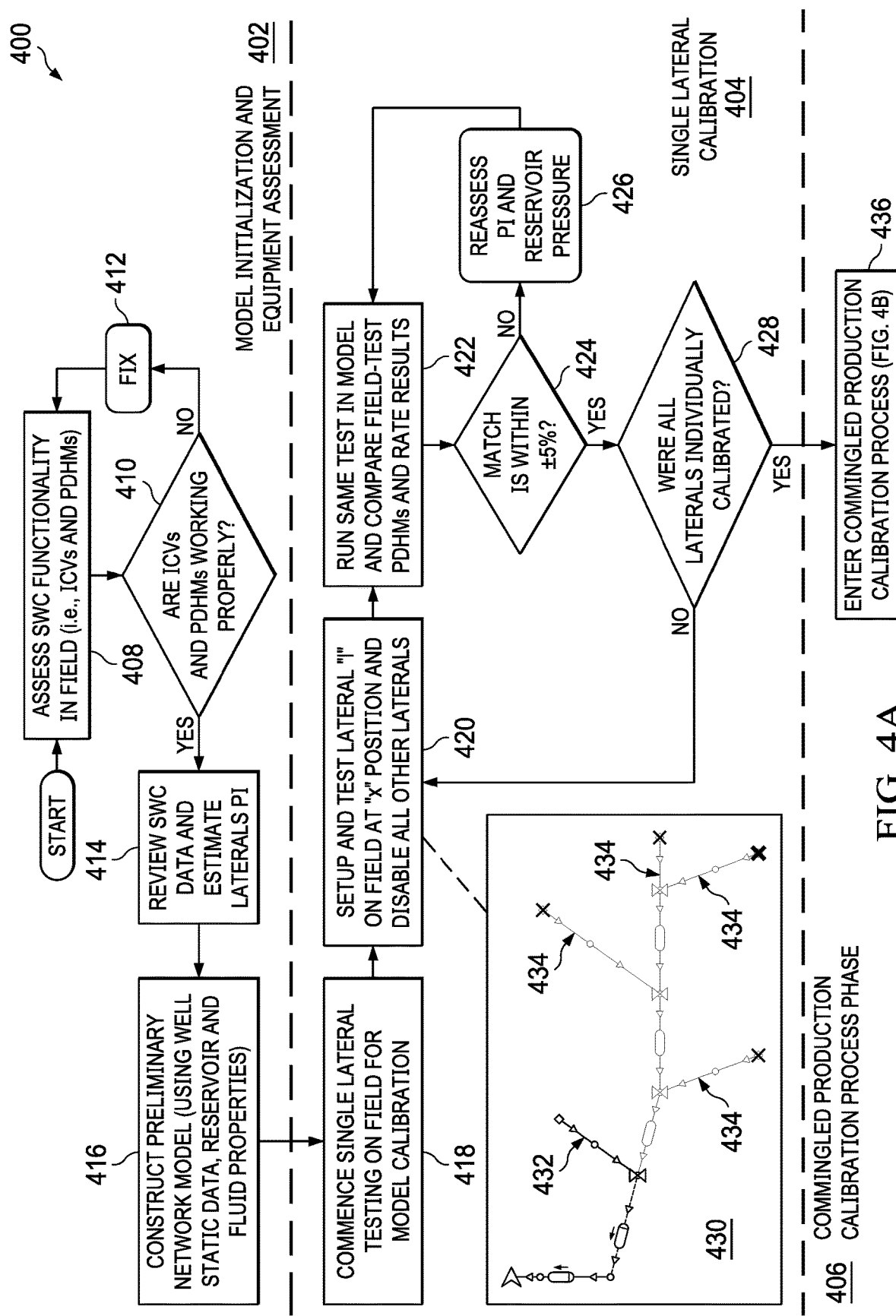
FIGS. 4A and 4B collectively show a flow diagram of an example of a process for optimizing smart well completion (SWC) inflow control device (ICV) settings, according to some implementations of the present disclosure.
Figure 4B:
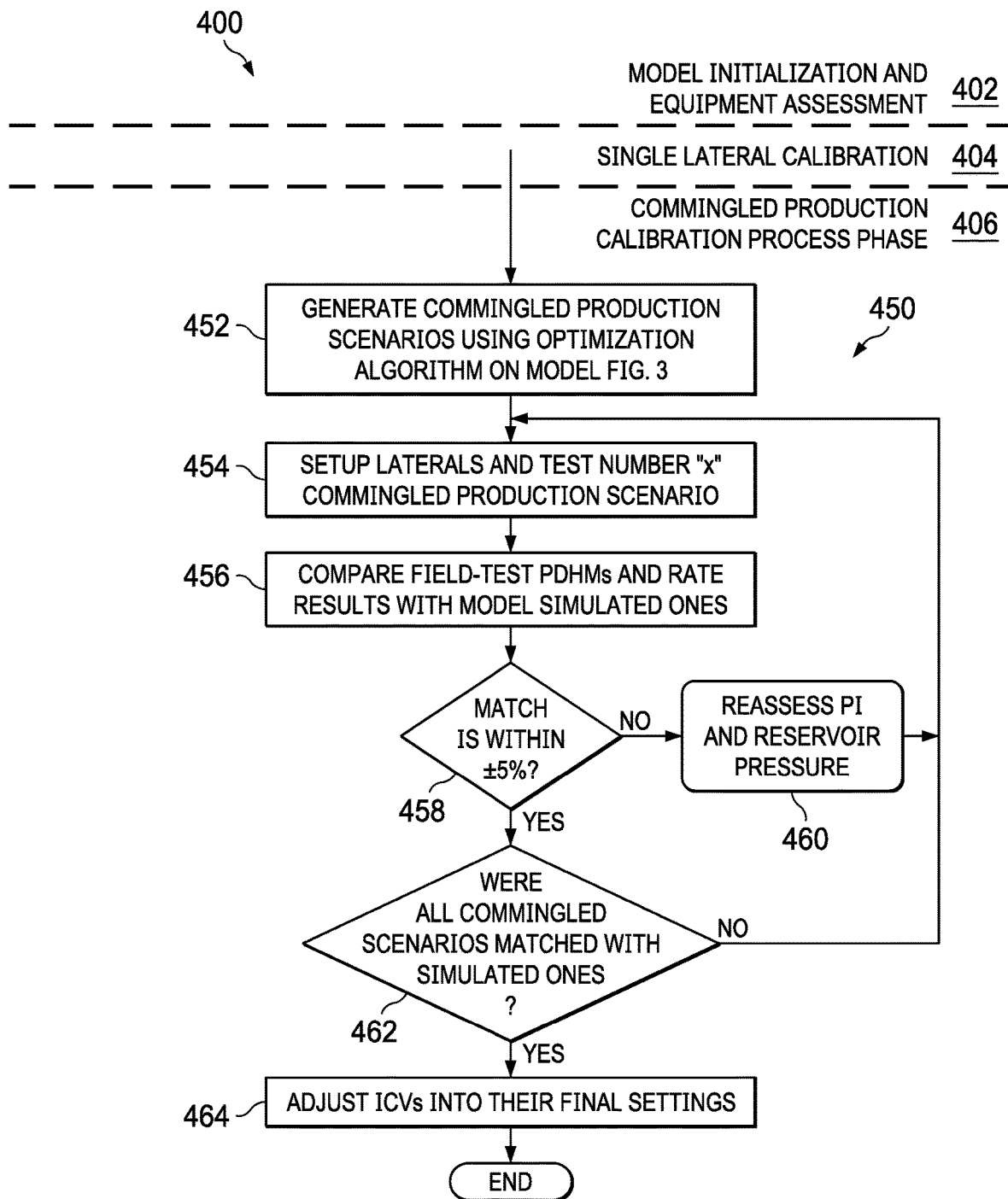

FIGS. 4A and 4B collectively show a flow diagram of an example of a process 400 for optimizing SWC ICV settings, according to some implementations of the present disclosure. For example, as shown in FIG. 4A, the process 400 includes a model initialization and equipment assessment phase 402 (including steps 408-416) and a single lateral calibration phase 404 (including steps 418-428). A comingled production calibration process phase 406 follows the single lateral calibration phase 404.

The process 400 can include a workflow beginning at the field, continuing through the model optimization procedure, and ending by applying a model solution to the field. The SWC model starts from permanent downhole measurement (PDHMs) point as a top node and down to lateral total depth. Modeling SWC will mimic downhole conditions and help to predict flow contributions from each lateral by estimating downhole parameters, such as PI, FBHP, oil rate, and water cut. The model can be constructed using surface network modeling software, which uses nodal-network analysis of a steady-state system. Surface network modeling software can include, for example, General Allocation Program (GAP) from Petroleum Experts (Petex), and Pipeline Simulation (PIPESIM) from Schlumberger (SLB). The model can be accurately calibrated and combined with field tests. The workflow combines modeling and streamlines field testing for the calibration process.

At 408, SWC functionality is assessed in the field, including ICVs and PDHMs. At 410, a determination is made whether the ICVs and PDHMs are working properly. If not, then at 412, fixes are made to the ICVs and PDHMs, and an assessment is repeated at 408.

At 414 (after it is confirmed that the ICVs and PDHMs are working properly), SWC data is reviewed and the laterals' PIs are estimated. At 416, a preliminary network model is constructed, for example, using well static data and reservoir and fluid properties. The preliminary network model, for example, can be part of an approach which starts first by building a preliminary model (not yet calibrated) using the well's previous production and pressure data. Then, the model is calibrated. After calibration, the model is capable of providing recommended downhole choke valve settings guided by user objectives.

At 418, single lateral testing is commenced on the field for model calibration. At 420, each lateral in the field is set up and tested while the other laterals are disabled. For example, in a multilateral well 430, a lateral 432 is set up and tested while laterals 434 are disabled.

At 422, a same test is run in the model and compared to PDHMs, and the results are rated. At 424, a determination is made whether the results match within a threshold (for example, 5%). At 426 (if the determination indicates that the results do not match within the threshold), the PI and reservoir pressure are re-assessed, and the same test is rerun at 422. At 428 (if the determination indicates that the results do match within the threshold), a determination is made whether additional laterals need to be calibrated. If additional laterals need to be calibrated, then, at 420, the next lateral is set up and tested while the other laterals are disabled. After all laterals have been calibrated, at 436, the comingled production calibration process phase 406 can be entered.

Referring now to FIG. 4B, the comingled production calibration process phase 406 begins in which a comingled production calibration process 450 is used. At 452, comingled production scenarios are generated using an optimization algorithm, for example, the genetic algorithm optimization procedure 300. At 454, laterals are set up and tested under a comingled production scenario. At 456, field-test PDHMs are compared, and results are rated using model simulations. At 458, a determination is made whether the results match within a threshold (for example, 5%). At 460 (if the determination indicates that the results do not match within the threshold), the PI and reservoir pressure are re-assessed, and the laterals are retested at 454. At 462 (if the determination indicates that the results do match within the threshold), a determination is made whether all comingled scenarios match the simulated ones. If the determination indicates that all comingled scenarios do not match the simulated ones, then the laterals are set up and tested under a comingled production scenario at 454. At 464 (when it is determined that all comingled scenarios match the simulated ones), IVCs can be adjusted into their final settings.

Benefits

Using the process 400 can provide a better understanding of flow contributions of each lateral in order to determine optimum ICV settings. This, in turn, can prolong well life through enhancing the well performance, including flowing well head pressure (FWHP), oil rates, and water cut (WC). Approaches using the process 400 can benefit from well-maintained surface and subsurface equipment, such as PDHMs and multi-phase flow meters (MPFMs), which provide accurate measurements of well rates and downhole pressure. Smart well components, such as rate meters (for example, MPFMs), downhole pressure gauges, and ICVs, need to be regularly maintained, inspected, and confirmed to be operating correctly to achieve the desired benefits of process 400.

The approach was successfully field-tested and validated. The generated models were used to predict well performance at various conditions. The approach started by collecting well rates and flowing bottom-hole pressure data at various chokes settings including commingled and individual lateral testing. The acquired data was used to calibrate the model, generate different production scenarios, and optimize the performance of each lateral.

Figure 4C:
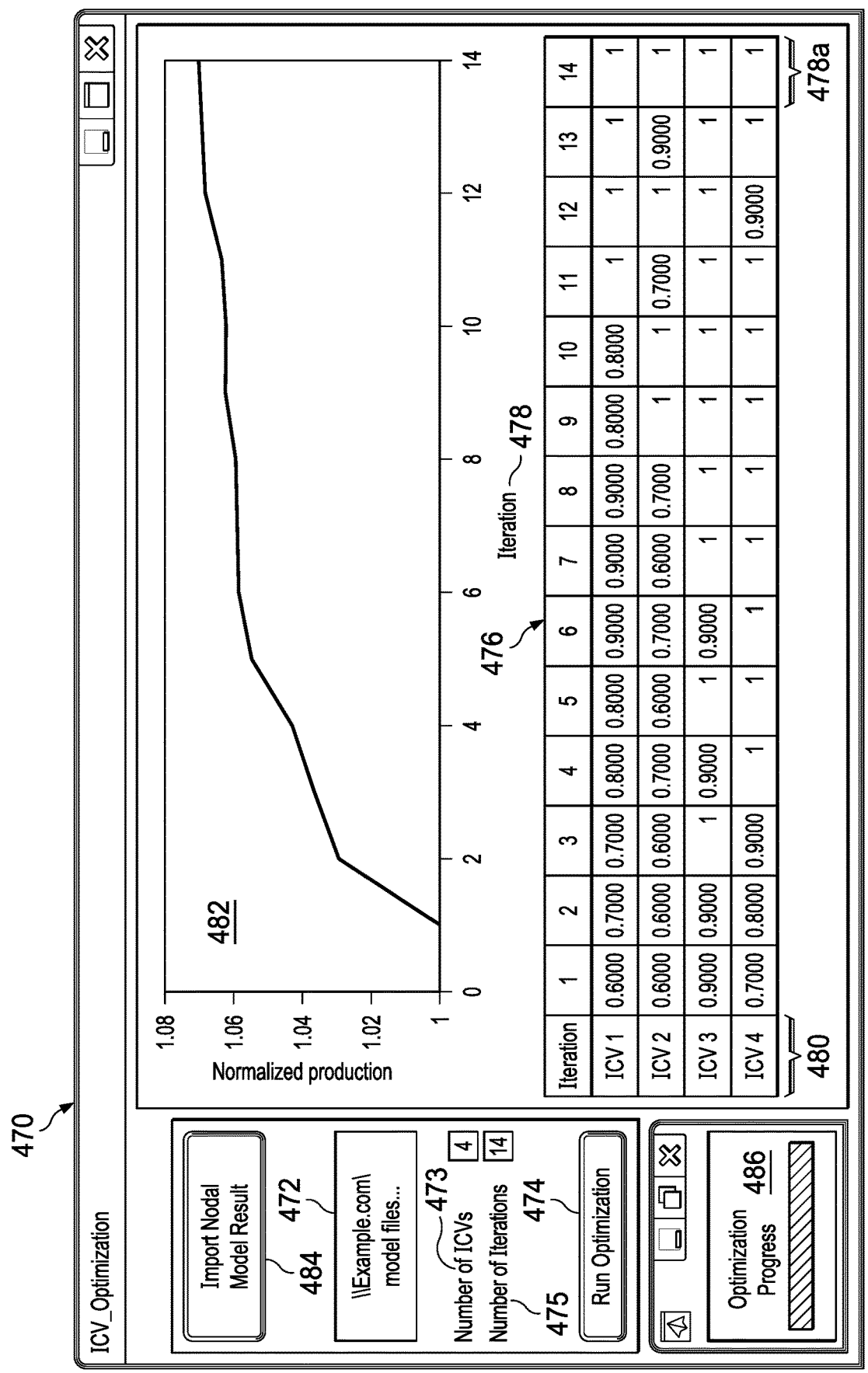
FIG. 4C is a screenshot of an example of an ICV optimization graphical user interface (GUI), according to some implementations of the present disclosure.

FIG. 4C is a screenshot of an example of an ICV optimization graphical user interface (GUI) 470, according to some implementations of the present disclosure. In some implementations, the ICV optimization GUI 470 can be used with optimization algorithms, such as the optimization algorithm 202. The ICV optimization GUI 470 can be formulated or implemented as a matrix laboratory (MATLAB) GUI and function. When executed, the GUI can ask the user to specify a location 472 of a calibrated nodal analysis model file used by the model. The function can extract the needed information, execute the optimization (for example, when a control 474 is selected), and provide the optimal output in tabular format in a table 476 for presentation in the GUI. Each column in the table 476 represents a single iteration 478 in the optimization. A final column 478a can represent an optimum solution. In this example, the optimization can recommend that all four ICVs 480 (for example, corresponding to laterals) should be fully open, as indicated as an opening fraction (where 1.0=fully open). The gain in production as predicted by the calibrated model is shown in a plot 482 (for example, indicating an approximate 7% production gain as compared to the initial solution). In some implementations, a control 484 can be used to import a nodal model result. A control 486 can display a progress bar indicating a completion progress of the optimization.

In some implementations, the GUI 470 can be designed and created, for example, using a UI design package, such as MATLAB. For example, a UI design package can provide a GUI that allows a user to place figures, tables, and buttons (for example, to design the GUI 470) and edit text and properties associated with elements in the UI. Each clickable button in the UI can be linked to its corresponding code.

When the GUI 470 is initially displayed (for example, before an optimization is run), the plot 482 and the table 476 are empty. The user's first action can then be to click on the control 484 (for example, an "Import Nodal Model Results" button). In this example, it is assumed that a nodal analysis model has already been run and the output has already been saved in a format that is compatible with the UI. For example, the output that has been saved from the analysis includes the ICV settings and their relationships to flow rates from each lateral.

After the user clicks on the control 484, the system can display a popup that the user can use to locate the file containing the ICV settings versus the lateral flow rate data. The popup can include controls for browsing a hierarchical file structure, for example, to locate the file.

After the file is selected, the user can use a "Number of ICVs" control 473 to enter a number of ICVs in the well (for example, four). The user can also use a "Number of Iterations" control 475 to enter a number of iterations for which an optimization is to be run. User selection of a smaller number of iterations will produce faster results. If processing time is not a concern for the user, then the number of iterations can be increased. Optimizations can be stopped if no further improvement on the solution is observed, for example, between successive runs.

After the number of ICVs and iterations have been entered, the user can click on the "Run Optimization" button (control 474). This triggers the beginning of the optimization. The optimization progression (control 486) becomes active. At this time, the table 476 can be updated (and rows labeled) to reflect the number of ICVs (for example, four) selected by the user.

The plot 482, table 476, and optimization progress bar can be updated after each iteration, including adding another column to the table 476 for each iteration. The first iteration can represent the best solution from the input file, which may be only a small subset of all possible solutions, as the nodal analysis model only considers a few possible ICV settings for each lateral. Subsequent iterations can apply the genetic algorithm to improve on the optimal solution from each previous iteration.

The plot 482 shown in FIG. 4C indicates the results after the optimization has completed. In this example, the optimal solution provides approximately a 7% production increase over the base case after 14 iterations. Also, the optimal solution reached by the algorithm indicates that all four ICVs are to be kept fully open (as defined by a setting of 1, indicating 100% open).

Use of Machine Learning and Artificial Intelligence

In general, optimization problems (such as associated with the techniques described in the present disclosure) search for a set of variables, x, that achieve a maximum objective function according to Equation (3):

$$F(x_{opt}) \geq F(x) \text{ for all } x \in \Omega$$

$$\text{Subject to } LB < C_n(x) < UB \quad (3)$$

where $\Omega$ symbolizes a search space domain, $C_n$ corresponds to problem constraints defined by upper and lower bounds, and F stands for the objective function which is to be optimized. For the well control optimization problem, for example, $x_{opt}$ contains the ICV setting(s) of all valves in the smart wells. Objective functions in smart multilateral well completions can include, for example, cumulative oil production, cumulative oil flow rate, and economic implications, which can consider a net present value (NPV) of a project (for example, the multilateral well). To accommodate the stochastic nature of the algorithm, each optimization run can be repeated multiple times, and the case with the maximum objective function can be reported.

Genetic Algorithms

The genetic algorithm (GA) is a stochastic and heuristic search technique based on the theory of natural evolution and selection. The basic idea parallels the concept of survival of the fittest in that solutions evolve through "mating" (information exchange) of the best-performing solutions. Occasional alternation-of-fit solutions are allowed in order to explore other parts of the search space or to avoid entrapment into local optima. Using GAs for well placement optimization problems is ideal for the following reasons. First, the algorithm can easily be parallelized because each of the individuals can be evaluated separately. Second, the search process is geared towards finding the global optimum rather than local optima. Third, GAs perform well in problems where the fitness function is complex, discontinuous, noisy, changes over time, or has many local optima. Fourth, the algorithm is capable of manipulating many parameters simultaneously. Fifth, no gradients are required during the optimization process. Sixth, since the initial population includes multiple solutions rather than a single one, an opportunity exists to explore more of the search space at each generation. Seventh, the algorithm can be enhanced and hybridized with other techniques.

The GA starts by generating a number of possible solutions to the problem (corresponding to individuals in genetics). Each individual (corresponding to chromosomes in genetics) can be coded by concatenating different solution variables. One individual can be in the form of, for example, ICV1=0.8, ICV2=1, and ICV3=0.9. At each iteration (corresponding to generation in genetics), a selected objective function value (corresponding to fitness in genetics) is evaluated for the collection of individuals (corresponding to population in genetics). Then, improved solutions evolve by keeping a number of the fittest individuals (corresponding to selection in genetics), mating properties of the good solutions from the previous generation (corresponding to crossover in genetics), and randomly altering some properties (corresponding to mutations in genetics). These three mechanisms are the main GA operators. This procedure continues until a predetermined convergence criterion is met. Common convergence criteria can include, for example, reaching a specified maximum number of generations, attaining a population of increasingly more similar individuals, or observing that no improvement is being made in the objective function of the best individual over a number of consecutive generations.

Binary Versus Continuous GAs

Two GA types are utilized in optimization problems: a binary GA (bGA) and a continuous GA (cGA). In bGAs, the optimization process includes coding the value of each variable to its corresponding binary value, applying GA operators to the chromosome, obtaining the resulting offspring, and remapping the offspring into the real space. Alternatively, cGAs use real-valued numbers directly. The selection procedure is similar in both algorithms. The fittest member of each generation is carried to the next generation without any alteration (also called elitist selection). A fraction of the current generation is selected as potential parents for the next generation according to a predefined selection fraction. The parent selection criterion for crossover can be based on rank weighting, where fitter individuals are more likely to be selected according to a ranking scale.

Crossover has been described as the key element which distinguishes GAs from other optimization methods. This is because crossover gives individuals the opportunity to evolve by combining the strengths of both parents. In bGAs, crossover can be implemented by cutting the parents' chromosomes at a random point and swapping the two resulting portions (called single-point crossover). More complicated forms of crossover are multipoint crossover, in which several points of exchange are set, and uniform crossover (each bit of the offspring's chromosome can be taken from either parent with equal probability). Crossover is only performed on a certain percentage of the population, for example, according to the crossover probability ($P_{xo}$). As for a cGA, crossover with blending was used to maintain solution diversity, for example, according to Equation (4):

$$P_i^{new} = \beta \cdot P_{Mi} + (1-\beta) P_{Fi}, \text{ for } 0 \leq \beta \leq 1 \quad (4)$$

where $P_i^{new}$ is the $i^{th}$ variable in a new individual, and $P_{Mi}$ and $P_{Fi}$ are the property values of the same variable from the mother and father individuals, respectively. $\beta$ is a blending coefficient, which can remain constant for each crossover operation, or can be randomly chosen for each property.

In contrast to crossover, which is responsible for the exploitation of the evolution process, mutation adds randomness to the search process to explore new areas of the search space. Mutation causes small random alterations at single points in the chromosome. The number of mutation occurrences is governed by the mutation probability ($P_{mut}$), which is usually small (of the order of 0.01 to 0.1).

Figure 5:
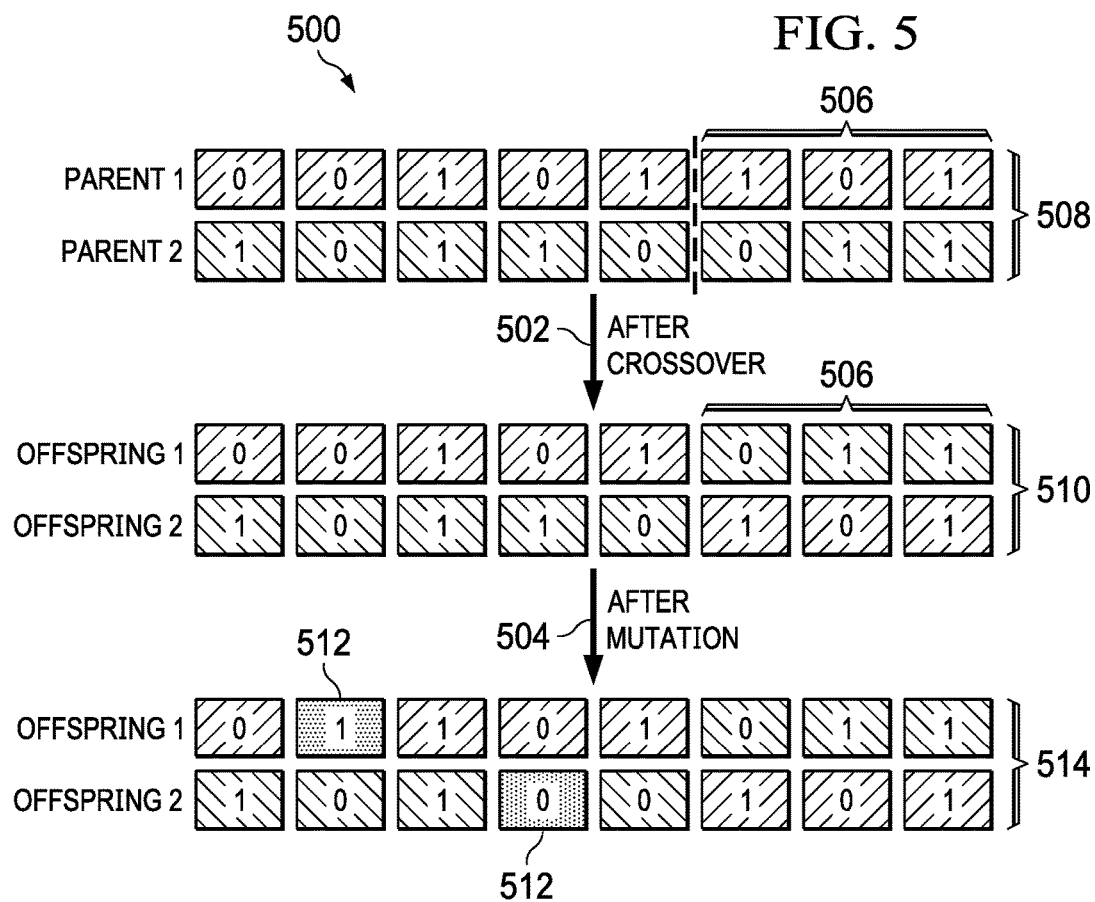
FIG. 5 is a diagram of an example of a process which includes a simple crossover and a mutation in binary genetic algorithms (bGAs), according to some implementations of the present disclosure.

FIG. 5 is a diagram of an example of a process 500 which includes a simple crossover 502 and a mutation 504 in bGAs, according to some implementations of the present disclosure. The simple crossover 502 is a crossover 506 from parent chromosomes 508 to offspring chromosomes 510. Since any bit of a binary chromosome can only take two values, mutation can be applied in bGAs by switching the value of bits 512, which are selected for mutation 504, creating offspring chromosomes 514. Although the implementation in cGAs is different, the main function of mutation remains the same. Mutation in this algorithm can be attained by adding a normally distributed random number to the variable selected for mutation as shown by Equation (5):

$$P_i^{new} = P_i^{old} + \sigma \cdot N(0,1) \quad (5)$$

where $P_i^{new}$ is the $i^{th}$ variable in a new individual, $P_i^{old}$ is the $i^{th}$ variable in an old individual, and N(0,1) is a standard normal distribution with a mean of zero and a variance of one. The standard deviation (σ) of this property is computed for the current population. The added random value is scaled by the standard deviation of the current property to make sure the property does not exceed its feasible range. The reproduction procedure described by the three GA operators is just one part of the optimization loop.

Figure 6:
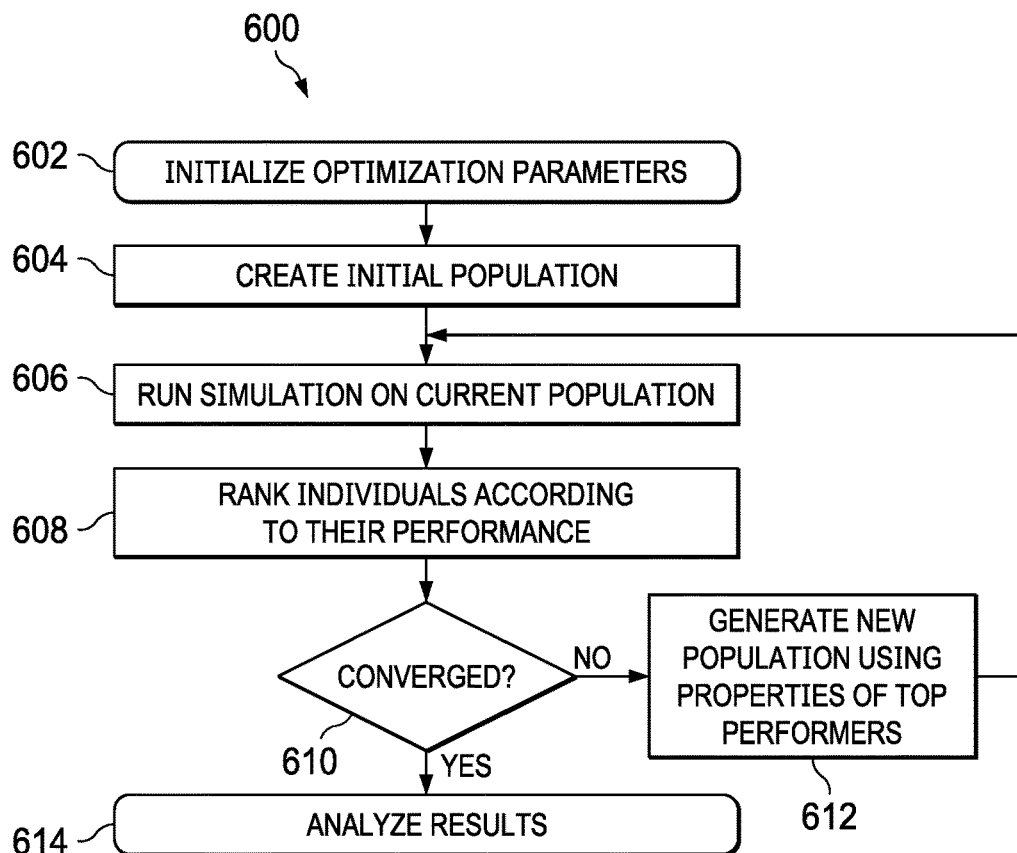
FIG. 6 is a flow diagram of an example of a process which provides an overall optimization procedure using genetic algorithms (GAs), according to some implementations of the present disclosure.

FIG. 6 is a flow diagram of an example of a process 600 which provides an overall optimization procedure using GAs, according to some implementations of the present disclosure. At 602, optimization parameters are initialized. At 604, an initial population is created. At 606, a simulation is run on the current population. At 608, individuals are ranked according to their performance. At 610, a determination is made whether convergence has occurred. At 612 (if convergence has not occurred), a new population is generated using properties of the top performers, and the simulation is re-run at 606. At 614, the results are analyzed.

Figure 7:
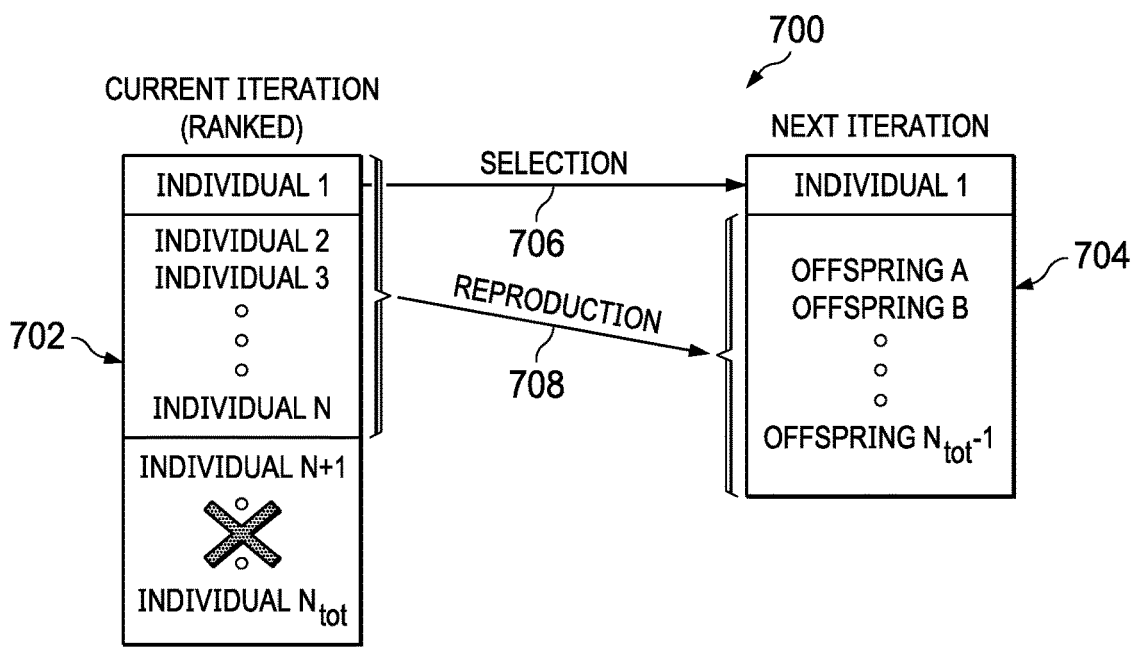
FIG. 7 is a block diagram of an example of a process which provides a reproduction procedure from a current iteration to a next iteration in a genetic algorithm, according to some implementations of the present disclosure.

FIG. 7 is a block diagram of an example of a process 700 which provides a reproduction procedure from a current iteration 702 to a next iteration 704 in a genetic algorithm, according to some implementations of the present disclosure. For example, FIG. 7 shows how one generation evolves by selection 706 and reproduction 708 to a next generation.

Figure 8:
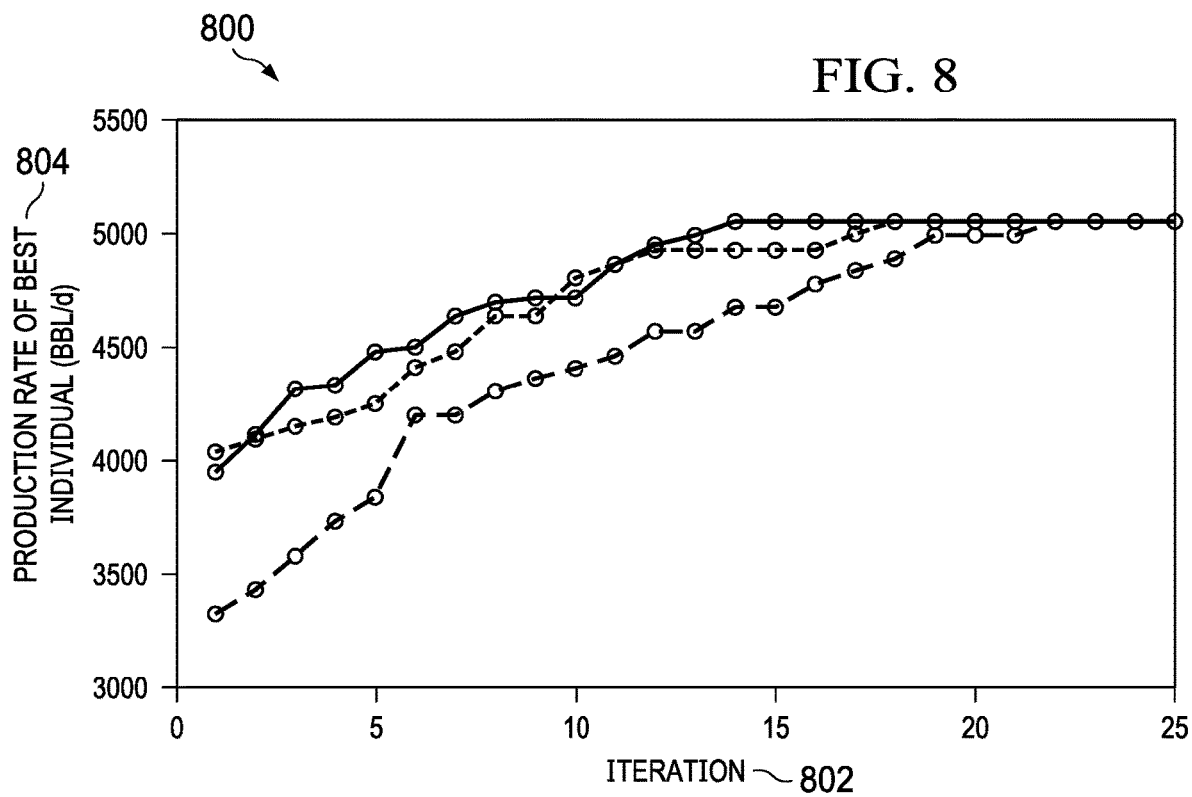
FIG. 8 is a graph showing examples of plots for a progression of the objective function fitness for three different optimization runs, according to some implementations of the present disclosure.

FIG. 8 is a graph showing examples of plots 800 for a progression of the objective function fitness for three different optimization runs, according to some implementations of the present disclosure. On average, a true optimum was found after 18 iterations 802. For example, a true optimum is determined, after convergence, to be a production rate 804 of around 5,000 barrels per day (bbl/d). In this example, the initial population was constructed with 20 random possible solutions for the well setting. Then, a genetic algorithm was applied to improve the solution.

Convergence Test

Since the GA is used here as the search engine, it is important to know if the algorithm would finally converge to a global optimum in a simplified problem with two optimization variables, and what conditions would affect convergence. A simple optimization test to illustrate the convergence of a cGA was designed. The problem was to find a vertical well with the greatest production in a 2D homogenous square reservoir with closed boundaries. The dimensions of the reservoir model used were 101×101. The best solution is known to be in the center of the reservoir, which falls in grid block (51, 51). A cGA with parameters given in Table 1 was tested for comparison.

TABLE 1

Convergence test cGA parameters.

| GA Parameter | Value |
| --- | --- |
| Population size | 20 |
| Maximum number of generations | 100 |
| $P_{xo}$ | 0.5 |
| $P_{mut}$ | 0.1 |
| Selection fraction | 0.7 |
| Ranking scale | 3 |

FIG. 9 is a graph of an example of a plot 900 showing an evolution path of a GA over generations 902, according to some implementations of the present disclosure. For example, FIG. 9 shows all individuals of the population at each generation until convergence. In this example, convergence occurs at or near the center of the reservoir model having the dimensions of 101×101 matching the plot 900. The center is at a grid block 904 (51,51) of the grid.

To diminish the stochastic effects in testing cGA convergence, 100 different initial populations were used. Then, the cGA code was run 200 times for each initial population. Using the given parameters, all the 20,000 cases converged to the known optimum before 100 generations. Using the cGA, convergence occurred after 103.5 simulations, on average, as shown in Table 2. An exhaustive search that is performed by simulating each location can find the solution/global optimum on average after 5,000 simulations.

TABLE 2

Results for cGA convergence test

| Converged | Value |
| --- | --- |
| Average number of simulations | 103.5 |
| Median Number of simulations | 91.5 |

The prior description explains how the optimizer can guide the parameters to improve the solution performance. The algorithm can be coupled with a tool to evaluate the fitness of each proposed solution. For example, a nodal analysis tool (for example, PIPESIM or Prosper) can be used. This process is sequential and can be automated as explained with reference to FIG. 2.

Integrated Optimization Approach

An integrated optimization approach can use network modeling in real-time for SWC optimization which was successfully field-tested. Two case studies are discussed in the present disclosure for demonstration.

Figure 10:
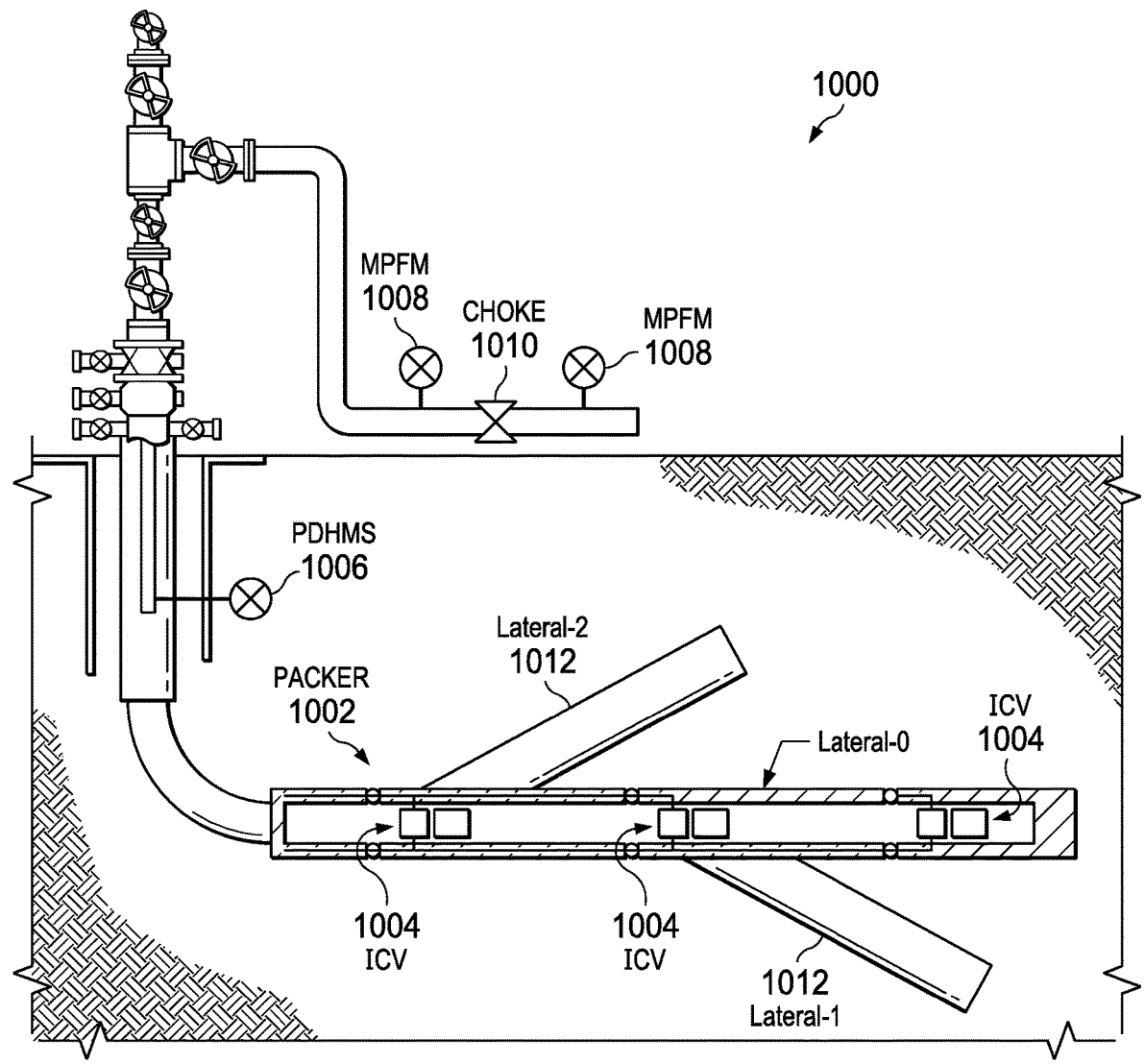
FIG. 10 is a diagram showing an example of a schematic showing typical components of a smart well completion (SWC), according to some implementations of the present disclosure.

FIG. 10 is a diagram showing an example of a schematic showing typical components of a smart well completion (SWC) 1000, according to some implementations of the present disclosure. A typical SWC includes at least one feed-through isolation packer 1002, ICVs 1004, and a permanent downhole monitoring system (PDHMS) 1006. Components of the SWC 1000 are usually complemented by a multiphase flow meter (MPFM) gauge 1008 and a choke 1010 at the surface for flow rate monitoring. The SWC 100 includes laterals 1012.

In some implementations, procedures that apply to smart well completion approaches include following. First, the functionality of the SWC components is checked, and candidate wells are selected. Second, all previous data is collected and reviewed, including well rate tests, reservoir fluid properties (PVT), permeability (K), productivity index (PI), and ICVs' specifications (for example, pressure drop versus estimated flow rate plot). A specific pressure drop reaction can apply to each ICV's opening. Third, an optimization testing program is designed, and a preliminary network steady state (SS) model is constructed. Fourth, individual lateral testing commences on the field at different surface choke settings as required, and pressure and flow rates data is collected. Fifth, the model is updated with the collected data and the single-lateral performance is calibrated. Sixth, different commingled production scenarios are generated and studied, and the optimum ICVs' settings are selected based on the well target and reservoir objectives. Seventh, the selected commingled production scenarios are tested on field for validation. Eighth, information is collected, and further model calibration is conducted if needed. Ninth, the optimum is chosen and ICVs' settings to be applied on field are validated.

Figure 11:
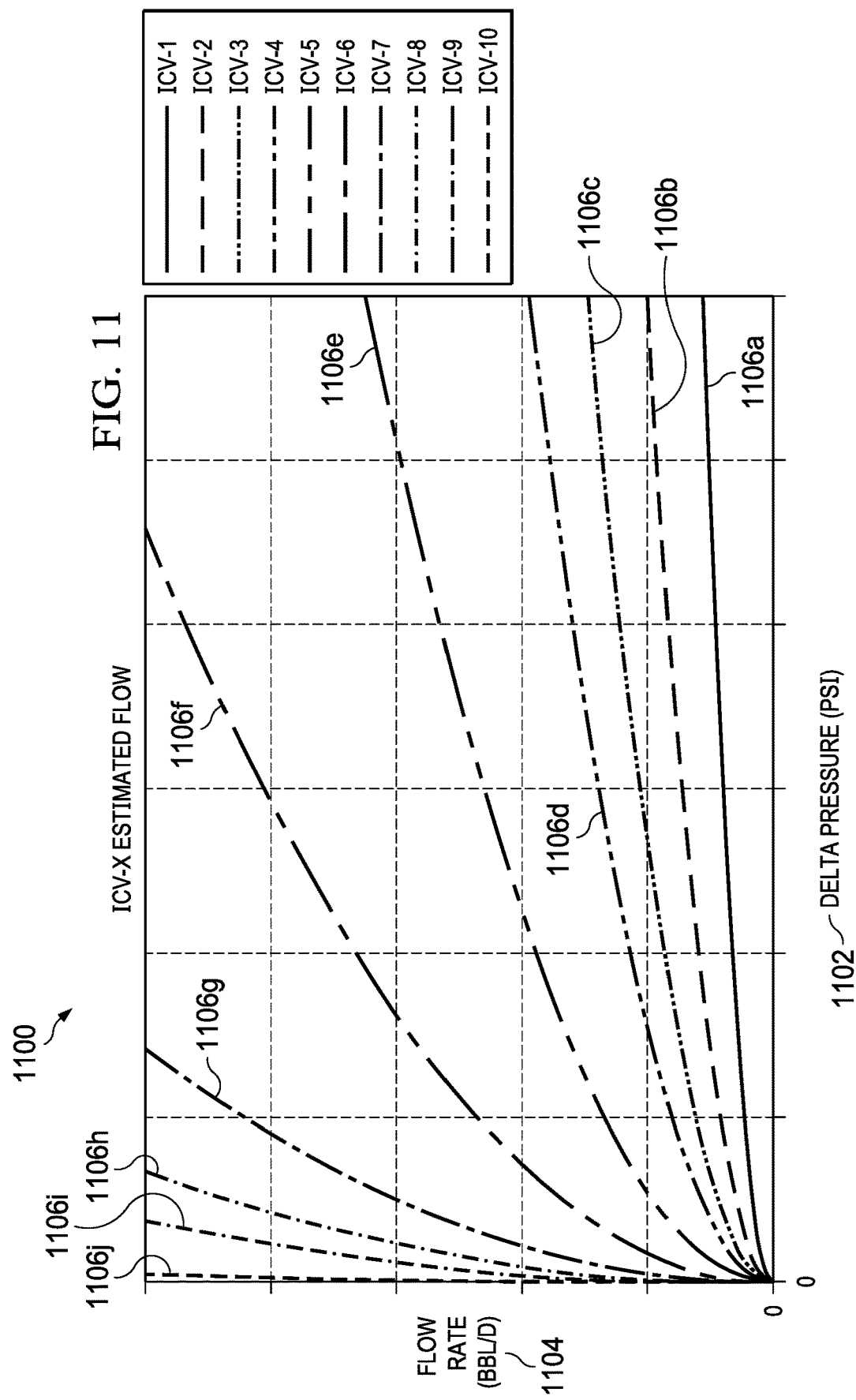
FIG. 11 is a graph showing an example of a plot including ICV flow rates corresponding to different pressure drops and different ICV positions, according to some implementations of the present disclosure.

FIG. 11 is a graph showing an example of a plot 1100 including ICV flow rates corresponding to different pressure drops and different ICV positions, according to some implementations of the present disclosure. For example, FIG. 11 shows an example of pressure drop 1102 (for example, delta pressures in psig) effects versus flow rate 1104 (for example, in barrels per day) for specific ICVs 1106a-1106j.

Important points for the optimization using modeling include the following. Once the network model is built, the laterals are matched individually. Properly-matched laterals are a prerequisite for the second step—matching the commingled flow. Once the commingled flow is matched, the PIs from the laterals are used to estimate the well performance. An optimization can then be carried out to determine the optimal valve settings of each lateral.

Single-Lateral and Commingled Testing Procedures

To model and optimize multilaterals, two types of field tests are required. The first type of field test is to determine the shut-in pressure. Determining the shut-in pressure includes closing off the well at the surface while the ICV of a to-be-tested lateral is kept open while ICVs of the other laterals are closed. The second type of field test is a production test to determine the flowing bottomhole pressure (FBHP) and phase flow rates.

Laterals are to be tested individually before further testing occurs, when the laterals are commingled with other zones at different production rates. Commingled testing can reduce production detriments, but the commingled testing may generally produce less accurate results. Causes of the less accurate results can include an accumulation of errors in the computations that are required to determine individual lateral rates. The value of a gauge located at the top of the perforations comes from the ability to measure the FBHPs directly and to evaluate the validity of the model continuously. While these tests can provide a representation of the lateral performance, additional tests can be carried out at different choke settings to better understand the well performance.

Figure 12:
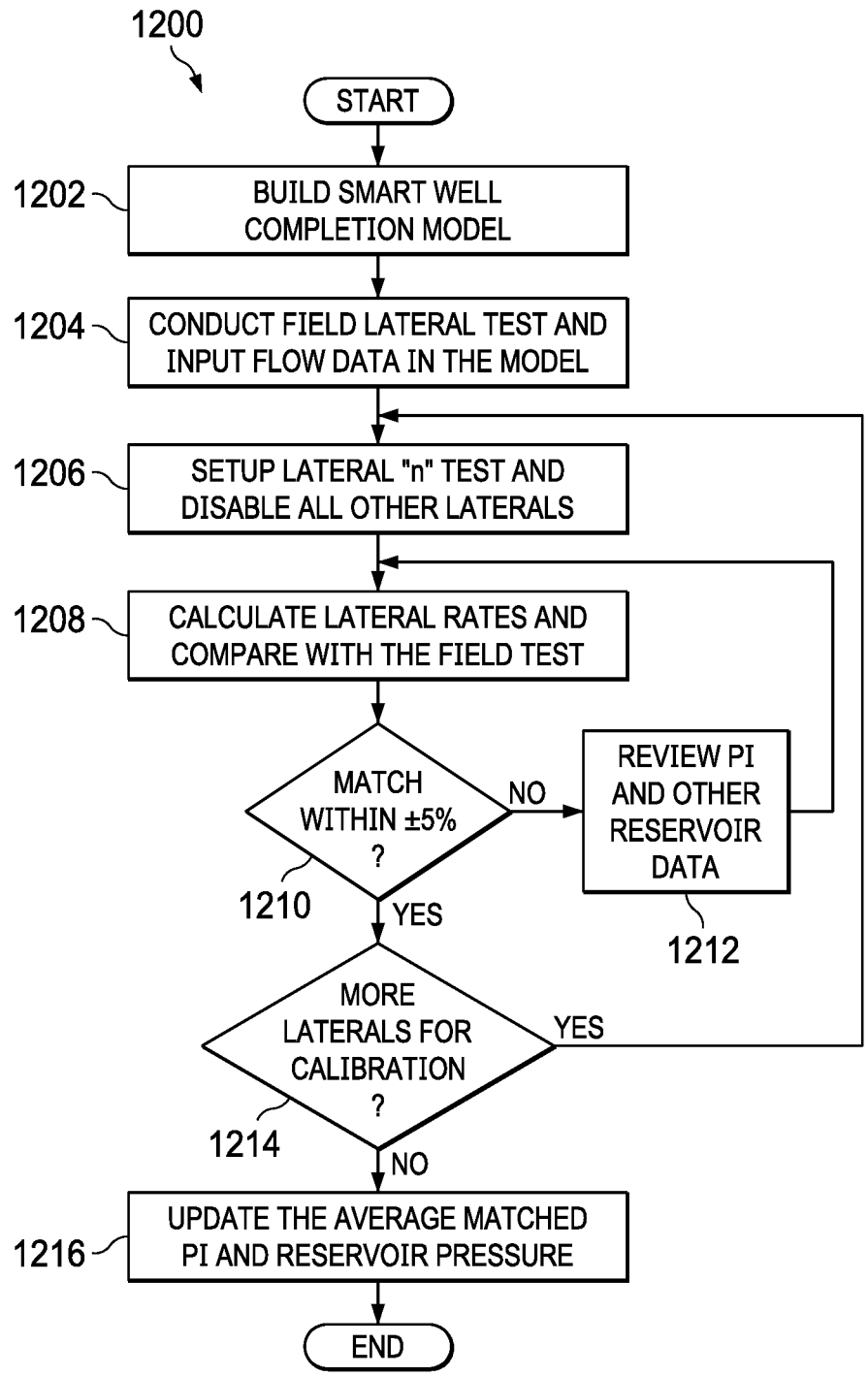
FIG. 12 is a flow diagram showing an example of a single lateral calibration process, according to some implementations of the present disclosure.

FIG. 12 is a flow diagram showing an example of a single lateral calibration process 1200, according to some implementations of the present disclosure. For example, FIG. 12 demonstrates an individual lateral testing and calibration process.

At 1202, a smart well completion model is built. At 1204, field lateral tests are conducted and flow data is input into the model. At 1206, a test for a given one of the n laterals is set up, and all other laterals are disabled. At 1208, lateral rates are calculated and compared with the field test. At 1210, a determination is made whether the results match within a threshold (for example, 5%). At 1212 (if the determination indicates that the results do not match within the threshold), the PI and other reservoir data are reviewed, and the lateral rates are calculated and compared with the field test at 1208. At 1214 (if the determination indicates that the results do match within the threshold), a determination is made whether more laterals remain to be calibrated. At 1206 (if more laterals remain to be calibrated), a test for the next one of the n laterals is set up, and all other laterals are disabled. At 1216 (when it is determined that no more laterals remain to be calibrated), the average matched PI and reservoir pressure are updated.

Figure 13:
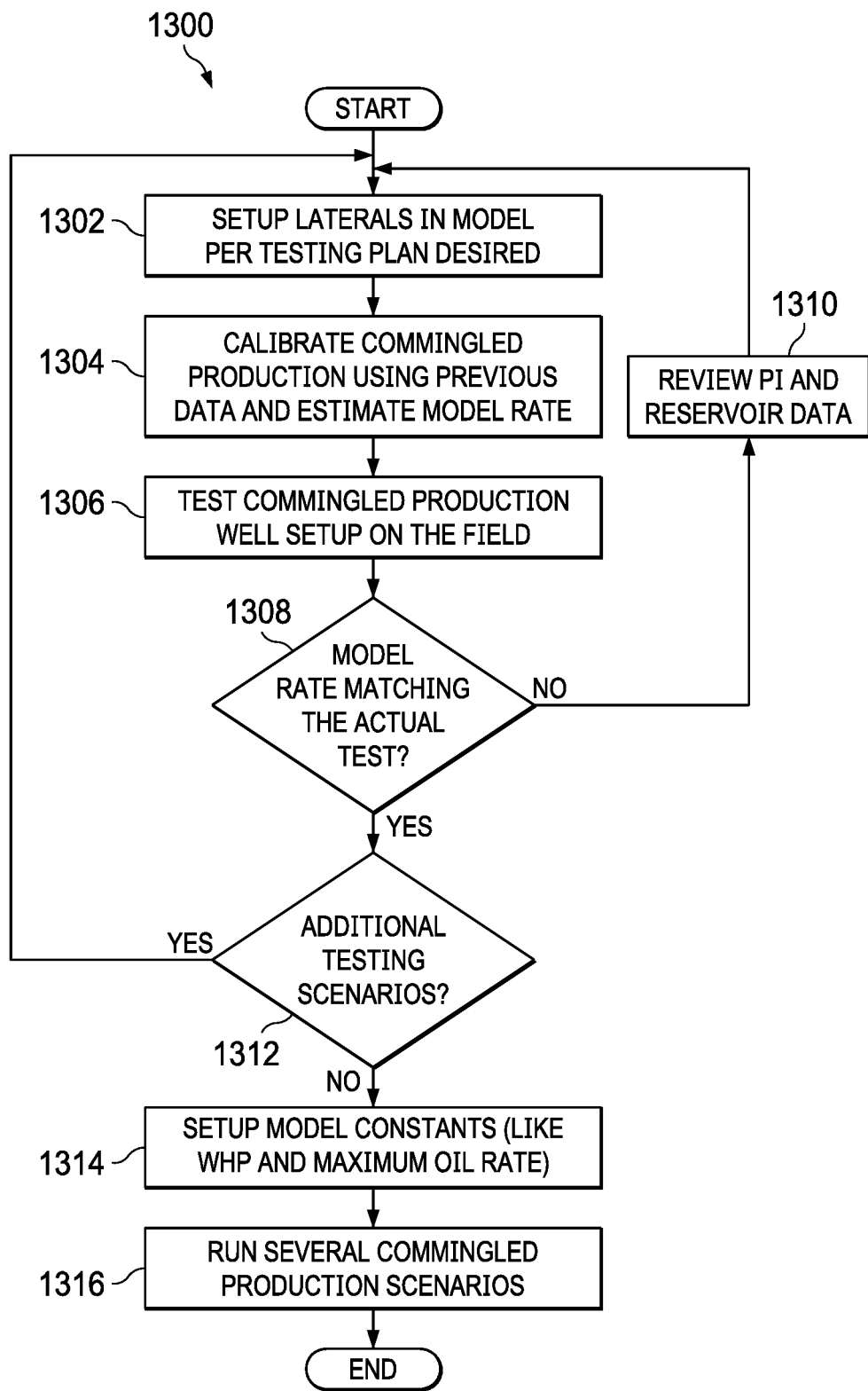
FIG. 13 is a flow diagram showing an example of a commingled flow well calibration process, according to some implementations of the present disclosure.

FIG. 13 is a flow diagram showing an example of a commingled flow well calibration process 1300, according to some implementations of the present disclosure. For example, the commingled flow well calibration process 1300 can be used after calibration and data collection for the laterals.

At 1302, the laterals are set up in the model according to a desired testing plan. At 1304, comingled production is calibrated using previous data, and model rates are estimated. At 1306, the comingled production well set-up is tested in the field. At 1308, a determination is made whether the model rate matches the actual test. At 1310 (if it is determined that the model rate does not match the actual test), the PI and other reservoir data are reviewed, and the laterals are set up in the model according to a desired testing plan at 1302. At 1312 (if it is determined that the model rate does match the actual test), a determination is made addition testing scenarios need to be set up. If it is determined that addition testing scenarios need to be set up, the laterals are set up in the model according to a desired testing plan at 1302. At 1314 (if it is determined that addition testing scenarios do not need to be set up), model constraints, such as wellhead platform (WHP) and maximum oil rates, are set up. At 1316, several comingled production scenarios are run.

Downhole Network Modeling

A steady state (SS) model that was used for creating a black oil model (and that was built as a network using a commercial software) was used to connect different laterals. The different laterals were connected into one single point and tied-up to a vertical lift performance (VLP) curve to represent the well performance. On each lateral, the flow and pressure drop through the reservoir were determined in the horizontal section as well as the annular flow between the casing and the tubing. The model was used to determine the optimum pressure drop across each ICV and the appropriate ICV setting at different operational conditions.

Figure 14A:
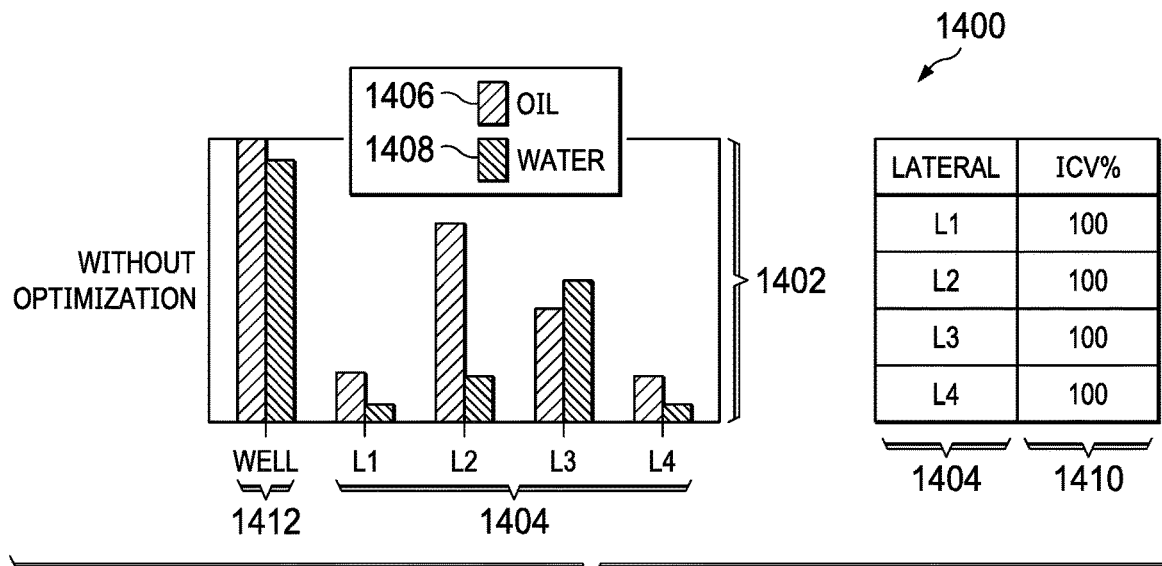
FIGS. 14A and 14B are production rate graphs and showing examples of a sample well performance before and after applying the modeling optimization, according to some implementations of the present disclosure.
Figure 14B:
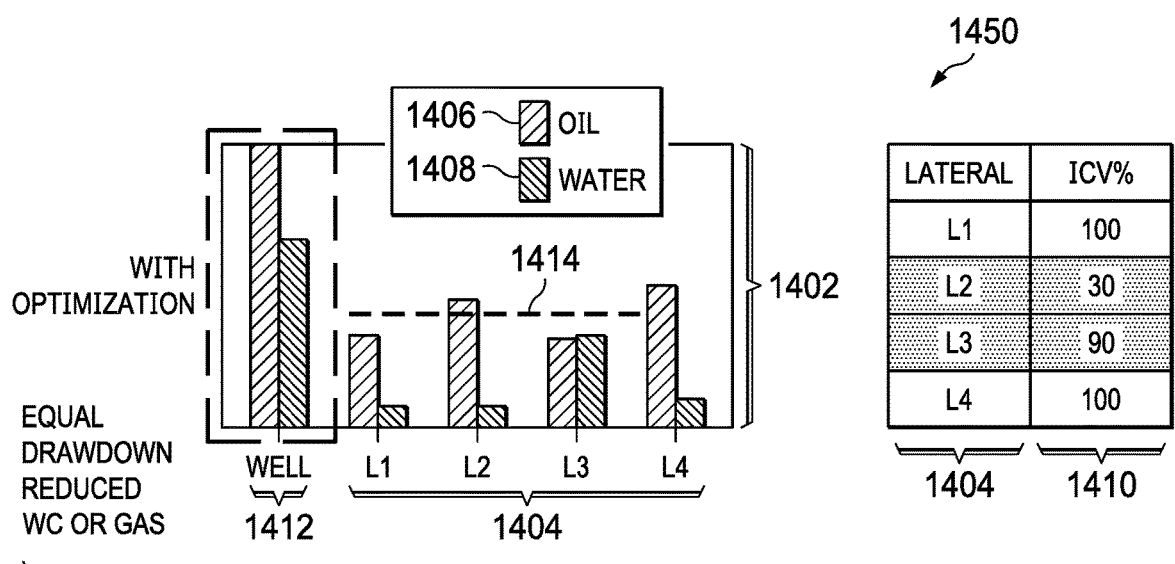

FIGS. 14A and 14B are production rate graphs 1400 and 1450 showing examples of a sample well performance before and after applying the modeling optimization, according to some implementations of the present disclosure. FIGS. 14A and 14B show, for example, that applying the correct adjustment to the downhole ICV can enhance a well's performance, as illustrated in FIG. 14B.

For example, in FIG. 14A, the production rate graph 1400, indicating production without optimization, includes production level bars 1402 for laterals 1404. The production level bars 1402 include production level bars for oil 1406 and water 1408. In the example of the production rate graph 1400, the laterals 1404 are all set at 100% ICV settings 1410. Production rates vary significantly for the laterals 1404, and overall production rates 1412 for the well have only a slightly greater oil output compared to water.

Referring now to FIG. 14B and the production rate graph 1450, indicating production with optimization, production rates are changed. This is because the ICV settings 1410 for the laterals 1404 L2 and L3 are set to 30% and 90%, respectively. As a result of these changed ICV settings 1410, production rates for the laterals 1404 have changed, and the overall production rates 1412 for the well have changed. Specifically, as indicated by heights of the production level bars 1402 for the laterals 1404 relative to a horizontal equal drawdown line 1414, oil production rates of the laterals 1404 vary less (as compared to the production rates in the production rate graph 1400). Moreover, the overall production rates 1412 for the well indicate a great different between oil production and water production. Similar reductions can occur for gas production.

The network model was originally designed to solve surface challenges. For the current disclosure, the surface model was used for analyzing the impact of the backpressure of the wellhead choke size on the laterals. For example, production constraints can be added to the network for maintaining certain production targets and system constraints such as gas production and pressure downstream of the choke.

For a valid subsurface model, the inflow information typically incorporates accurate reservoir pressure from recent pressure surveys and (if applicable) gas and water inflow trends, which can be observed from production history. Major features of the model can include the following. First, a PDHMS point can be used as the top node in the model. For example, the model can solve the network with the PDHMS reading used as a sink. Without a valid PDHMS reading, the lateral performance can be extremely difficult to model. Second, a tie-in point can be used to represent the solution node, connecting the inflow performance relationship (IPR) to the VLP. This point can represent the first ICV point. Third, a horizontal section of the tubing can represent the connection from the tie-in point to the heel of each lateral. Fourth, an ICV point can represent the choke used to restrict flow from each lateral. The IPR can be modeled and validated outside the network and used as an input to model the well-reservoir performance.

Figure 15:
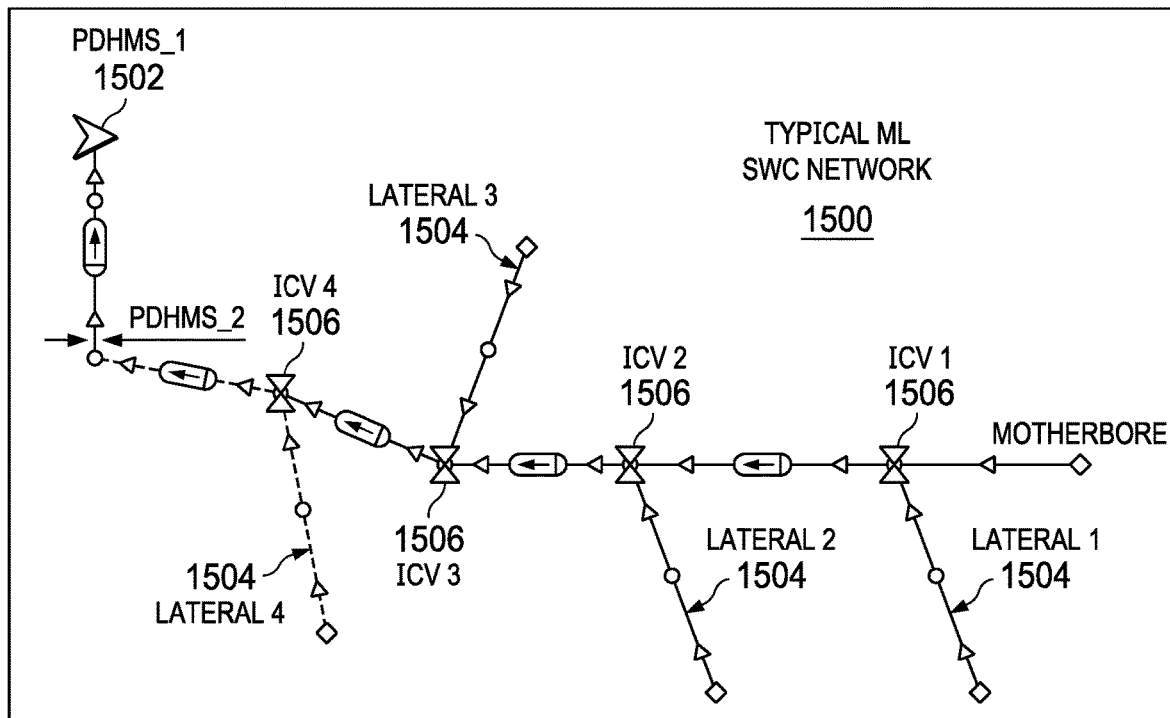
FIG. 15 is a diagram showing an example of a typical steady state network model for a multilateral well, according to some implementations of the present disclosure.

FIG. 15 is a diagram showing an example of a typical steady state network model 1500 for a multilateral well, according to some implementations of the present disclosure. The network model 1500 starts at a PDHMS 1502 and includes laterals 1504. The model can be used to integrate each lateral's IPR with the production constraints on the vertical section to generate a composite IPR corresponding to the relative ICV 1506 choke setting. By combining the composite IPR with tubing flow performance, coupled with the surface gauge data, the hydrocarbon deliverability of each lateral can be reasonably predicted (for example, within ±5% percentage error).

Field Applications—Field Testing

The following sections discuss field testing performed on Wells A and B in order to validate the techniques described in this disclosure. The field testing discussion includes descriptions of FIGS. 16-27.

The effectiveness of the approach was demonstrated in the field by testing the approach on a number of smart well completions, in this case, Wells A and B. Both of these wells have four horizontal laterals with the main intelligent components: MPFM, PDHMS gauges, and four ICVs for each. Adequate historical production and reservoir data are available for both wells, which made them good candidates for the approach.

Well A—Data Review and Analysis

Well A was drilled and completed as a smart well of an open-hole mother-bore with four laterals across a thin zone in a carbonate reservoir under water-flooding. Well A was located about 1.5 kilometers (km) away from the nearest injection line.

The well was producing at a substantial oil rate with a relatively high water cut (among wells of the same oil rate) prior to the optimization. The open-hole logs (for example, resistivity, gamma ray, neutron, and density logs) from each lateral were reviewed to assess the formation rock quality. Key observations from the logs, including the laterals' locations on the field oil column distribution and isobaric map were summarized. Laterals L1, L2, and L4 were placed in the good quality formation rock. Lateral L3, having a very limited interval, was placed in the poor rock quality. Laterals L1 and L3 were placed closer to the injection line than Laterals 2 and 4. Laterals L2 and L4 were placed in a much higher (closer to the surface) oil column area, with both receiving a lower pressure support (lesser injection pressure). To better understand the reservoir and well possible current inflow conditions, previous optimization jobs and the well historical production behavior were studied.

Figure 16:
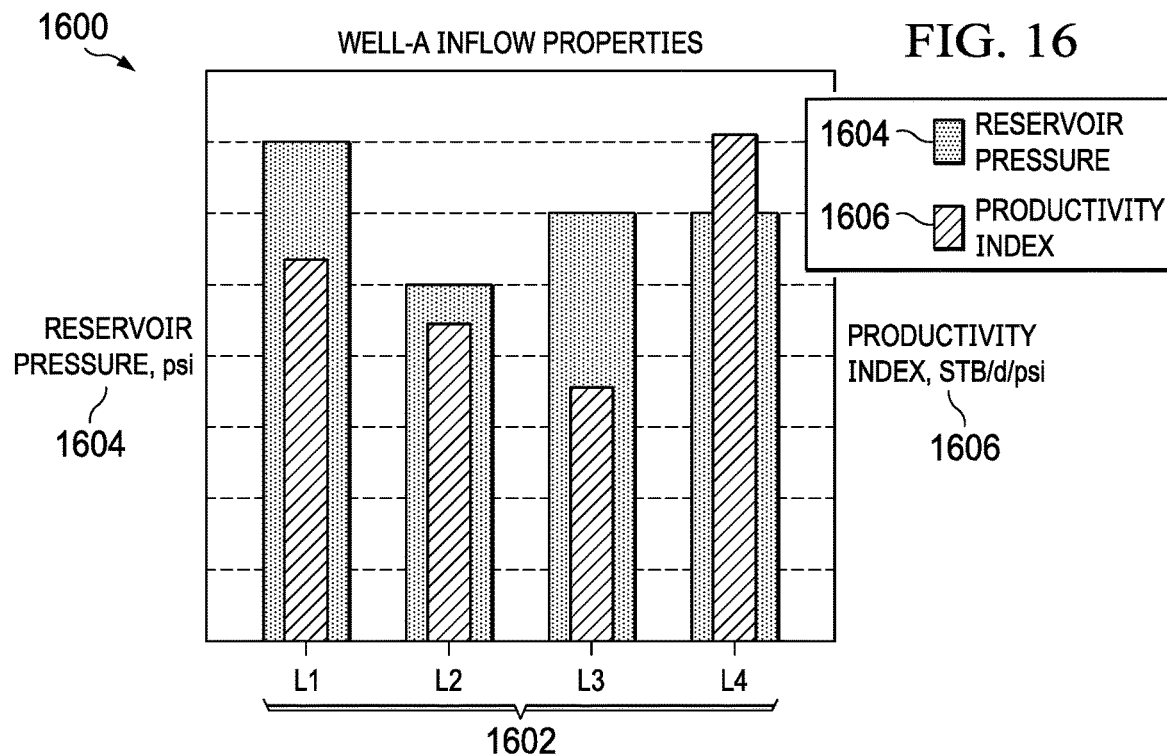
FIG. 16 is a graph showing examples of lateral well inflow properties, according to some implementations of the present disclosure.

FIG. 16 is a graph showing examples of lateral well inflow properties 1600, according to some implementations of the present disclosure. The graph includes bars for each of the laterals 1602 L1-L4. The bars indicate reservoir pressure 1604 (for example in psi) and a PI 1606, for example, in stock tank barrel per day, per pounds per square inch (psi) (STB/D/psi). Of the Well A estimated inflow properties, lateral L3 has the lowest PI, and lateral L2 receives the least pressure support. The shut-in pressure data on each lateral shows that the pressures were imbalanced with lateral L1, which has the greatest reservoir pressure. The openhole logs identified the rock quality of lateral L3, which justified the low PI. Each of the laterals were then matched to the lateral tests, and the match for the well and each lateral were within ±5% of each other.

Model Initialization and Commission of Field Testing

Figure 17:
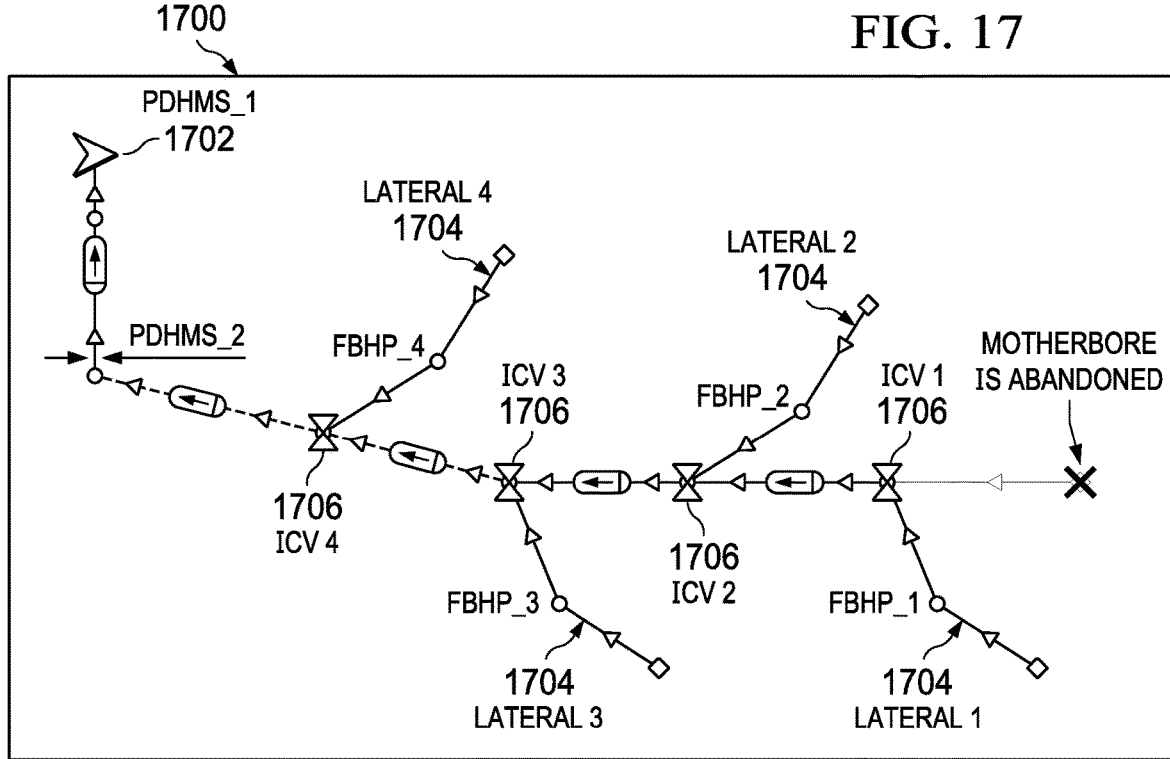
FIG. 17 is a diagram showing an example of a typical multilateral SWC network model for a multilateral well, according to some implementations of the present disclosure.

FIG. 17 is a diagram showing an example of a typical multilateral SWC network model 1700 for a multilateral well, according to some implementations of the present disclosure. For example, FIG. 17 depicts a steady-state downhole network model constructed using the available data prior to the field test. The network model 1700 starts at a PDHMS 1702 and includes laterals 1704, each with an ICV 1706. Each of the laterals was then matched against the lateral testing results from the previous optimization and well production data. Then, the flowing bottom-hole pressures (FBHPs) and the phase flow rate (including oil and water) of each lateral were determined.

Figure 18:
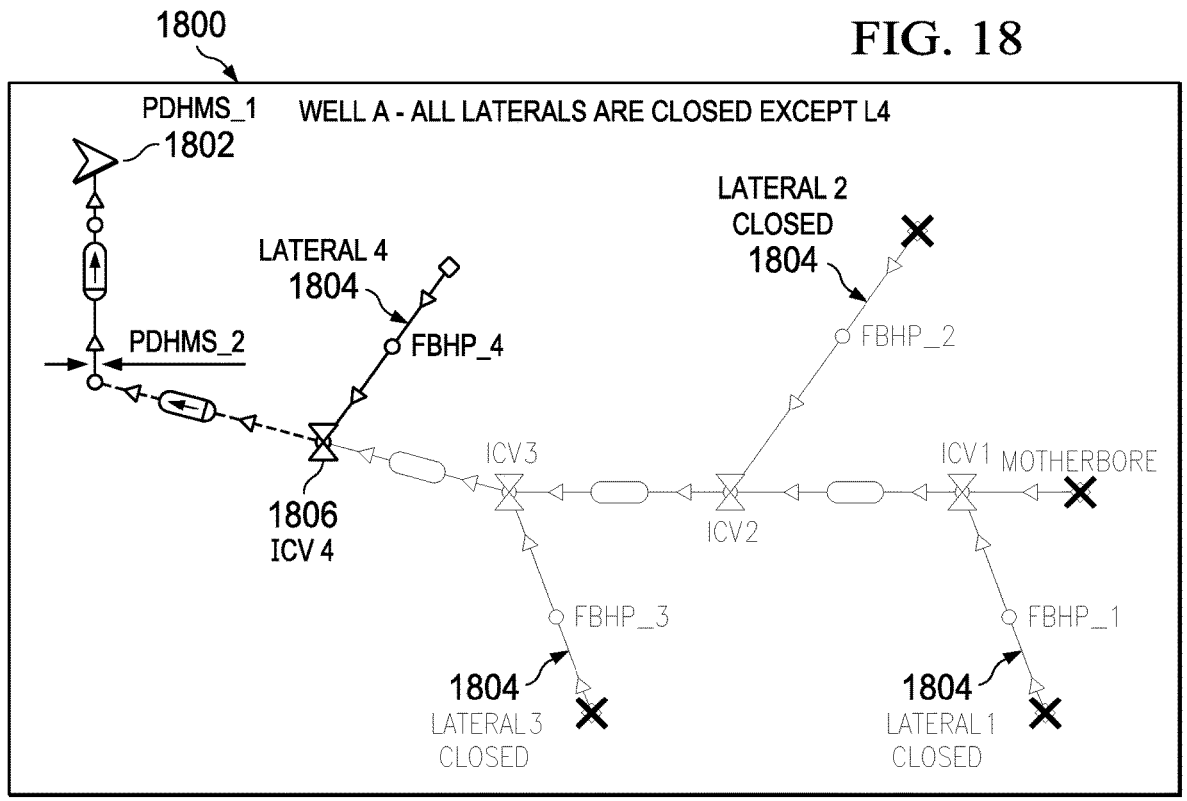
FIG. 18 is a diagram showing an example of a network model for a multilateral well with all laterals closed except one, according to some implementations of the present disclosure.

FIG. 18 is a diagram showing an example of a network model 1800 for a multilateral well with all laterals closed except one, according to some implementations of the present disclosure. For example, the network model 1800 can apply to a testing program that, when used on the field, started with single lateral testing at two different surface chokes. The network model 1800 starts at a PDHMS 1802 and includes laterals 1804, each with an ICV 1806. In this example of a Well A network model, all other laterals are disabled, while lateral L4 is matched against the field rate test. In this example, the laterals were calibrated in the model by shutting off all laterals and keeping the tested one open, as shown in FIG. 18.

After the single lateral testing on the field were completed, the laterals were calibrated in the model. Different production scenarios were generated to assess the best well commingled production profile. Once the commingled flow is matched with the field tests, the PIs from the laterals were recalibrated.

Figure 19A:
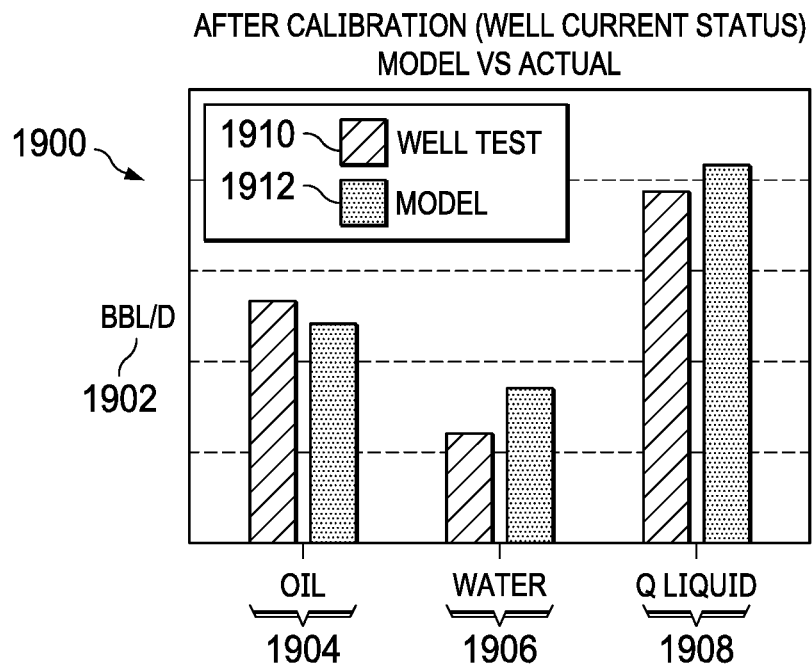
FIGS. 19A and 19B are graphs showing examples of flow rates plots for a well model after single lateral testing and calibration, according to some implementations of the present disclosure.
Figure 19B:
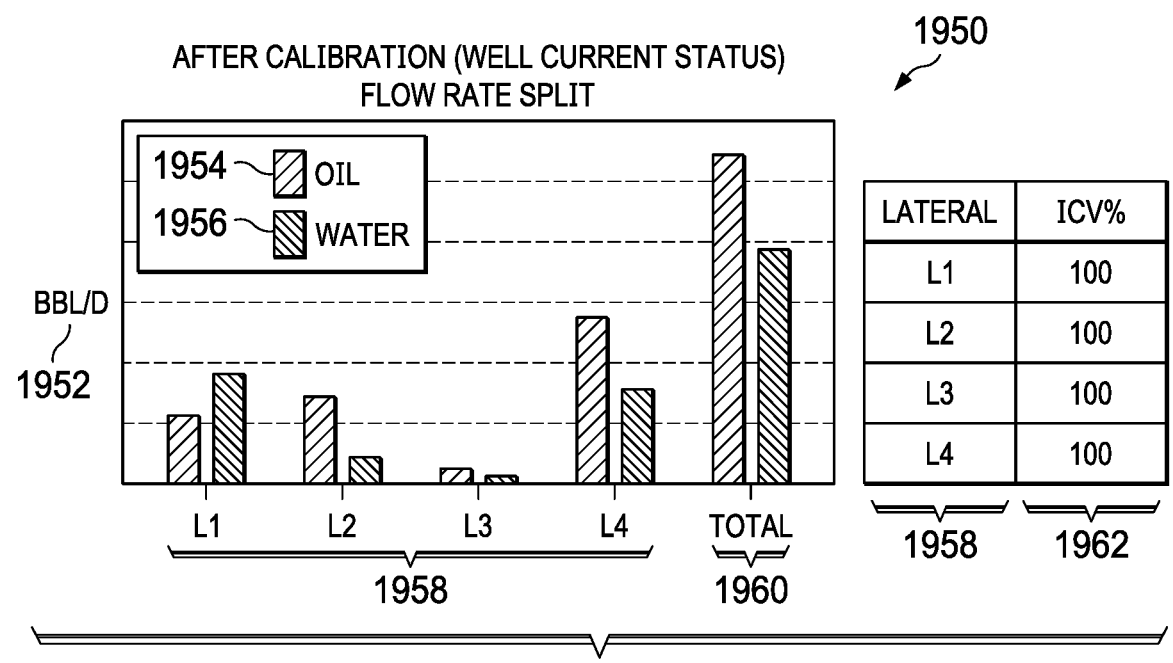

FIGS. 19A and 19B are graphs showing examples of flow rates plots 1900 and 1950 for a well model after single lateral testing and calibration, according to some implementations of the present disclosure. For example, the flow rates plot 1900 shows a match between the model and actual field test results (within ±5%). The flow rates plot 1950 shows the individual lateral performance with all ICVs at fully open. FIGS. 19A and 19B show the results after the single lateral calibration and the fully-open ICVs scenario. The flow rates plot 1900 includes barrels per day (bbl/d) 1902 values of oil 1904, water 1906, and Q liquid 1908 for the well test 1910 and the model 1912, respectively. The flow rates plot 1950 shows barrels per day (bbl/d) production rates 1952 for oil 1954 and water 1956. Production rates are shown for laterals 1958 L1, L2, L3, and L4 and a total production rate 1960 for the multilateral well. ICV settings 1962 show that none of the laterals are choked back. This scenario highlights lateral L1 producing mostly water and almost no production from lateral L3, and L4 dominates the well overall production.

Figure 20A:
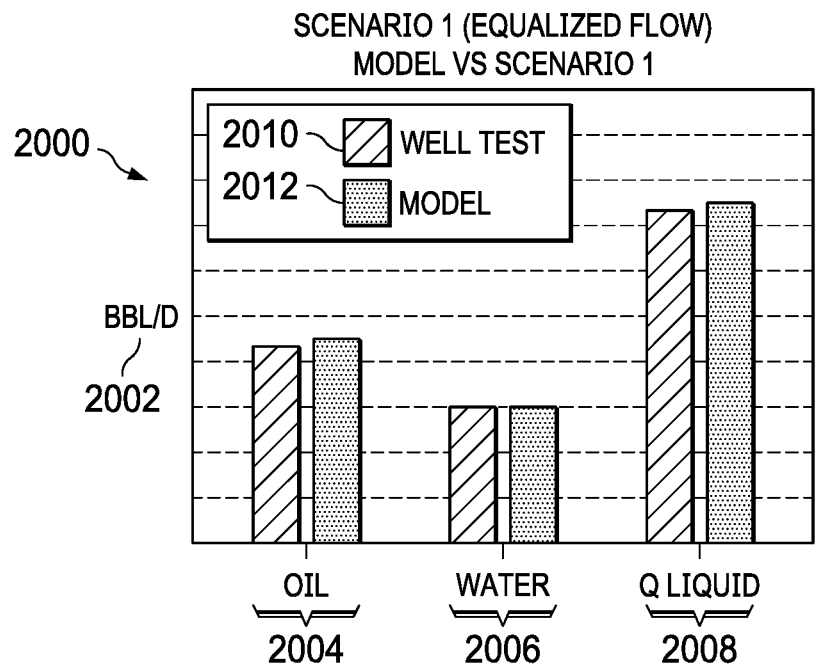
FIGS. 20A and 20B are graphs showing examples of flow rates plots for a well model using an equalized flow, according to some implementations of the present disclosure.
Figure 20B:
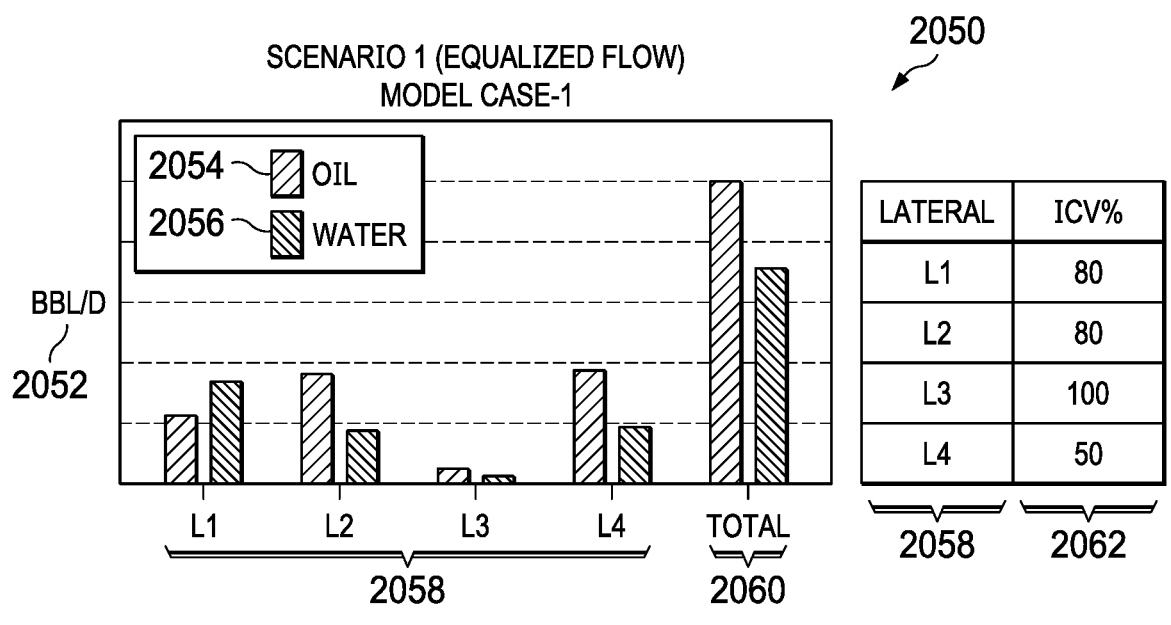

FIGS. 20A and 20B are graphs showing examples of flow rates plots 2000 and 2050 for a well model using an equalized flow, according to some implementations of the present disclosure. For example, the flow rates plots 2000 and 2050 correspond to a well model ICVs equalized flow scenario. The flow rates plot 2000 includes barrels per day (bbl/d) 2002 values of oil 2004, water 2006, and Q liquid 2008 for the well test 2010 and the model 2012, respectively. The flow rates plot 2000 shows a match between the model and actual field test results (within ±5%). The flow rates plot 2050 shows the individual lateral performance with laterals L1, L2, and L4 choked back. For example, the flow rates plot 2050 shows barrels per day (bbl/d) production rates 2052 for oil 2054 and water 2056. Production rates are shown for laterals 2058 L1, L2, L3, and L4 and a total production rate 2060 for the multilateral well. ICV settings 2062 show that laterals L1, L2, and L4 are choked back to 80%, 80%, and 50%, respectively.

The second production scenario is the equalized flow that attempts to balance the production from the laterals by managing the drawdown of each. This production technique can be applied to create a better sweep from the area and an even flood-front advancement. Laterals which are not placed in the good rock quality are expected to contribute the least to the overall well production, such as L3 in Well A. FIGS. 20A and 20B show the equalized flow scenario by choking back lateral L4 and slightly choking back laterals L1 and L2 to observe the impact on the water production from these laterals.

Figure 21A:
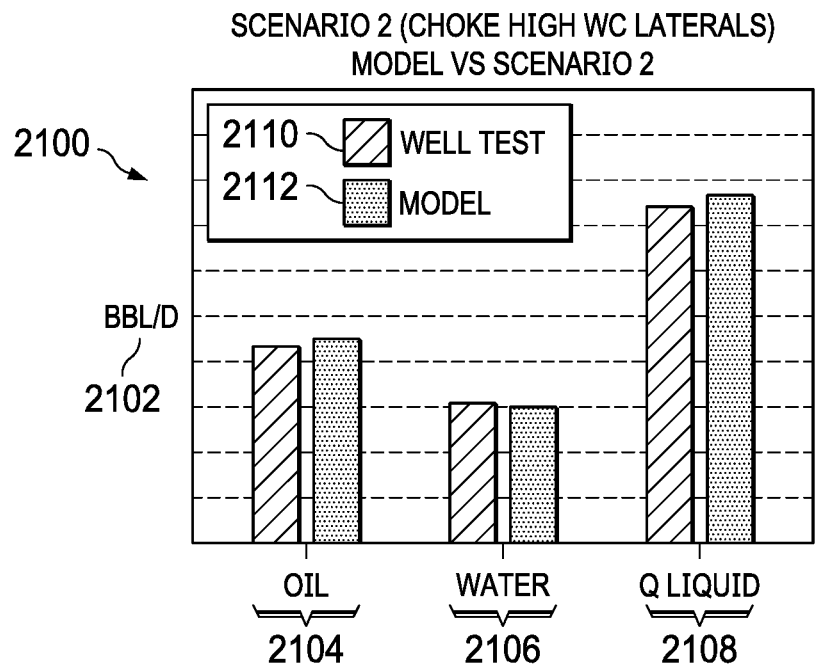
FIGS. 21A and 21B are graphs showing examples of flow rates plots for a restricted water production scenario, according to some implementations of the present disclosure.
Figure 21B:
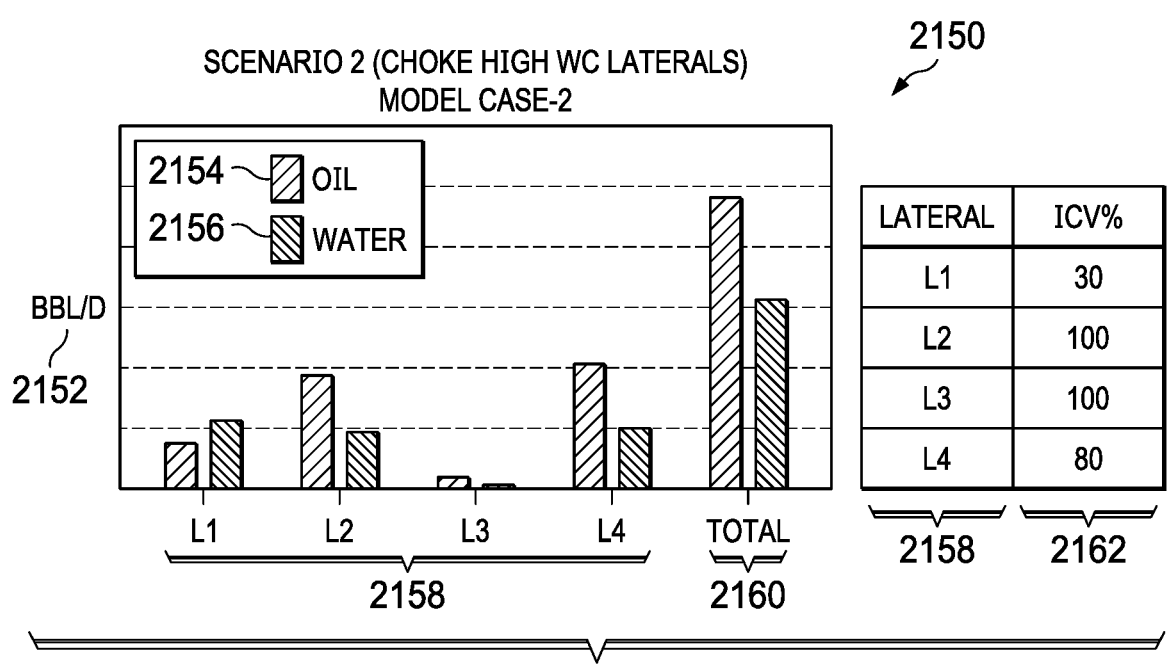

FIGS. 21A and 21B are graphs showing examples of flow rates plots 2100 and 2150 for a restricted water production scenario, according to some implementations of the present disclosure. The flow rates plot 2100 includes barrels per day (bbl/d) 2102 values of oil 2104, water 2106, and Q liquid 2108 for the well test 2110 and the model 2112, respectively. The flow rates plot 2100 shows a match between the model and actual field test results (within ±5%). The flow rates plot 2150 shows the individual lateral performance with applied restriction on laterals L1 and L4. For example, the flow rates plot 2150 shows barrels per day (bbl/d) production rates 2152 for oil 2154 and water 2156. Production rates are shown for laterals 2158 L1, L2, L3, and L4 and a total production rate 2160 for the multilateral well. ICV settings 2162 show that laterals L1 and L4 are choked back to 30% and 80%, respectively.

These types of scenarios can be studied, for example, to make a decision to apply settings which restrict the water production from lateral L1. For example, this is done because lateral L1 is the closest to the field injection line, and to slightly restrict lateral L4 to allow the production from the other laterals. The results of the selected scenario are shown in FIGS. 21A and 21B. This scenario achieves the well production target and reservoir management plan for this well. Post optimization tests demonstrated a gain in the well oil production of 1100 bbl/d and a 6% reduction in water cut.

Well B—Data Review and Analysis

In another experiment, Well B was drilled and completed similarly to Well A, as a smart well open-hole multilateral producer across the same thin zone. Well B was located about 1.7 km away from the nearest injection line.

Prior to the optimization, Well B was producing at a lower oil rate and higher water cut than pre-optimization rates. The open-hole logs were reviewed, and the formation rock quality was evaluated. The main observations from the logs, laterals' locations, the oil column distribution, and the isobaric map of the field includes the following. Laterals 3 and 4 are placed in a better rock quality. Lateral 1 is the nearest to the field injection line. Laterals 2 and 4 are placed in a much higher oil column area, yet are receiving less pressure support than the other laterals.

The well has five historical optimization jobs which were extensively reviewed. The review included reviewing data collected using a horizontal production logging tool (PLT) (collected six years prior to the optimization job) and providing information about each lateral flow rate and PI.

Figure 22:
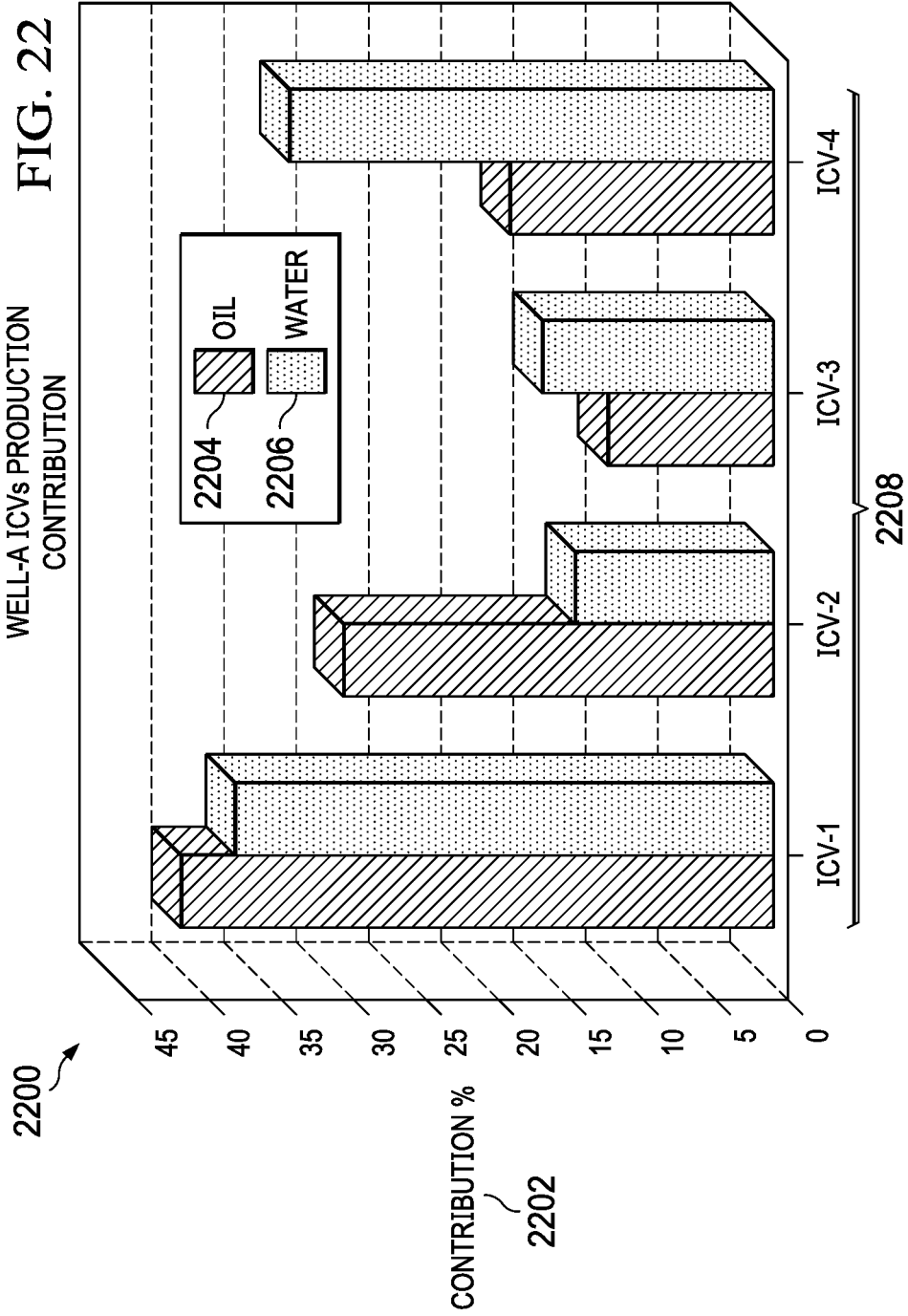
FIG. 22 is a graph showing examples of well inflow properties from a horizontal production logging tool (PLT), according to some implementations of the present disclosure.

FIG. 22 is a graph 2200 showing examples of well inflow properties from a horizontal PLT, according to some implementations of the present disclosure. For example, FIG. 22 shows Well A results of the horizontal PLT and contribution percentages 2202 for oil 2204 and water 2206 from ICVs 2208 of each lateral to the overall well production.

Figure 23:
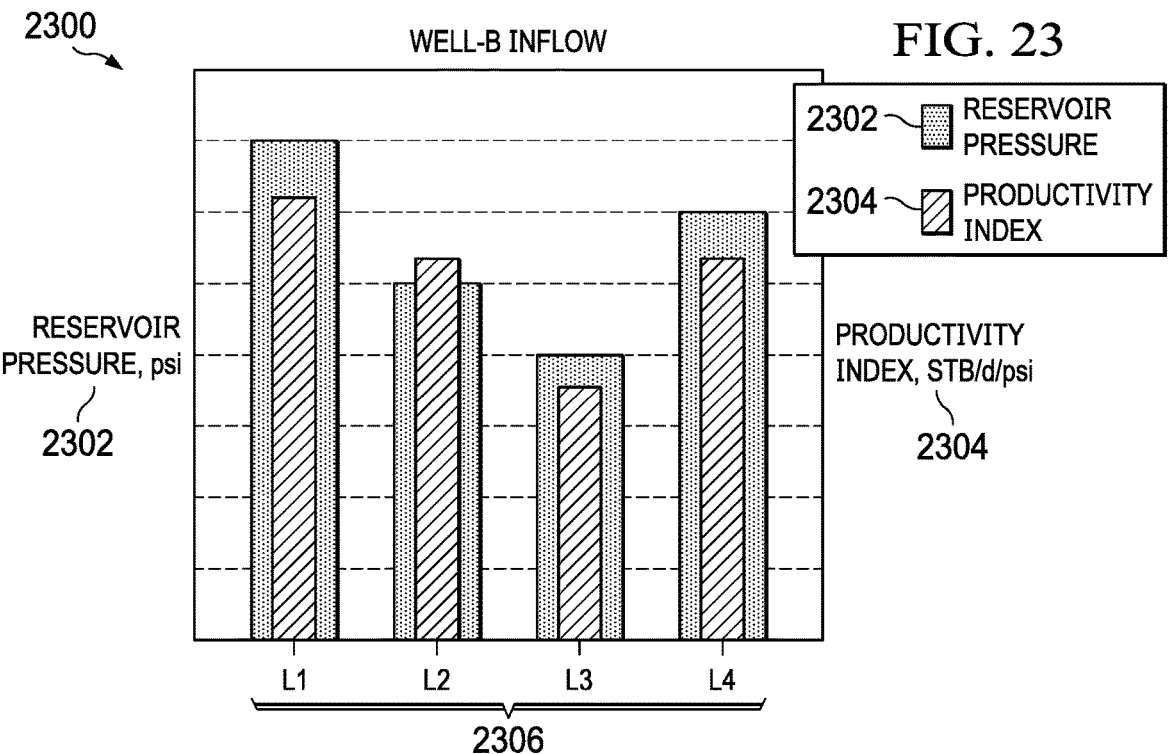
FIG. 23 is a graph showing examples of plots including reservoir pressure and productivity index (PI) for the laterals of a well, according to some implementations of the present disclosure.

FIG. 23 is a graph showing examples of plots 2300 including reservoir pressure 2302 and PI 2304 for the laterals of a well, according to some implementations of the present disclosure. For example, the plots 2300 represent the estimated PI 2304 values and the current reservoir pressure 2302 for Well B's laterals 2306 L1, L2, L3, and L4.

Model Initialization

Figure 24:
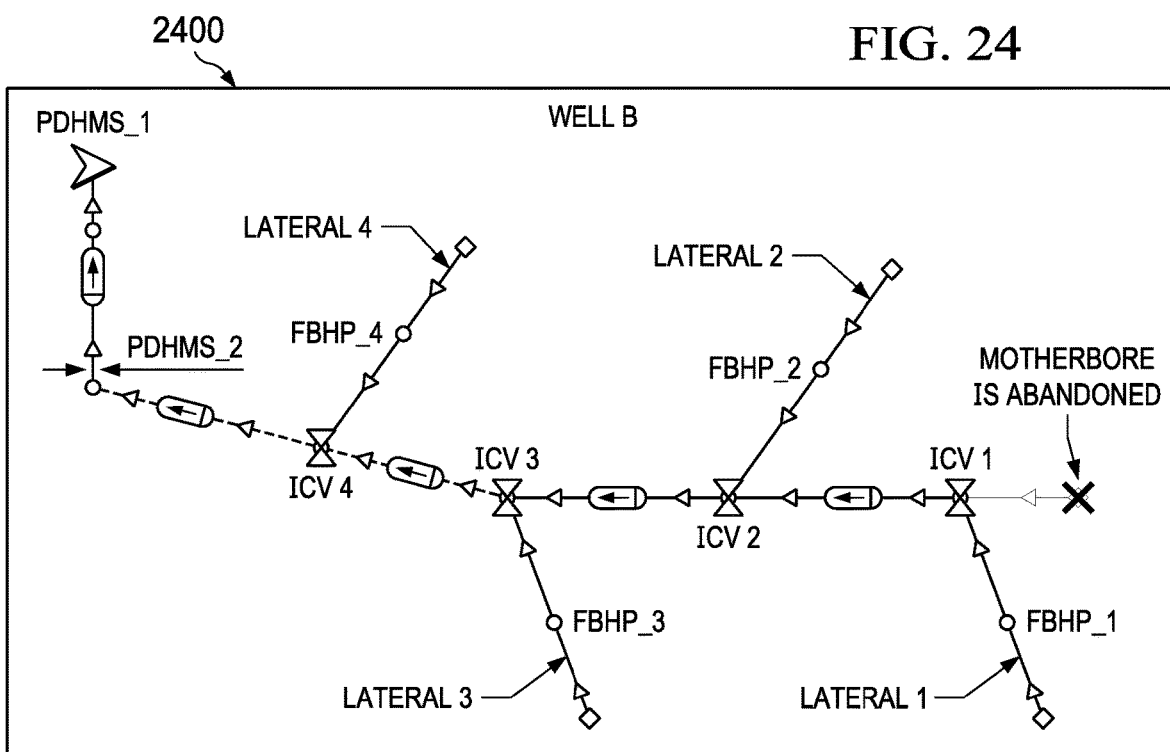
FIG. 24 is a diagram showing an example of a well model, according to some implementations of the present disclosure.

FIG. 24 is a diagram showing an example of a well model 2400, according to some implementations of the present disclosure. For example, the well-based network model was constructed for Well B, with a laterals network structure similar to the Well A. The laterals were then matched against the flow estimates from the previous optimization jobs. Subsequently, FBHPs and phase flow rate of each lateral were determined. During the commingled flow, a composite PI was calculated and used in conjunction with the lateral PIs to determine the lateral flow rates.

Figure 25A:
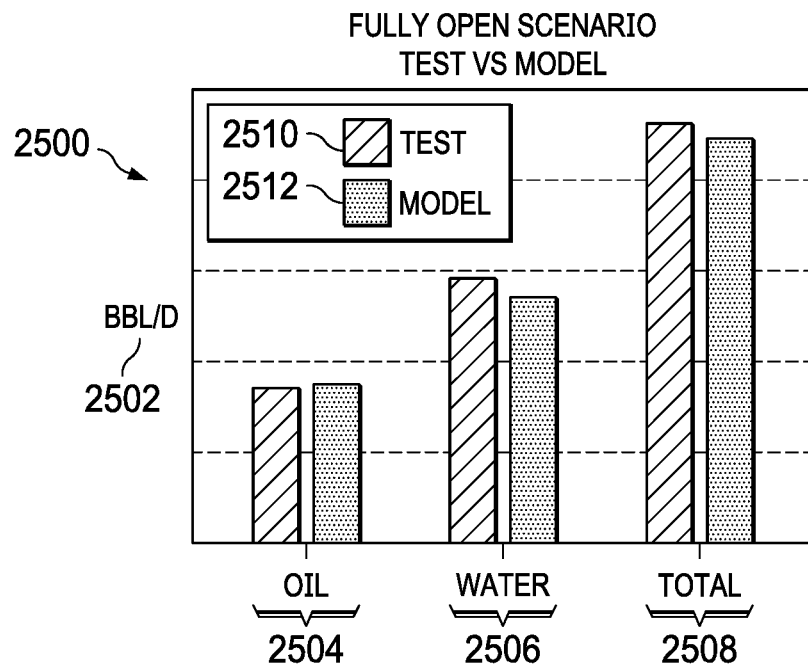
FIGS. 25A and 25B are graphs showing examples of flow rates plots for a fully open scenario, according to some implementations of the present disclosure.
Figure 25B:
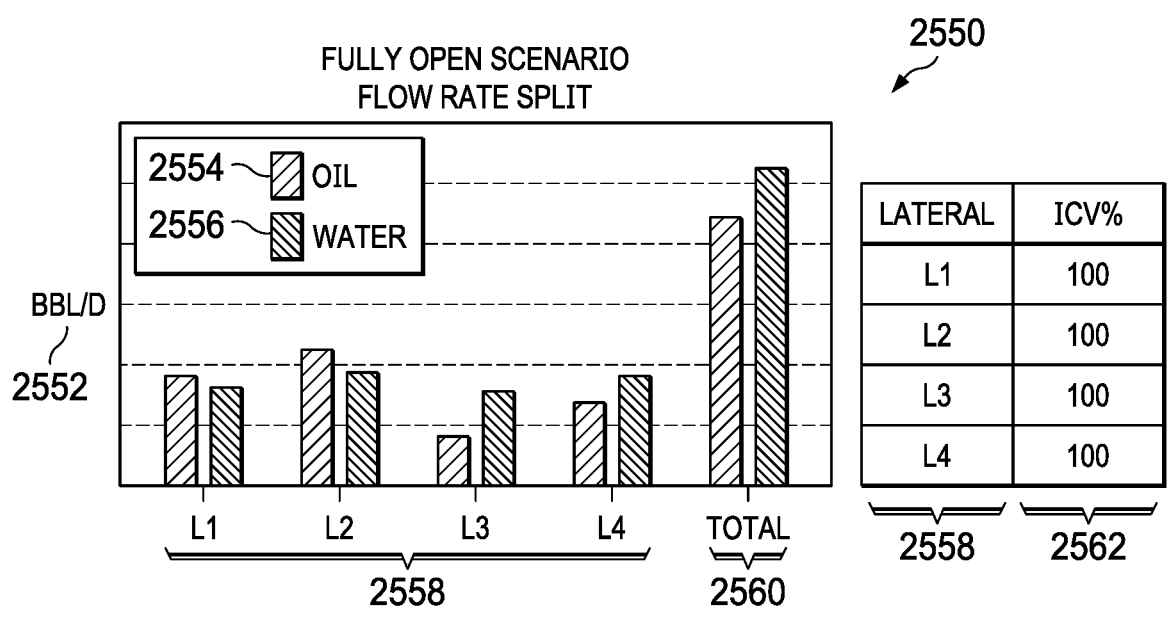

FIGS. 25A and 25B are graphs showing examples of flow rates plots 2500 and 2550 for a fully open scenario, according to some implementations of the present disclosure. The flow rates plot 2500 includes barrels per day (bbl/d) 2502 values of oil 2504, water 2506, and total liquid 2508 for the well test 2510 and the model 2512, respectively. FIGS. 25A and 25B show, for Well B's model, a fully open ICVs scenario after single lateral testing and calibration. The flow rates plot 2500 shows the match between the model and actual field test results (within ±5%). The flow rates plot 2550 shows the individual lateral performance with all ICVs at fully open. Laterals L1 and L2 are the highest producers, and lateral L3 is the least contributor corresponding to the low pressure region at which the lateral was drilled. For example, the flow rates plot 2550 shows barrels per day (bbl/d) production rates 2552 for oil 2554 and water 2556. Production rates are shown for laterals 2558 L1, L2, L3, and L4 and a total production rate 2560 for the multilateral well. ICV settings 2562 show that none of the laterals are choked back.

Figure 26A:
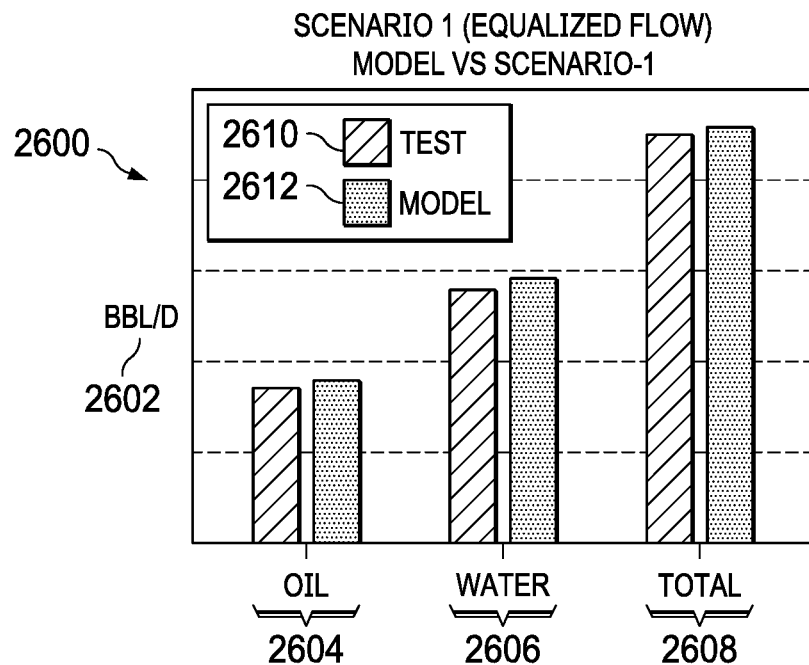
FIGS. 26A and 26B are graphs showing examples of flow rates plots for an equalized flow scenario, according to some implementations of the present disclosure.
Figure 26B:
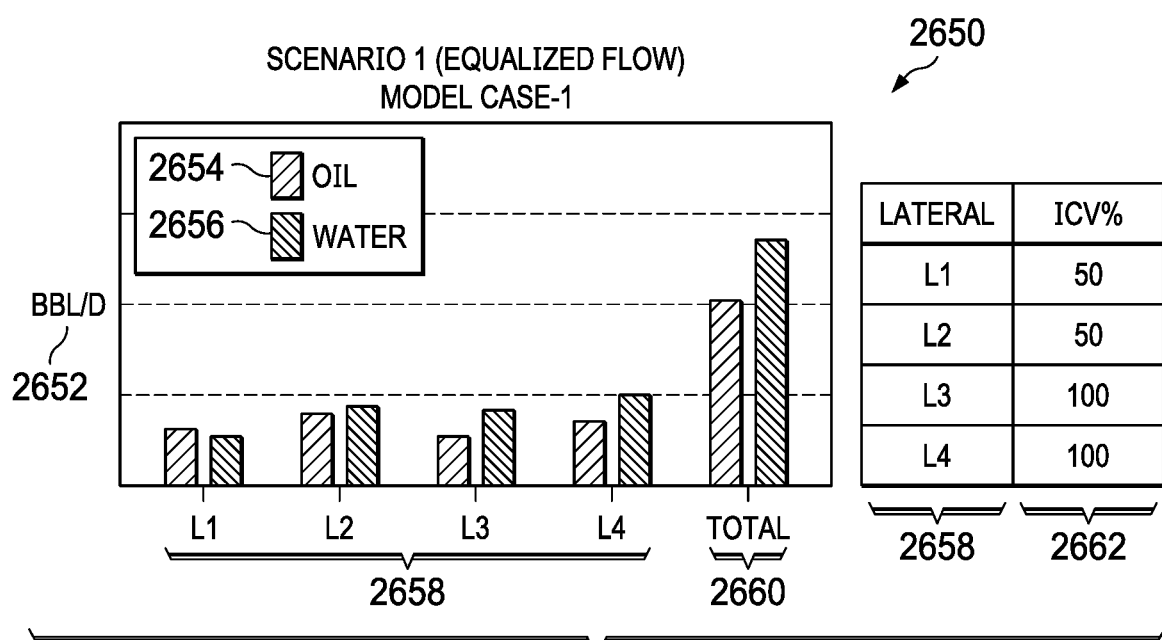

FIGS. 26A and 26B are graphs showing examples of flow rates plots 2600 and 2650 for an equalized flow scenario, according to some implementations of the present disclosure. The flow rates plot 2600 includes barrels per day (bbl/d) 2602 values of oil 2604, water 2606, and total liquid 2608 for the well test 2610 and the model 2612, respectively. For example, the flow rates plot 2600 includes Well A model ICVs showing the match between the model and actual field test results (within ±5%). The flow rates plot 2650 shows the individual lateral performance with laterals L1 and L2 choked back. For example, the flow rates plot 2650 shows barrels per day (bbl/d) production rates 2652 for oil 2654 and water 2656. Production rates are shown for laterals 2658 L1, L2, L3, and L4 and a total production rate 2660 for the multilateral well. ICV settings 2662 show that laterals L1 and L2 are each choked back to 50%.

The purpose of the second scenario is to equalize the flow and balance the production coming from each lateral. After modeling the scenario, the model was tested and the match shows an acceptable agreement with field data (for example, within ±5%).

The prior scenario shows a high water cut from the overall production mostly coming from laterals L3 and L4. A Well B optimization target is to minimize the water production and allow more contribution from laterals L1 and L2. Different scenarios were studied, and an optimum scenario was chosen that meets the well production target. Lateral L4 was choked back and the other laterals were set at fully-open positions. The selected scenario was tested and validated on the field.

Figure 27A:
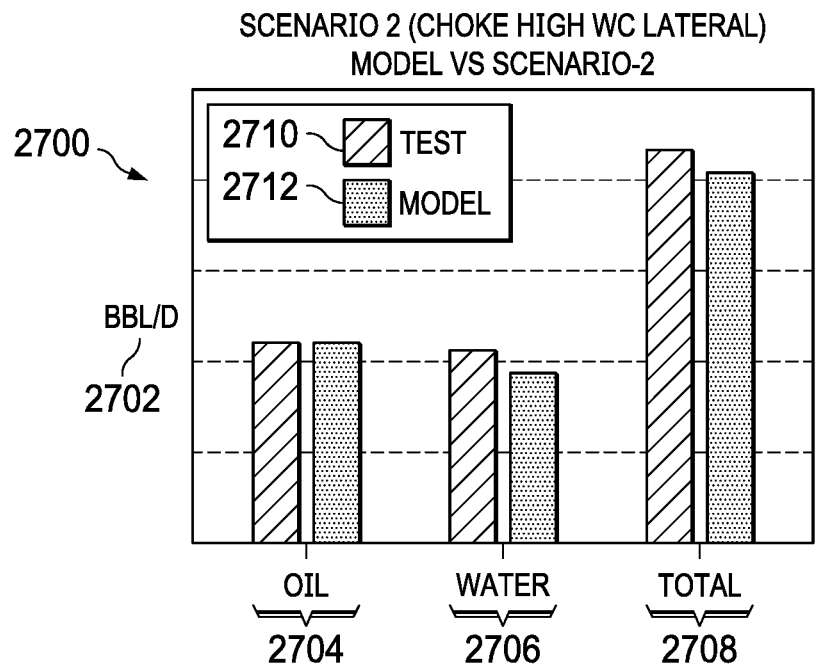
FIGS. 27A and 27B are graphs showing examples of flow rates plots for a restricted water production scenario, according to some implementations of the present disclosure.
Figure 27B:
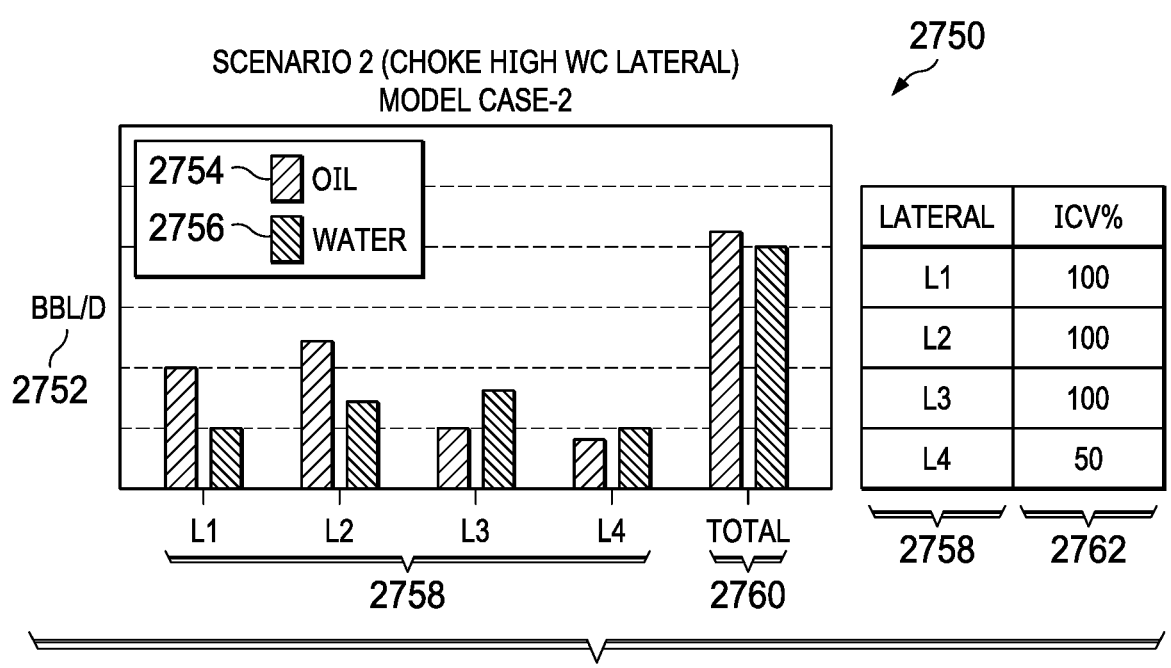

FIGS. 27A and 27B are graphs showing examples of flow rates plots 2700 and 2750 for a restricted water production scenario, according to some implementations of the present disclosure. The flow rates plot 2700 includes barrels per day (bbl/d) 2702 values of oil 2704, water 2706, and total liquid 2708 for the well test 2710 and the model 2712, respectively. For example, the flow rates plot 2700 shows Well B with restricted water production scenario. The flow rates plot 2750 shows the match between the model and actual field test results (for example, within ±5%).

The flow rates plot 2700 shows the individual lateral performance with applied restriction only on lateral L4. The flow rates plot 2750 shows the matched results with the flow rates of each lateral. Post optimization tests demonstrated, for example, a gain of 800 bbl/d in the well oil production, and a 10% reduction in the water cut. The flow rates plot 2750 shows barrels per day (bbl/d) production rates 2752 for oil 2754 and water 2756. Production rates are shown for laterals 2758 L1, L2, L3, and L4 and a total production rate 2760 for the multilateral well. ICV settings 2762 show that lateral L4 is choked back to 50%.

Conclusions

The value of SWC can be fully realized by ongoing production surveillance and control, utilizing the capabilities of a fast steady state model which will provide optimal settings for the downhole valves. In order to efficiently optimize smart wells' ICVs, engineers need to model them and be able to study various production scenarios and predict flow behavior of multilateral wells. Proactive adjustment of the valves positions will improve the well economic value and ensure a uniform production.

Production optimization approaches using real-time modeling can integrate conventional optimization with commercial steady-state downhole network models for multilateral wells equipped with smart completions. The approaches can be used to estimate the flowing parameters of individual laterals, determine the optimum pressure drop across each downhole valve, and estimate productivity of each lateral during the commingled production at various choke valves settings.

The approach was successfully field-tested and validated. Post modeling and trial test results demonstrated that this approach corrected flux imbalance, slightly reduced unwanted production, and ensured cross flow was eliminated. The trend of discrepancy between the simulated and the measured performance indicates that the model is capable of simulating downhole conditions to optimize the inflow valve settings.

Figure 28:
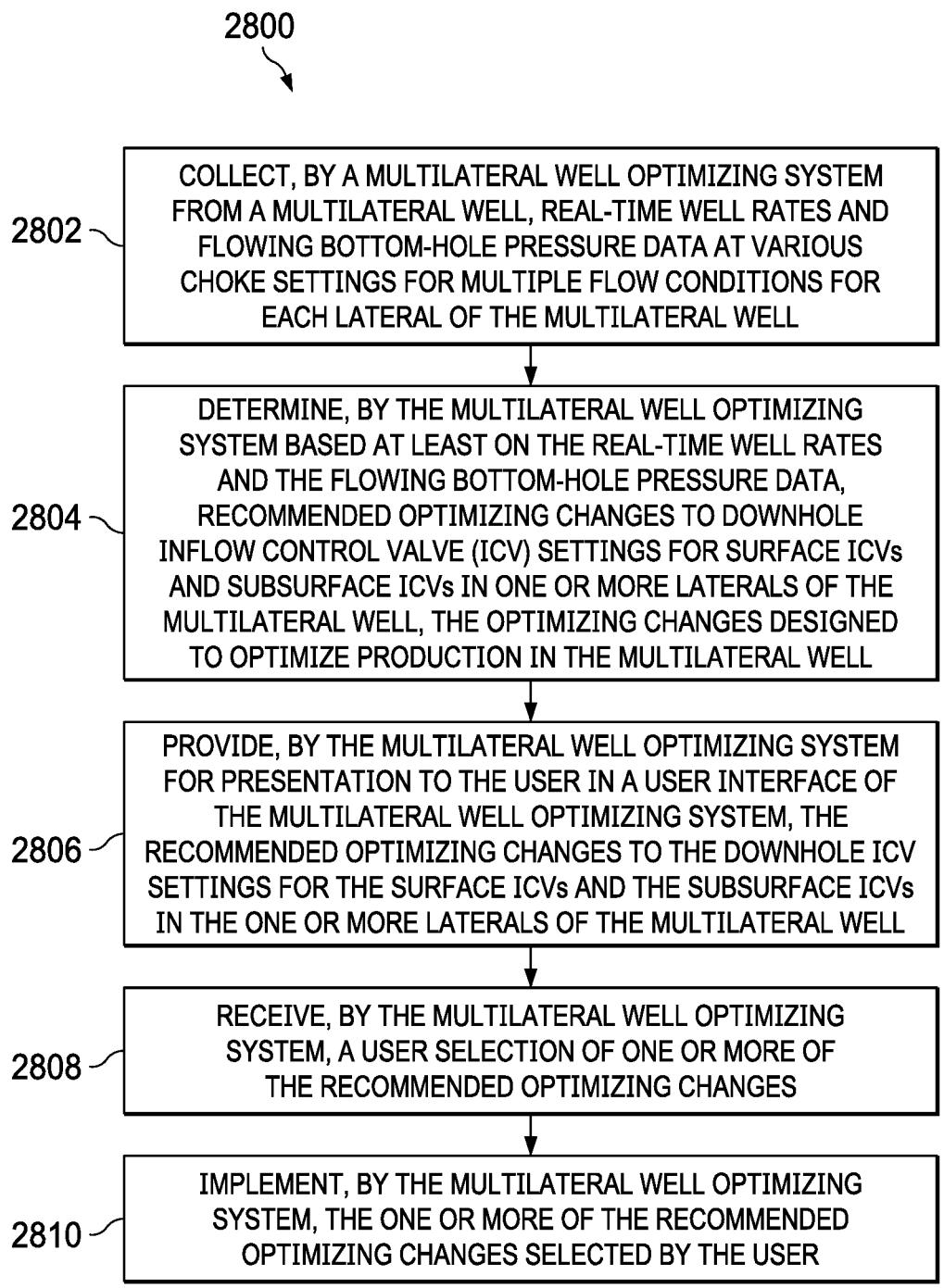
FIG. 28 is a flowchart of an example method for recommending/suggesting changes to downhole valve settings to optimize production in a multilateral well, according to some implementations of the present disclosure.

FIG. 28 is a flowchart of an example method 2800 for recommending/suggesting changes to downhole valve settings to optimize production in a multilateral well, according to some implementations of the present disclosure. For clarity of presentation, the description that follows generally describes method 2800 in the context of the other figures in this description. However, it will be understood that method 2800 can be performed, for example, by any suitable system, environment, software, and hardware, or a combination of systems, environments, software, and hardware, as appropriate. In some implementations, various steps of method 2800 can be run in parallel, in combination, in loops, or in any order.

At 2802, real-time well rates and flowing bottom-hole pressure data at various choke settings for multiple flow conditions for each lateral of a multilateral well are collected from the multilateral well by a multilateral well optimizing system. For example, a computer-implemented system at the surface of the multi-zonal smart well completion 100 can collect information from each of the zones 102, including the zone 102a. The information that is collected can include, for example, pressure information collected from the downhole pressure gauges 108 and information collected from equipment measuring the flow from each zone 102. From 2802, method 2800 proceeds to 2804.

In some implementations, the multiple flow conditions include commingled testing and individual lateral testing. For example, the computer-implemented system can collect the information from the multi-zonal smart well completion 100 during comingled testing (when multiple or all laterals are in enabled) and during testing of each of the lateral (when all other laterals are disabled, such as by setting the respective ICVs at 0%).

At 2804, recommended optimizing changes to downhole inflow control valve (ICV) settings for surface ICVs and subsurface ICVs in one or more laterals of the multilateral well are determined by the multilateral well optimizing system based at least on the real-time well rates and the flowing bottom-hole pressure data. The optimizing changes are designed to optimize production in the multilateral well. For example, the genetic algorithm optimization procedure 300 can be used to determining optimum valve settings as given by the well model.

In some implementations, method 2800 further includes calibrating a multilateral well production model based at least on the real-time well rates and the flowing bottom-hole pressure data. For example, the optimization algorithm process 200 can use model results to generate new ICV settings to be tested by the model, as part of the loop described with reference to FIG. 2.

In some implementations, determining the recommended optimizing changes to the downhole ICV settings for the surface ICVs and the subsurface ICVs in the one or more laterals of the multilateral well includes executing the multilateral well production model using an optimization algorithm to generate different production scenarios optimizing the performance of each lateral to obtain the recommended optimizing changes. For example, the optimization algorithm process 200 and the genetic algorithm optimization procedure 300 can be used in determining the recommended optimizing changes.

In some implementations, the optimization algorithm maximizes multilateral well productivity, restricts unwanted water and gas production in the multilateral well, and improves sweep efficiency for the multilateral well. As an example, the optimization algorithm process 200 can improve the operation of the multi-zonal smart well completion 100. Improving the operation can include improving the overall production of the multilateral well, including minimizing the production of water and gas and improving the sweep efficiency. From 2804, method 2800 proceeds to 2806.

At 2806, the recommended optimizing changes to the downhole ICV settings for the surface ICVs and the subsurface ICVs in the one or more laterals of the multilateral well are provided by the multilateral well optimizing system for presentation to the user in a user interface of the multilateral well optimizing system. As an example, recommended downhole ICV settings for the valves 110 and the ICV 116 can be provided in a user interface included with (or communicating with) the computer-implemented system at the surface of the multi-zonal smart well completion 100. From 2806, method 2800 proceeds to 2808.

At 2808, a user selection of one or more of the recommended optimizing changes is received by the multilateral well optimizing system. For example, using the user interface, the user may select one or more recommended choke settings for one or more specific laterals of the multilateral well. From 2808, method 2800 proceeds to 2810.

At 2810, the one or more of the recommended optimizing changes selected by the user are implemented by the multilateral well optimizing system. For example, the user selections made in the user interface can be applied automatically by the computer-implemented system to corresponding ICVs for which ICV settings are to be made.

In some implementations, implementing the one or more of the recommended optimizing changes selected by the user includes sending, by the multilateral well optimizing system, control commands to the surface ICVs and the subsurface ICVs in the one or more laterals of the multilateral well, where the control commands correspond to the recommended optimizing changes. In some implementations, the control commands include choke setting commands to set different choke settings on different ICVs. For example, the computer-implemented system can send commands to ICVs of particular laterals, such as to choke particular laterals to specific percentages. After 2810, method 2800 can stop.

Figure 29:
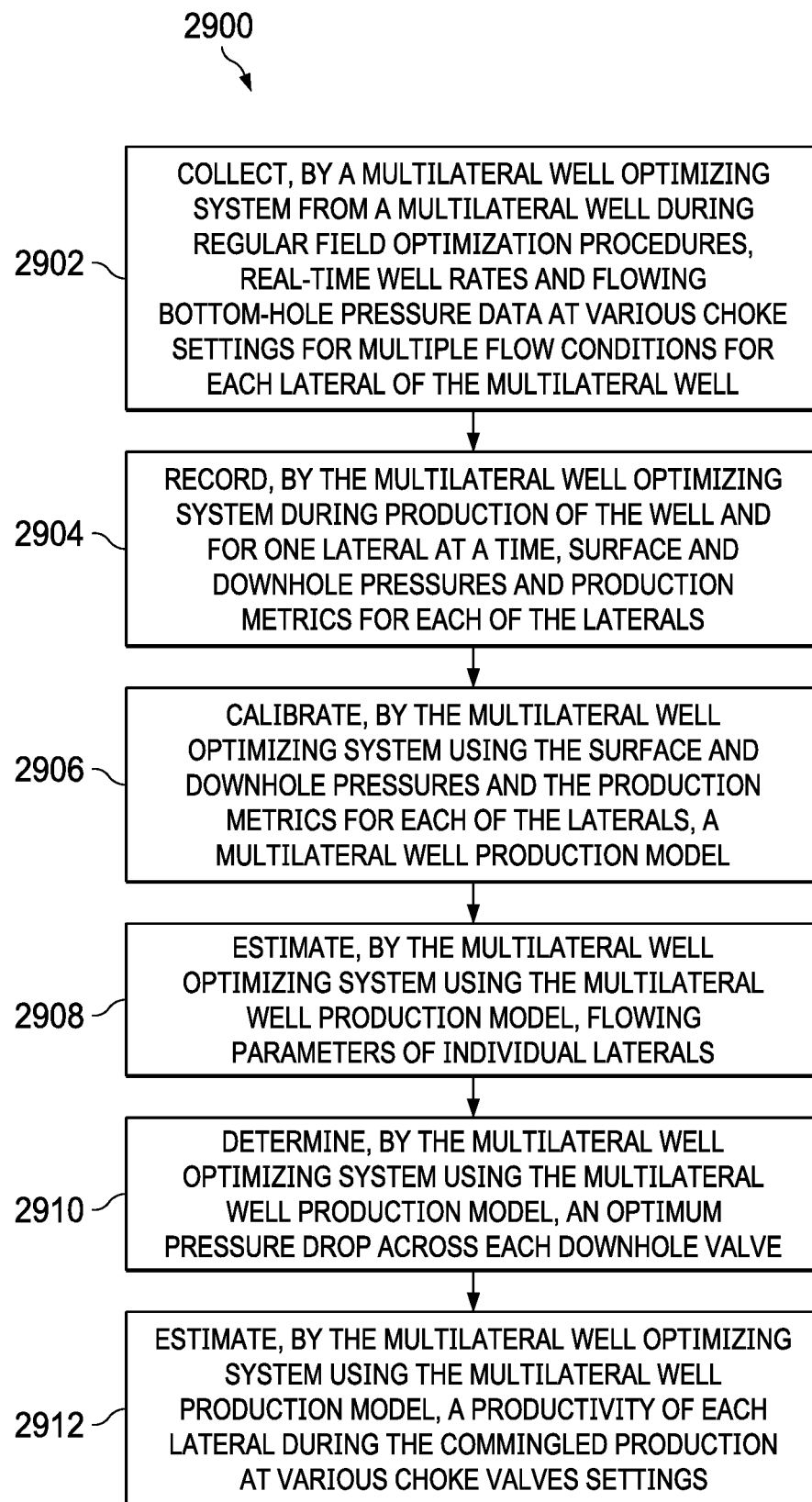
FIG. 29 is a flowchart of an example method for real-time modeling based on a nodal analysis of multilateral wells, according to some implementations of the present disclosure.

FIG. 29 is a flowchart of an example method 2900 for real-time modeling based on a nodal analysis of multilateral wells, according to some implementations of the present disclosure. For clarity of presentation, the description which follows generally describes method 2900 in the context of the other figures in this description. However, it will be understood that method 2900 can be performed, for example, by any suitable system, environment, software, and hardware, or a combination of systems, environments, software, and hardware, as appropriate. In some implementations, various steps of method 2900 can be run in parallel, in combination, in loops, or in any order.

At 2902, real-time well rates and flowing bottom-hole pressure data at various choke settings for multiple flow conditions for each lateral of a multilateral well are collected are by a multilateral well optimizing system from the multilateral well during regular field optimization procedures. For example, a computer-implemented system at the surface of the multi-zonal smart well completion 100 can collect real-time well rates and flowing bottom-hole pressure data at various choke settings for multiple flow conditions for each lateral in the zones 102 of the multi-zonal smart well completion 100. In some implementations, the multiple flow conditions include commingled testing and individual lateral testing. From 2902, method 2900 proceeds to 2904.

At 2904, surface and downhole pressures and production metrics for each of the laterals are recorded for one lateral at a time by the multilateral well optimizing system during production of the well. As an example, during completion of a given lateral (for example, in the zone 102*a*) the computer-implemented system at the surface of the multi-zonal smart well completion 100 can collect information for the lateral. From 2904, method 2900 proceeds to 2906.

At 2906, a multilateral well production model is calibrated by the multilateral well optimizing system using the surface and downhole pressures and the production metrics for each of the laterals. For example, the calibration of the model can occur as described with reference to FIG. 2. In some implementations, the multilateral well production model can be implemented using a commercial steady-state model. From 2906, method 2900 proceeds to 2908.

At 2908, flowing parameters of individual laterals are estimated by the multilateral well optimizing system using the multilateral well production model. As an example, the flow rate of each lateral can be determined in real time. From 2908, method 2900 proceeds to 2910.

At 2910, an optimum pressure drop across each downhole valve is determined by the multilateral well optimizing system using the multilateral well production model. For example, for each lateral, the flow and pressure drop through the reservoir can be determined in the horizontal section as well as the annular flow between the casing and the tubing. The model can be used to determine the optimum pressure drop across each ICV. From 2910, method 2900 proceeds to 2912.

At 2912, a productivity of each lateral during the commingled production at various choke valves settings is estimated by the multilateral well optimizing system using the multilateral well production model. As an example, the productivity of each lateral can be determined in real time. After 2912, method 2900 can stop.

In some implementations, method 2900 further includes calibrating, using the real-time well rates and the flowing bottom-hole pressure data, a multilateral well production model. For example, recommended optimizing changes to downhole inflow control valve (ICV) settings for surface ICVs and subsurface ICVs in one or more laterals of the multilateral well can be determined by the multilateral well optimizing system based at least on the real-time well rates and the flowing bottom-hole pressure data. The optimizing changes designed to optimize production in the multilateral well. The recommended optimizing changes can be provided to (or used for) the downhole ICV settings for the surface ICVs and the subsurface ICVs in the one or more laterals of the multilateral well. In some implementations, the recommended optimizing changes can be provided by the multilateral well optimizing system for presentation to the user in a user interface of the multilateral well optimizing system. The user can accept the recommendation for automatic application to the multi-lateral well.

In some implementations, method 2900 further includes determining, in real time for each of the laterals, a productivity index (PI); determining, using the PIs for the laterals, a commingled PI; and applying the commingled PI to the model. For example, the commingled PI can be based on the productivity of each lateral and the overall productivity of the multilateral well.

Figure 30:
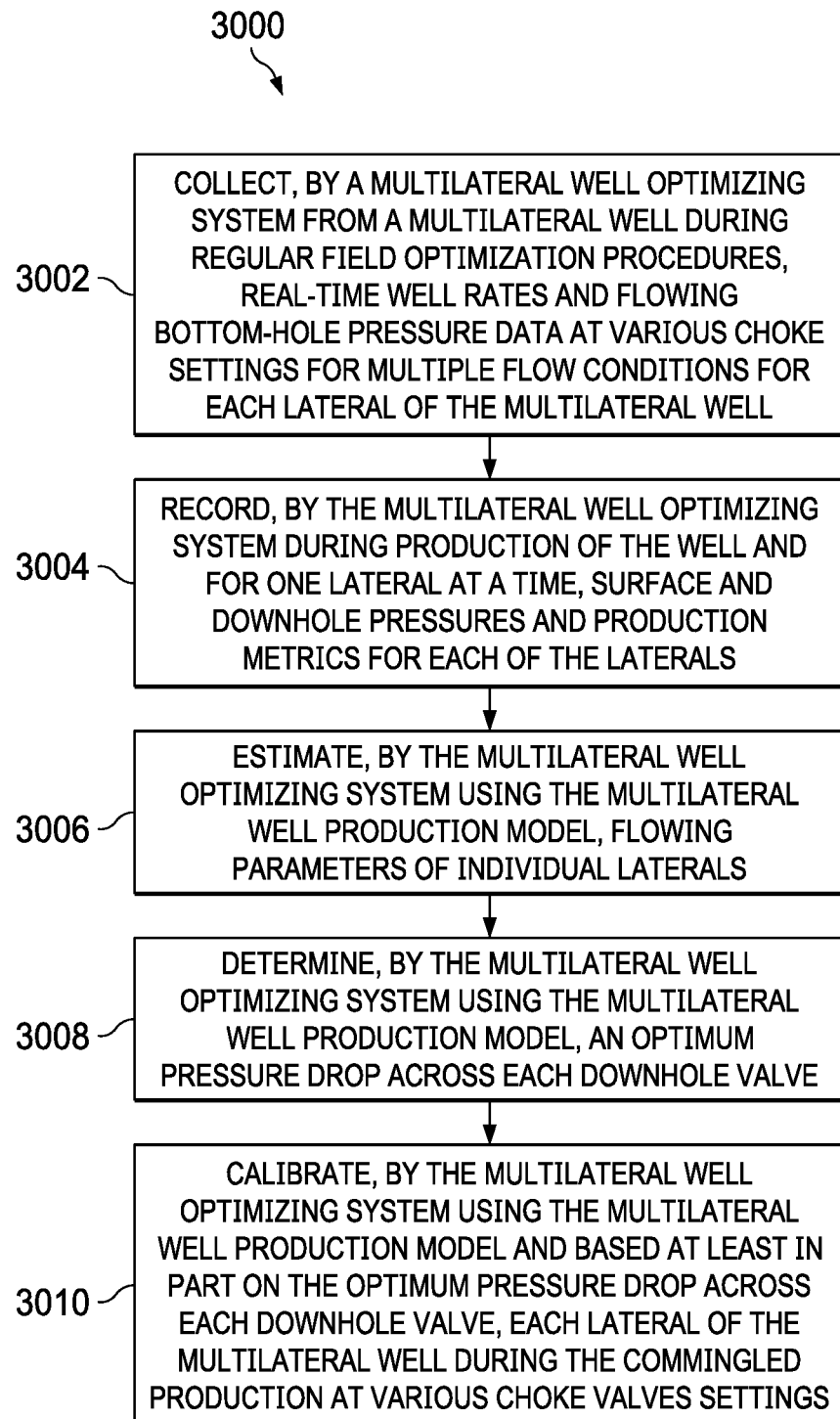
FIG. 30 is a flowchart of an example method for a comingled production calibration process, according to some implementations of the present disclosure.

FIG. 30 is a flowchart of an example method 3000 for a comingled production calibration process, according to some implementations of the present disclosure. For clarity of presentation, the description which follows generally describes method 3000 in the context of the other figures in this description. However, it will be understood that method 3000 can be performed, for example, by any suitable system, environment, software, and hardware, or a combination of systems, environments, software, and hardware, as appropriate. In some implementations, various steps of method 3000 can be run in parallel, in combination, in loops, or in any order.

At 3002, real-time well rates and flowing bottom-hole pressure data at various choke settings are collected for multiple flow conditions for each lateral of a multilateral well. The information is collected by a multilateral well optimizing system from the multilateral well during regular field optimization procedures. For example, a computer-implemented system at the surface of the multi-zonal smart well completion 100 can collect information from each of the zones 102, including the zone 102*a*. The information that is collected can include, for example, pressure information collected from the downhole pressure gauges 108 and information collected from equipment measuring the flow from each zone 102. From 3002, method 3000 proceeds to 3004.

At 3004, surface and downhole pressures and production metrics for each of the laterals are recorded for one lateral at a time by the multilateral well optimizing system during production of the well. As an example, during completion of a given lateral (for example, in the zone 102*a*) the computer-implemented system at the surface of the multi-zonal smart well completion 100 can collect information for the lateral. From 3004, method 3000 proceeds to 3006.

At 3006, flowing parameters of individual laterals are estimated by the multilateral well optimizing system using the multilateral well production model. As an example, the flow rate of each lateral can be determined in real time. From 3006, method 3000 proceeds to 3008.

At 3008, an optimum pressure drop across each downhole valve is determined by the multilateral well optimizing system using the multilateral well production model. For example, for each lateral, the flow and pressure drop through the reservoir can be determined in the horizontal section, as well as the annular flow between the casing and the tubing. The model can be used to determine the optimum pressure drop across each ICV. From 3008, method 3000 proceeds to 3010.

At 3010, each lateral of the multilateral well is calibrated during the commingled production at various choke valves settings. The calibrating is done by the multilateral well optimizing system using the multilateral well production model. The calibrating is based at least in part on the optimum pressure drop across each downhole valve. For example, the computer-implemented system at the surface of the multi-zonal smart well completion 100 can calibrate each of the IVCs for each of the zones 102. After 3010, method 3000 can stop.

In some implementations, method 3000 further includes calibrating, by the multilateral well optimizing system using the surface and downhole pressures and the production metrics for each of the laterals, a multilateral well production mode.

In some implementations, method 3000 further includes estimating, by the multilateral well optimizing system using the multilateral well production model, a productivity of each lateral during the commingled production at various choke valves settings.

Figure 31:
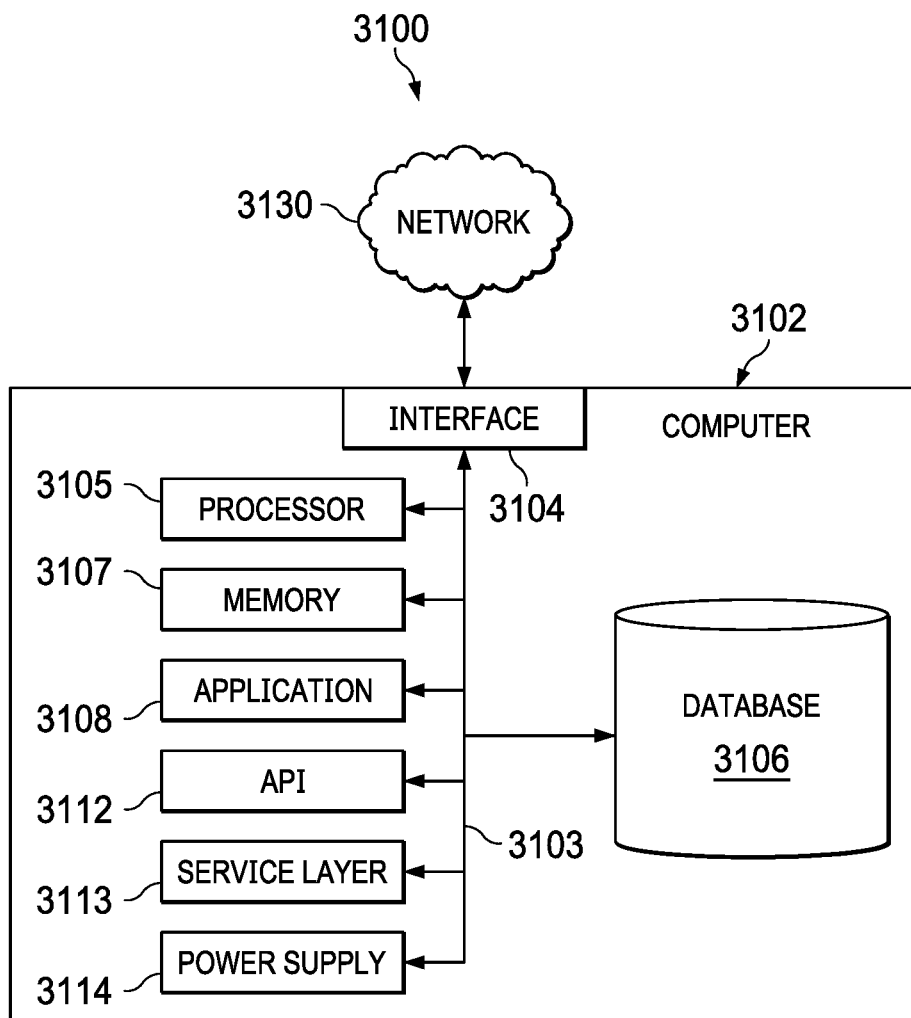
FIG. 31 is a block diagram of an example of a computer system used to provide computational functionalities associated with described algorithms, methods, functions, processes, flows, and procedures described in the present disclosure, according to some implementations of the present disclosure.

FIG. 31 is a block diagram of an example of a computer system 3100 used to provide computational functionalities associated with described algorithms, methods, functions, processes, flows, and procedures described in the present disclosure, according to some implementations of the present disclosure. The illustrated computer 3102 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 3102 can include input devices such as keypads, keyboards, and touch screens which can accept user information. Also, the computer 3102 can include output devices which can convey information associated with the operation of the computer 3102. The information can include digital data, visual data, audio information, or a combination of information. The information can be presented in a graphical user interface (UI) (or GUI).

The computer 3102 can serve in a role as a client, a network component, a server, a database, a persistency, or components of a computer system for performing the subject matter described in the present disclosure. The illustrated computer 3102 is communicably coupled with a network 3130. In some implementations, one or more components of the computer 3102 can be configured to operate within different environments, including cloud-computing-based environments, local environments, global environments, and combinations of environments.

At a high level, the computer 3102 is an electronic computing device operable to receive, transmit, process, store, and manage data and information associated with the described subject matter. According to some implementations, the computer 3102 can also include, or be communicably coupled with, an application server, an email server, a web server, a caching server, a streaming data server, or a combination of servers.

The computer 3102 can receive requests over network 3130 from a client application (for example, executing on another computer 3102). The computer 3102 can respond to the received requests by processing the received requests using software applications. Requests can also be sent to the computer 3102 from internal users (for example, from a command console), external (or third) parties, automated applications, entities, individuals, systems, and computers.

Each of the components of the computer 3102 can communicate using a system bus 3103. In some implementations, any or all of the components of the computer 3102, including hardware or software components, can interface with each other or the interface 3104 (or a combination of both), over the system bus 3103. Interfaces can use an application programming interface (API) 3112, a service layer 3113, or a combination of the API 3112 and service layer 3113. The API 3112 can include specifications for routines, data structures, and object classes. The API 3112 can be either computer-language independent or dependent. The API 3112 can refer to a complete interface, a single function, or a set of APIs.

The service layer 3113 can provide software services to the computer 3102 and other components (whether illustrated or not) communicably coupled to the computer 3102. The functionality of the computer 3102 can be accessible for all service consumers using this service layer. Software services, such as those provided by the service layer 3113, can provide reusable, defined functionalities through a defined interface. For example, the interface can be software written in JAVA, C++, or a language providing data in extensible markup language (XML) format. While illustrated as an integrated component of the computer 3102, in alternative implementations, the API 3112 or the service layer 3113 can be stand-alone components in relation to other components of the computer 3102 and other components communicably coupled to the computer 3102. Moreover, any or all parts of the API 3112 or the service layer 3113 can be implemented as child or sub-modules of another software module, enterprise application, or hardware module without departing from the scope of the present disclosure.

The computer 3102 includes an interface 3104. Although illustrated as a single interface 3104 in FIG. 31, two or more interfaces 3104 can be used according to particular needs, desires, or particular implementations of the computer 3102 and the described functionality. The interface 3104 can be used by the computer 3102 for communicating with other systems connected to the network 3130 (whether illustrated or not) in a distributed environment. Generally, the interface 3104 can include, or be implemented using, logic encoded in software or hardware (or a combination of software and hardware) operable to communicate with the network 3130. More specifically, the interface 3104 can include software supporting one or more communication protocols associated with communications. As such, the network 3130 or the interface's hardware can be operable to communicate physical signals within and outside of the illustrated computer 3102.

The computer 3102 includes a processor 3105. Although illustrated as a single processor 3105 in FIG. 31, two or more processors 3105 can be used according to particular needs, desires, or particular implementations of the computer 3102 and the described functionality. Generally, the processor 3105 can execute instructions and can manipulate data to perform the operations of the computer 3102, including operations using algorithms, methods, functions, processes, flows, and procedures as described in the present disclosure.

The computer 3102 also includes a database 3106 which can hold data for the computer 3102 and other components connected to the network 3130 (whether illustrated or not). For example, database 3106 can be an in-memory, conventional, or a database storing data consistent with the present disclosure. In some implementations, database 3106 can be a combination of two or more different database types (for example, hybrid in-memory and conventional databases) according to particular needs, desires, or particular implementations of the computer 3102 and the described functionality. Although illustrated as a single database 3106 in FIG. 31, two or more databases (of the same, different, or combination of types) can be used according to particular needs, desires, or particular implementations of the computer 3102 and the described functionality. While database 3106 is illustrated as an internal component of the computer 3102, in alternative implementations, database 3106 can be external to the computer 3102.

The computer 3102 also includes a memory 3107 which can hold data for the computer 3102 or a combination of components connected to the network 3130 (whether illustrated or not). Memory 3107 can store any data consistent with the present disclosure. In some implementations, memory 3107 can be a combination of two or more different types of memory (for example, a combination of semiconductor and magnetic storage) according to particular needs, desires, or particular implementations of the computer 3102 and the described functionality. Although illustrated as a single memory 3107 in FIG. 31, two or more memories 3107 (of the same, different, or combination of types) can be used according to particular needs, desires, or particular implementations of the computer 3102 and the described functionality. While memory 3107 is illustrated as an internal component of the computer 3102, in alternative implementations, memory 3107 can be external to the computer 3102.

The application 3108 can be an algorithmic software engine providing functionality according to particular needs, desires, or particular implementations of the computer 3102 and the described functionality. For example, application 3108 can serve as one or more components, modules, or applications. Further, although illustrated as a single application 3108, the application 3108 can be implemented as multiple applications 3108 on the computer 3102. In addition, although illustrated as internal to the computer 3102, in alternative implementations, the application 3108 can be external to the computer 3102.

The computer 3102 can also include a power supply 3114. The power supply 3114 can include a rechargeable or non-rechargeable battery which can be configured to be either user- or non-user-replaceable. In some implementations, the power supply 3114 can include power-conversion and management circuits, including recharging, standby, and power management functionalities. In some implementations, the power-supply 3114 can include a power plug to allow the computer 3102 to be plugged into a wall socket or a power source to, for example, power the computer 3102 or recharge a rechargeable battery.

There can be any number of computers 3102 associated with, or external to, a computer system containing computer 3102, with each computer 3102 communicating over network 3130. Further, the terms "client," "user," and other appropriate terminology can be used interchangeably, as appropriate, without departing from the scope of the present disclosure. Moreover, the present disclosure contemplates that many users can use one computer 3102 and one user can use multiple computers 3102.

Described implementations of the subject matter can include one or more features, alone or in combination.

For example, in a first implementation, methods include a computer-implemented method for optimizing smart well completions using real-time nodal analysis including recommending changes to downhole settings. Real-time well rates and flowing bottom-hole pressure data at various choke settings for multiple flow conditions for each lateral of a multilateral well are collected from the multilateral well by a multilateral well optimizing system. Recommended optimizing changes to downhole inflow control valve (ICV) settings for surface ICVs and subsurface ICVs in one or more laterals of the multilateral well are determined by the multilateral well optimizing system based at least on the real-time well rates and the flowing bottom-hole pressure data. The optimizing changes are designed to optimize production in the multilateral well. The recommended optimizing changes to the downhole ICV settings for the surface ICVs and the subsurface ICVs in the one or more laterals of the multilateral well are provided by the multilateral well optimizing system for presentation to the user in a user interface of the multilateral well optimizing system. A user selection of one or more of the recommended optimizing changes is received by the multilateral well optimizing system. The one or more of the recommended optimizing changes selected by the user are implemented by the multilateral well optimizing system.

The foregoing and other described implementations can each, optionally, include one or more of the following features:

A first feature, combinable with any of the following features, where the multiple flow conditions include commingled testing and individual lateral testing.

A second feature, combinable with any of the previous or following features, the method further including calibrating a multilateral well production model based at least on the real-time well rates and the flowing bottom-hole pressure data.

A third feature, combinable with any of the previous or following features, where determining the recommended optimizing changes to the downhole ICV settings for the surface ICVs and the subsurface ICVs in the one or more laterals of the multilateral well includes executing the multilateral well production model using an optimization algorithm to generate different production scenarios optimizing the performance of each lateral to obtain the recommended optimizing changes.

A fourth feature, combinable with any of the previous or following features, where the optimization algorithm maximizes multilateral well productivity, restricts unwanted water and gas production in the multilateral well, and improves sweep efficiency for the multilateral well.

A fifth feature, combinable with any of the previous or following features, where implementing the one or more of the recommended optimizing changes selected by the user includes sending, by the multilateral well optimizing system, control commands to the surface ICVs and the subsurface ICVs in the one or more laterals of the multilateral well, where the control commands correspond to the recommended optimizing changes.

A sixth feature, combinable with any of the previous or following features, where the control commands include choke setting commands to set different choke settings on different ICVs.

In a second implementation, a non-transitory, computer-readable medium stores one or more instructions executable by a computer system to perform operations for optimizing smart well completions using real-time nodal analysis, including recommending changes to downhole settings, including the following. Real-time well rates and flowing bottom-hole pressure data at various choke settings for multiple flow conditions for each lateral of a multilateral well are collected from the multilateral well by a multilateral well optimizing system. Recommended optimizing changes to downhole inflow control valve (ICV) settings for surface ICVs and subsurface ICVs in one or more laterals of the multilateral well are determined by the multilateral well optimizing system based at least on the real-time well rates and the flowing bottom-hole pressure data. The optimizing changes are designed to optimize production in the multilateral well. The recommended optimizing changes to the downhole ICV settings for the surface ICVs and the subsurface ICVs in the one or more laterals of the multilateral well are provided by the multilateral well optimizing system for presentation to the user in a user interface of the multilateral well optimizing system. A user selection of one or more of the recommended optimizing changes is received by the multilateral well optimizing system. The one or more of the recommended optimizing changes selected by the user are implemented by the multilateral well optimizing system.

The foregoing and other described implementations can each, optionally, include one or more of the following features:

A first feature, combinable with any of the following features, where the multiple flow conditions include commingled testing and individual lateral testing.

A second feature, combinable with any of the previous or following features, the operations further including calibrating a multilateral well production model based at least on the real-time well rates and the flowing bottom-hole pressure data.

A third feature, combinable with any of the previous or following features, where determining the recommended optimizing changes to the downhole ICV settings for the surface ICVs and the subsurface ICVs in the one or more laterals of the multilateral well includes executing the multilateral well production model using an optimization algorithm to generate different production scenarios optimizing the performance of each lateral to obtain the recommended optimizing changes.

A fourth feature, combinable with any of the previous or following features, where the optimization algorithm maximizes multilateral well productivity, restricts unwanted water and gas production in the multilateral well, and improves sweep efficiency for the multilateral well.

A fifth feature, combinable with any of the previous or following features, where implementing the one or more of the recommended optimizing changes selected by the user includes sending, by the multilateral well optimizing system, control commands to the surface ICVs and the subsurface ICVs in the one or more laterals of the multilateral well, where the control commands correspond to the recommended optimizing changes.

A sixth feature, combinable with any of the previous or following features, where the control commands include choke setting commands to set different choke settings on different ICVs.

In a third implementation, a computer-implemented system includes one or more processors and a non-transitory computer-readable storage medium coupled to the one or more processors and storing programming instructions for execution by the one or more processors, the programming instructions instructing the one or more processors to perform operations for optimizing smart well completions using real-time nodal analysis, including recommending changes to downhole settings, including the following. Real-time well rates and flowing bottom-hole pressure data at various choke settings for multiple flow conditions for each lateral of a multilateral well are collected from the multilateral well by a multilateral well optimizing system. Recommended optimizing changes to downhole inflow control valve (ICV) settings for surface ICVs and subsurface ICVs in one or more laterals of the multilateral well are determined by the multilateral well optimizing system based at least on the real-time well rates and the flowing bottom-hole pressure data. The optimizing changes are designed to optimize production in the multilateral well. The recommended optimizing changes to the downhole ICV settings for the surface ICVs and the subsurface ICVs in the one or more laterals of the multilateral well are provided by the multilateral well optimizing system for presentation to the user in a user interface of the multilateral well optimizing system. A user selection of one or more of the recommended optimizing changes is received by the multilateral well optimizing system. The one or more of the recommended optimizing changes selected by the user are implemented by the multilateral well optimizing system.

The foregoing and other described implementations can each, optionally, include one or more of the following features:

A first feature, combinable with any of the following features, where the multiple flow conditions include commingled testing and individual lateral testing.

A second feature, combinable with any of the previous or following features, the operations further including calibrating a multilateral well production model based at least on the real-time well rates and the flowing bottom-hole pressure data.

A third feature, combinable with any of the previous or following features, where determining the recommended optimizing changes to the downhole ICV settings for the surface ICVs and the subsurface ICVs in the one or more laterals of the multilateral well includes executing the multilateral well production model using an optimization algorithm to generate different production scenarios optimizing the performance of each lateral to obtain the recommended optimizing changes.

A fourth feature, combinable with any of the previous or following features, where the optimization algorithm maximizes multilateral well productivity, restricts unwanted water and gas production in the multilateral well, and improves sweep efficiency for the multilateral well.

A fifth feature, combinable with any of the previous or following features, where implementing the one or more of the recommended optimizing changes selected by the user includes sending, by the multilateral well optimizing system, control commands to the surface ICVs and the subsurface ICVs in the one or more laterals of the multilateral well, where the control commands correspond to the recommended optimizing changes.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. The example, the signal can be a machine-generated electrical, optical, or electromagnetic signal generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatus, devices, and machines for processing data, including by way of example, a programmable processor, a computer, or multiple processors or computers. The apparatus can also include special purpose logic circuitry including, for example, a central processing unit (CPU), a field programmable gate array (FPGA), or an application-specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code creating an execution environment for computer programs, for example, code constituting processor firmware, a protocol stack, a database management system, an operating system, or a combination of execution environments. The present disclosure contemplates the use of data processing apparatuses with or without conventional operating systems, for example, LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file holding other programs or data, for example, one or more scripts stored in a markup language document, in a single file dedicated to the program in question, or in multiple coordinated files storing one or more modules, sub-programs, or portions of code. A computer program can be deployed for execution on one computer or on multiple computers located, for example, at one site or distributed across multiple sites interconnected by a communication network. While portions of the programs illustrated in the various figures may be shown as individual modules implementing the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto-optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer-readable media (transitory or non-transitory, as appropriate) suitable for storing computer program instructions and data can include all forms of permanent/non-permanent and volatile/non-volatile memory, media, and memory devices. Computer-readable media can include, for example, semiconductor memory devices such as random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer-readable media can also include, for example, magnetic devices such as tape, cartridges, cassettes, and internal/removable disks. Computer-readable media can also include magneto-optical disks and optical memory devices and technologies including, for example, digital video disc (DVD), CD-ROM, DVD+/-R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated in, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device used by the user. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch screen, or a command line interface (CLI) processing information and efficiently presenting the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system including a back-end component, for example, as a data server, or including a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features which may be specific to particular implementations. Certain features which are described in this specification in the context of separate implementations can also be implemented, in combination, in a single implementation. Conversely, various features which are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order or that all illustrated operations be performed (some operations may be considered optional) to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

What is claimed is:

1. A computer-implemented method, comprising:
collecting, by a multilateral well optimizing system from a multilateral well, real-time well rates and flowing bottom-hole pressure data at various choke settings for multiple flow conditions for each lateral of the multilateral well;
determining, by the multilateral well optimizing system using a multilateral well production model, an optimum pressure drop across each downhole valve of the multilateral well, wherein determining the optimum pressure drop across each downhole valve comprises iteratively:
initializing control parameters for the multilateral well;
identifying limits for the control parameters;
creating initial solutions for the optimum pressure drop across each downhole valve;
evaluating, using the multilateral well production model, performance of the initial solutions;
ranking the initial solutions according to the value of an objective function;
performing a convergence check on the initial solutions; and
creating a new instance of a solution using properties of top-performing initial solutions;
determining, by the multilateral well optimizing system based at least on the optimum pressure drop, the real-time well rates, and the flowing bottom-hole pressure data, recommended optimizing changes to downhole inflow control valve (ICV) settings for surface ICVs and subsurface ICVs in one or more laterals of the multilateral well, the optimizing changes designed to optimize production in the multilateral well;
providing, by the multilateral well optimizing system for presentation to the user in a user interface of the multilateral well optimizing system, the recommended optimizing changes to the downhole ICV settings for the surface ICVs and the subsurface ICVs in the one or more laterals of the multilateral well;
receiving, by the multilateral well optimizing system, a user selection of one or more of the recommended optimizing changes; and
implementing, by the multilateral well optimizing system, the one or more of the recommended optimizing changes selected by the user.

2. The computer-implemented method of claim 1, wherein the multiple flow conditions include commingled testing and individual lateral testing.

3. The computer-implemented method of claim 1, further comprising calibrating a multilateral well production model based at least on the real-time well rates and the flowing bottom-hole pressure data.

4. The computer-implemented method of claim 3, wherein determining the recommended optimizing changes to the downhole ICV settings for the surface ICVs and the subsurface ICVs in the one or more laterals of the multilateral well includes executing the multilateral well production model using an optimization algorithm to generate different production scenarios optimizing the performance of each lateral to obtain the recommended optimizing changes.

5. The computer-implemented method of claim 4, wherein the optimization algorithm maximizes multilateral well productivity, restricts unwanted water and gas production in the multilateral well, and improves sweep efficiency for the multilateral well.

6. The computer-implemented method of claim 1, wherein implementing the one or more of the recommended optimizing changes selected by the user includes sending, by the multilateral well optimizing system, control commands to the surface ICVs and the subsurface ICVs in the one or more laterals of the multilateral well, wherein the control commands correspond to the recommended optimizing changes.

7. The computer-implemented method of claim 6, wherein the control commands include choke setting commands to set different choke settings on different ICVs.

8. A non-transitory, computer-readable medium storing one or more instructions executable by a computer system to perform operations comprising:
collecting, by a multilateral well optimizing system from a multilateral well, real-time well rates and flowing bottom-hole pressure data at various choke settings for multiple flow conditions for each lateral of the multilateral well;
determining, by the multilateral well optimizing system using a multilateral well production model, an optimum pressure drop across each downhole valve of the multilateral well, wherein determining the optimum pressure drop across each downhole valve comprises iteratively:
initializing control parameters for the multilateral well;
identifying limits for the control parameters;
creating initial solutions for the optimum pressure drop across each downhole valve;
evaluating, using the multilateral well production model, performance of the initial solutions;
ranking the initial solutions according to the value of an objective function;
performing a convergence check on the initial solutions; and
creating a new instance of a solution using properties of top-performing initial solutions;
determining, by the multilateral well optimizing system based at least on the optimum pressure drop, the real-time well rates, and the flowing bottom-hole pressure data, recommended optimizing changes to downhole inflow control valve (ICV) settings for surface ICVs and subsurface ICVs in one or more laterals of the multilateral well, the optimizing changes designed to optimize production in the multilateral well;
providing, by the multilateral well optimizing system for presentation to the user in a user interface of the multilateral well optimizing system, the recommended optimizing changes to the downhole ICV settings for the surface ICVs and the subsurface ICVs in the one or more laterals of the multilateral well;
receiving, by the multilateral well optimizing system, a user selection of one or more of the recommended optimizing changes; and
implementing, by the multilateral well optimizing system, the one or more of the recommended optimizing changes selected by the user.

9. The non-transitory, computer-readable medium of claim 8, wherein the multiple flow conditions include commingled testing and individual lateral testing.

10. The non-transitory, computer-readable medium of claim 8, the operations further comprising calibrating a multilateral well production model based at least on the real-time well rates and the flowing bottom-hole pressure data.

11. The non-transitory, computer-readable medium of claim 10, wherein determining the recommended optimizing changes to the downhole ICV settings for the surface ICVs and the subsurface ICVs in the one or more laterals of the multilateral well includes executing the multilateral well production model using an optimization algorithm to generate different production scenarios optimizing the performance of each lateral to obtain the recommended optimizing changes.

12. The non-transitory, computer-readable medium of claim 11, wherein the optimization algorithm maximizes multilateral well productivity, restricts unwanted water and gas production in the multilateral well, and improves sweep efficiency for the multilateral well.

13. The non-transitory, computer-readable medium of claim 8, wherein implementing the one or more of the recommended optimizing changes selected by the user includes sending, by the multilateral well optimizing system, control commands to the surface ICVs and the subsurface ICVs in the one or more laterals of the multilateral well, wherein the control commands correspond to the recommended optimizing changes.

14. The non-transitory, computer-readable medium of claim 13, wherein the control commands include choke setting commands to set different choke settings on different ICVs.

15. A computer-implemented system, comprising:
one or more processors; and
a non-transitory computer-readable storage medium coupled to the one or more processors and storing programming instructions for execution by the one or more processors, the programming instructions instructing the one or more processors to perform operations comprising:
collecting, by a multilateral well optimizing system from a multilateral well, real-time well rates and flowing bottom-hole pressure data at various choke settings for multiple flow conditions for each lateral of the multilateral well;
determining, by the multilateral well optimizing system using a multilateral well production model, an optimum pressure drop across each downhole valve of the multilateral well, wherein determining the optimum pressure drop across each downhole valve comprises iteratively:
initializing control parameters for the multilateral well;
identifying limits for the control parameters;
creating initial solutions for the optimum pressure drop across each downhole valve;
evaluating, using the multilateral well production model, performance of the initial solutions;
ranking the initial solutions according to the value of an objective function;
performing a convergence check on the initial solutions; and
creating a new instance of a solution using properties of top-performing initial solutions;
determining, by the multilateral well optimizing system based at least on the optimum pressure drop, the real-time well rates, and the flowing bottom-hole pressure data, recommended optimizing changes to downhole inflow control valve (ICV) settings for surface ICVs and subsurface ICVs in one or more laterals of the multilateral well, the optimizing changes designed to optimize production in the multilateral well;
providing, by the multilateral well optimizing system for presentation to the user in a user interface of the multilateral well optimizing system, the recommended optimizing changes to the downhole ICV settings for the surface ICVs and the subsurface ICVs in the one or more laterals of the multilateral well;
receiving, by the multilateral well optimizing system, a user selection of one or more of the recommended optimizing changes; and
implementing, by the multilateral well optimizing system, the one or more of the recommended optimizing changes selected by the user.

16. The computer-implemented system of claim 15, wherein the multiple flow conditions include commingled testing and individual lateral testing.

17. The computer-implemented system of claim 15, the operations further comprising calibrating a multilateral well production model based at least on the real-time well rates and the flowing bottom-hole pressure data.

18. The computer-implemented system of claim 17, wherein determining the recommended optimizing changes to the downhole ICV settings for the surface ICVs and the subsurface ICVs in the one or more laterals of the multilateral well includes executing the multilateral well production model using an optimization algorithm to generate different production scenarios optimizing the performance of each lateral to obtain the recommended optimizing changes.

19. The computer-implemented system of claim 18, wherein the optimization algorithm maximizes multilateral well productivity, restricts unwanted water and gas production in the multilateral well, and improves sweep efficiency for the multilateral well.

20. The computer-implemented system of claim 15, wherein implementing the one or more of the recommended optimizing changes selected by the user includes sending, by the multilateral well optimizing system, control commands to the surface ICVs and the subsurface ICVs in the one or more laterals of the multilateral well, wherein the control commands correspond to the recommended optimizing changes.

* * * * *